US012812837B2

(12) United States Patent
Jung et al.

(10) Patent No.: US 12,812,837 B2
(45) Date of Patent: Nov. 24, 2026

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Seungjae Jung, Suwon-si (KR); Kwang-Ho Park, Cheonan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 315 days.

(21) Appl. No.: 18/674,204

(22) Filed: May 24, 2024

(65) Prior Publication Data

US 2024/0315002 A1 Sep. 19, 2024

Related U.S. Application Data

(63) Continuation of application No. 17/382,844, filed on Jul. 22, 2021, now Pat. No. 12,010,828.

(30) Foreign Application Priority Data

Nov. 16, 2020 (KR) ........................ 10-2020-0152659

(51) Int. Cl.
*H10B 12/00* (2023.01)

(52) U.S. Cl.
CPC ............ *H10B 12/05* (2023.02); *H10B 12/03* (2023.02); *H10B 12/30* (2023.02)

(58) Field of Classification Search
CPC ........ H10B 12/02; H10B 12/03; H10B 12/05; H10B 12/30; H10B 12/482; H10B 12/488
See application file for complete search history.

(56) References Cited

U.S. PATENT DOCUMENTS

| | | | |
|---|---|---|---|
| 7,553,771 | B2 | 6/2009 | Kim et al. |
| 7,679,133 | B2 | 3/2010 | Son et al. |

(Continued)

FOREIGN PATENT DOCUMENTS

| | | | |
|---|---|---|---|
| CN | 107993996 | A | 5/2018 |
| CN | 109979941 | A | 7/2019 |

(Continued)

OTHER PUBLICATIONS

Remy Charavel et al., "Tuning of Etching Rate by Implantation: Silicon, Polysilicon and Oxide", Article in AIP Conference Proceedings, Nov. 2006.

(Continued)

*Primary Examiner* — Britt Hanley
*Assistant Examiner* — Kevin Quinto
(74) *Attorney, Agent, or Firm* — Morgan, Lewis & Bockius LLP

(57) ABSTRACT

A memory device includes a substrate and a stack including word lines and interlayer insulating patterns alternatingly stacked on the substrate. The word lines extend in a first direction. Semiconductor patterns cross the word lines and have longitudinal axes parallel to a second direction. The semiconductor patterns are spaced apart from each other in the first direction and a third direction. Bit lines extend in the third direction and are spaced apart from each other in the first direction. Each of the bit lines contacts first side surfaces of the semiconductor patterns spaced apart from each other in the third direction. Data storage elements, which are respectively provided between vertically adjacent interlayer insulating patterns and contact second side surfaces opposite to the first side surfaces, and substrate impurity layers provided in portions of the substrate at both sides of the stack, are included.

5 Claims, 58 Drawing Sheets

(56) References Cited

U.S. PATENT DOCUMENTS

| | | | | |
|---|---|---|---|---|
| 7,709,277 | B2 | 5/2010 | Lee et al. | |
| 8,466,451 | B2 | 6/2013 | Chang et al. | |
| 8,553,466 | B2 | 10/2013 | Han et al. | |
| 8,559,235 | B2 | 10/2013 | Yoon et al. | |
| 8,654,587 | B2 | 2/2014 | Yoon et al. | |
| 8,741,723 | B2 | 6/2014 | Chi | |
| 9,859,402 | B2 | 1/2018 | Hung et al. | |
| 10,121,553 | B2 | 11/2018 | Harari | |
| 10,332,748 | B2 | 6/2019 | Prasad et al. | |
| 10,535,659 | B2 | 1/2020 | Kim et al. | |
| 11,501,827 | B2 | 11/2022 | Kim et al. | |
| 12,010,828 | B2 | 6/2024 | Jung et al. | |
| 2010/0051578 | A1 | 3/2010 | Chang et al. | |
| 2011/0233648 | A1 | 9/2011 | Seol et al. | |
| 2014/0054538 | A1 | 2/2014 | Park | |
| 2016/0141337 | A1 | 5/2016 | Shimabukuro et al. | |
| 2016/0233231 | A1 | 8/2016 | Lee et al. | |
| 2017/0084696 | A1 | 3/2017 | Lee et al. | |
| 2019/0067025 | A1* | 2/2019 | Yada | G11C 16/26 |
| 2020/0044046 | A1 | 2/2020 | Zhou | |
| 2020/0279601 | A1 | 9/2020 | Kim et al. | |
| 2022/0246619 | A1 | 8/2022 | Kim | |

FOREIGN PATENT DOCUMENTS

| | | | |
|---|---|---|---|
| CN | 111627885 | A | 9/2020 |
| KR | 10-2020-0105216 | A | 9/2020 |
| TW | 202034501 | | 9/2020 |

OTHER PUBLICATIONS

Final Office Action dated Oct. 19, 2023 in corresponding U.S. Appl. No. 17/382,844.

Office Action dated Apr. 20, 2023 in corresponding U.S. Appl. No. 17/382,844.

Office Action dated Oct. 7, 2022 in corresponding U.S. Appl. No. 17/382,844.

First Office Action mailed Jul. 29, 2026 in corresponding Chinese Patent Application No. 202111303361.

* cited by examiner

SEMICONDUCTOR MEMORY DEVICE AND METHOD OF FABRICATING THE SAME

CROSS-REFERENCE TO RELATED APPLICATIONS

This U.S. non-provisional patent application is a continuation application of U.S. patent application Ser. No. 17/382,844, filed on Jul. 22, 2021, which claims priority under 35 U.S.C. § 119 to Korean Patent Application No. 10-2020-0152659, filed on Nov. 16, 2020 in the Korean Intellectual Property Office, the disclosures of which are hereby incorporated by reference their entireties.

TECHNICAL FIELD

Embodiments of the present inventive concept relate to a semiconductor memory device and a method of fabricating the same, and in particular, to a semiconductor memory device with improved electric characteristics and a method of fabricating the same.

Discussion of Related Art

As technology advances, semiconductor devices are becoming more highly integrated. In the case of two-dimensional or planar semiconductor devices, since integration is mainly determined by the area occupied by a unit memory cell, integration is greatly influenced by the level of a fine pattern forming technology. However, expensive process equipment is needed to increase pattern fineness, which sets a practical limitation on increasing integration for two-dimensional or planar semiconductor devices. Thus, three-dimensional semiconductor memory devices including three-dimensionally arranged memory cells have recently been proposed.

SUMMARY

Embodiments of the inventive concept provide a semiconductor memory device having improved electric characteristics.

According to an embodiment of the inventive concept, a semiconductor memory device includes a substrate, and a stack including a plurality of word lines and a plurality of interlayer insulating patterns, which are alternatingly stacked on the substrate. The word lines extend in a first direction substantially parallel to a top surface of the substrate. The semiconductor memory device further includes a plurality of semiconductor patterns crossing the word lines and having longitudinal axes that are substantially parallel to a second direction. The semiconductor patterns are spaced apart from each other in the first direction and a third direction that is substantially perpendicular to the top surface of the substrate. The semiconductor memory device further includes a plurality of bit lines extending in the third direction and spaced apart from each other in the first direction. Each of the bit lines is in contact with first side surfaces of the semiconductor patterns that are spaced apart from each other in the third direction. The semiconductor memory device further includes a plurality of data storage elements. The data storage elements are respectively provided between vertically adjacent patterns of the interlayer insulating patterns and are in contact with second side surfaces opposite to the first side surfaces of the semiconductor patterns. The semiconductor memory device further includes a plurality of substrate impurity layers provided in portions of the substrate at both sides of the stack.

According to an embodiment of the inventive concept, a semiconductor memory device includes a substrate, and a stack including a plurality of word lines and a plurality of interlayer insulating patterns, which are alternatingly stacked on the substrate. The word lines extend in a first direction substantially parallel to a top surface of the substrate. The semiconductor memory device further includes a plurality of semiconductor patterns crossing the word lines and having longitudinal axes that are substantially parallel to a second direction. The semiconductor patterns are spaced apart from each other in the first direction and a third direction that is substantially perpendicular to the top surface of the substrate. The semiconductor memory device further includes a plurality of bit lines extending in the third direction and spaced apart from each other in the first direction. Each of the bit lines is in contact with first side surfaces of the semiconductor patterns that are spaced apart from each other in the third direction. The semiconductor memory device further includes a plurality of data storage elements. The data storage elements are respectively provided between vertically adjacent patterns of the interlayer insulating patterns and are in contact with second side surfaces opposite to the first side surfaces of the semiconductor patterns. Each of the semiconductor patterns includes first source/drain regions and second source/drain regions, which are spaced apart from each other in the second direction, and a channel region disposed between the first and second source/drain regions. The channel regions of the semiconductor patterns have a first thickness in the third direction, and the first source/drain regions of the semiconductor patterns have a second thickness that is substantially equal to or greater than the first thickness in the third direction.

According to an embodiment of the inventive concept, a semiconductor memory device includes a substrate, a first stack disposed on the substrate, and a second stack disposed on the substrate. Each of the first and second stacks includes a plurality of word lines, which extend in a first direction and are stacked on the substrate with interlayer insulating patterns interposed therebetween. The semiconductor memory device further includes a plurality of semiconductor patterns having longitudinal axes, which are substantially parallel to a second direction crossing the word lines. The semiconductor patterns are disposed on the substrate and are spaced apart from each other in the first direction, the second direction, and a third direction, which is substantially perpendicular to a top surface of the substrate. The semiconductor memory device further includes a plurality of bit lines extending in the third direction and spaced apart from each other in the first direction. The bit lines include first bit lines crossing the word lines of the first stack and second bit lines crossing the word lines of the second stack. The semiconductor memory device further includes a plurality of first storage electrodes respectively provided between vertically adjacent patterns of the interlayer insulating patterns of the first stack, a plurality of second storage electrodes respectively provided between vertically adjacent patterns of the interlayer insulating patterns of the second stack, a plate electrode, which is provided between the first and second stacks and covers the first and second storage electrodes in common, and a dielectric layer disposed between the first and second storage electrodes and the plate electrode. The semiconductor memory device further includes a plurality of first insulating separation patterns, which are spaced apart from each other in the first direction and are provided between the first bit lines and between the second bit lines, a plurality of second insulating separation patterns, which are spaced apart from each other in the first direction and are provided between the first storage electrodes and between the second storage electrodes, and a plurality of substrate impurity layers provided in portions of the substrate at both sides of the first and second stacks. The substrate impurity layers include at least one of boron (B), carbon (C), or fluorine (F).

According to an embodiment of the inventive concept, a method of fabricating a semiconductor memory device includes forming a mold structure by alternately stacking a plurality of sacrificial layers and a plurality of semiconductor layers on a substrate, forming a plurality of openings that penetrate the mold structure, forming a plurality of sidewall impurity regions by doping side portions of the semiconductor layers, which are exposed through the openings, with impurities, and forming a plurality of horizontal regions between the semiconductor layers by removing the sacrificial layers. The method further includes forming a plurality of preliminary semiconductor patterns by etching top and bottom surfaces of the semiconductor layers, which are exposed through the horizontal regions, and forming a plurality of conductive patterns locally in the horizontal regions. Forming the sidewall impurity regions includes forming substrate impurity layers in portions of the substrate, which are exposed through the openings.

BRIEF DESCRIPTION OF THE DRAWINGS

The above and other features of the inventive concept will become more apparent by describing in detail example embodiments thereof with reference to the accompanying drawings, in which.

DETAILED DESCRIPTION

Figure 1:
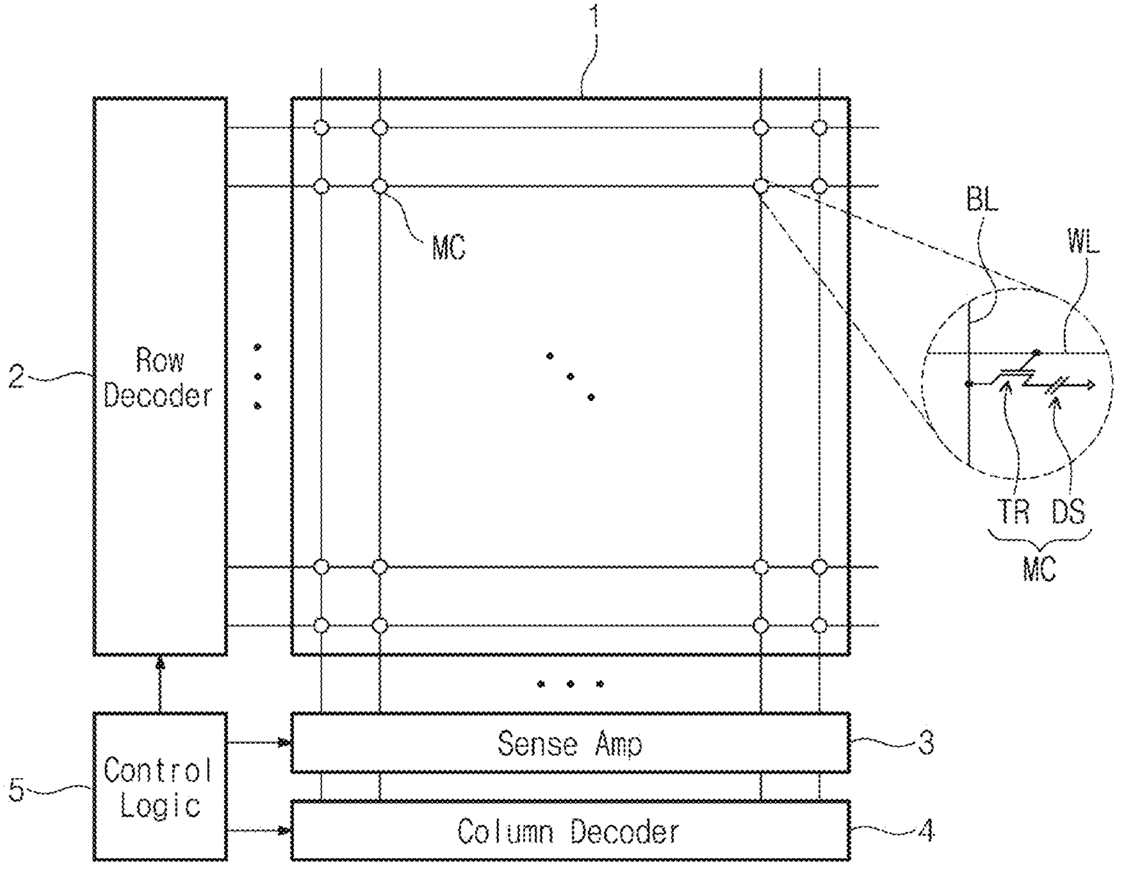
FIG. 1 is a circuit diagram schematically illustrating a cell array of a semiconductor memory device according to an embodiment of the inventive concept.

Example embodiments of the inventive concepts will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art. Other uses of these terms and similar terms to describe the relationships between components should be interpreted in a like fashion.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a circuit diagram schematically illustrating a cell array of a semiconductor memory device according to an embodiment of the inventive concept.

Referring to FIG. 1, a semiconductor memory device may include a memory cell array 1, a row decoder 2, a sensing amplifier 3, a column decoder 4, and a control logic 5.

The memory cell array 1 may include a plurality of memory cells MC, which are three-dimensionally arranged. Each of the memory cells MC may be provided between and connected to a word line WL and a bit line BL crossing each other.

Each of the memory cells MC may include a selection element TR and a data storage element DS. The selection element TR and the data storage element DS may be electrically connected in series to each other. The data storage element DS may be provided between and connected to the bit line BL and a selection element TR, and the selection element TR may be provided between and connected to the data storage element DS and the word line WL. The selection element TR may be, for example, a field effect transistor (FET), and the data storage element DS may be, for example, a capacitor, a variable resistor, or the like. As an example, the selection element TR may include a transistor, and the transistor may include a gate electrode, which is connected the word line WL, and drain/source terminals, which are respectively connected to the bit line BL and the data storage element DS.

The row decoder 2 may decode address information, which is input from outside the semiconductor memory device, and may select one of the word lines WL of the memory cell array 1, based on the decoded address information. The address information decoded by the row decoder 2 may be provided to a row driver, and in this case, the row driver may provide specific voltages to the selected and unselected ones of the word lines WL, respectively, in response to the control of a control circuit.

The sensing amplifier 3 may be configured to sense, amplify, and output a difference in voltage between one of the bit lines BL, which is selected based on address information decoded by the column decoder 4, and a reference bit line.

The column decoder 4 may provide a data transmission path between the sensing amplifier 3 and an external device (e.g., a memory controller). The column decoder 4 may be configured to decode address information, which is input from outside the semiconductor memory device, and to select one of the bit lines BL, based on the decoded address information.

The control logic 5 may be configured to generate control signals, which are used to control data writing or reading operations on the memory cell array 1.

FIGS. 2A, 3A, 4A, 5A, 6A, 7A, 8A, 9A, 10A, 11A, 12A, 13A, 14A, 15A, 16A and 17A are plan views illustrating a method of fabricating a semiconductor memory device, according to an embodiment of the inventive concept.

FIGS. 2B, 3B, 4B, 5B, 6B, 7B, 8B, 9B, 10B, 11B, 12B, 13B, 14B, 15B, 16B and 17B are cross-sectional views, which are taken along lines A-A' and B-B' of FIGS. 2A to 17A, illustrating a method of fabricating a semiconductor memory device, according to an embodiment of the inventive concept.

FIGS. 2C, 3C, 4C, 5C, 6C, 7C, 8C, 9C, 10C, 11C, 12C, 13C, 14C, 15C, 16C and 17C are cross-sectional views, which are taken along lines C-C' and D-D' of FIGS. 2A to 17A, illustrating a method of fabricating a semiconductor memory device, according to an embodiment of the inventive concept.

FIGS. 3D, 5D, 6D, and 7D are enlarged cross-sectional views illustrating portions E1, E2, E3, and E4 of FIGS. 3B, 5B, 6B, and 7B, respectively. FIGS. 18A, 18B, and 18C are enlarged cross-sectional views illustrating a portion (e.g., P of FIG. 17B) of a semiconductor memory device according to an embodiment of the inventive concept.

Figure 2A:
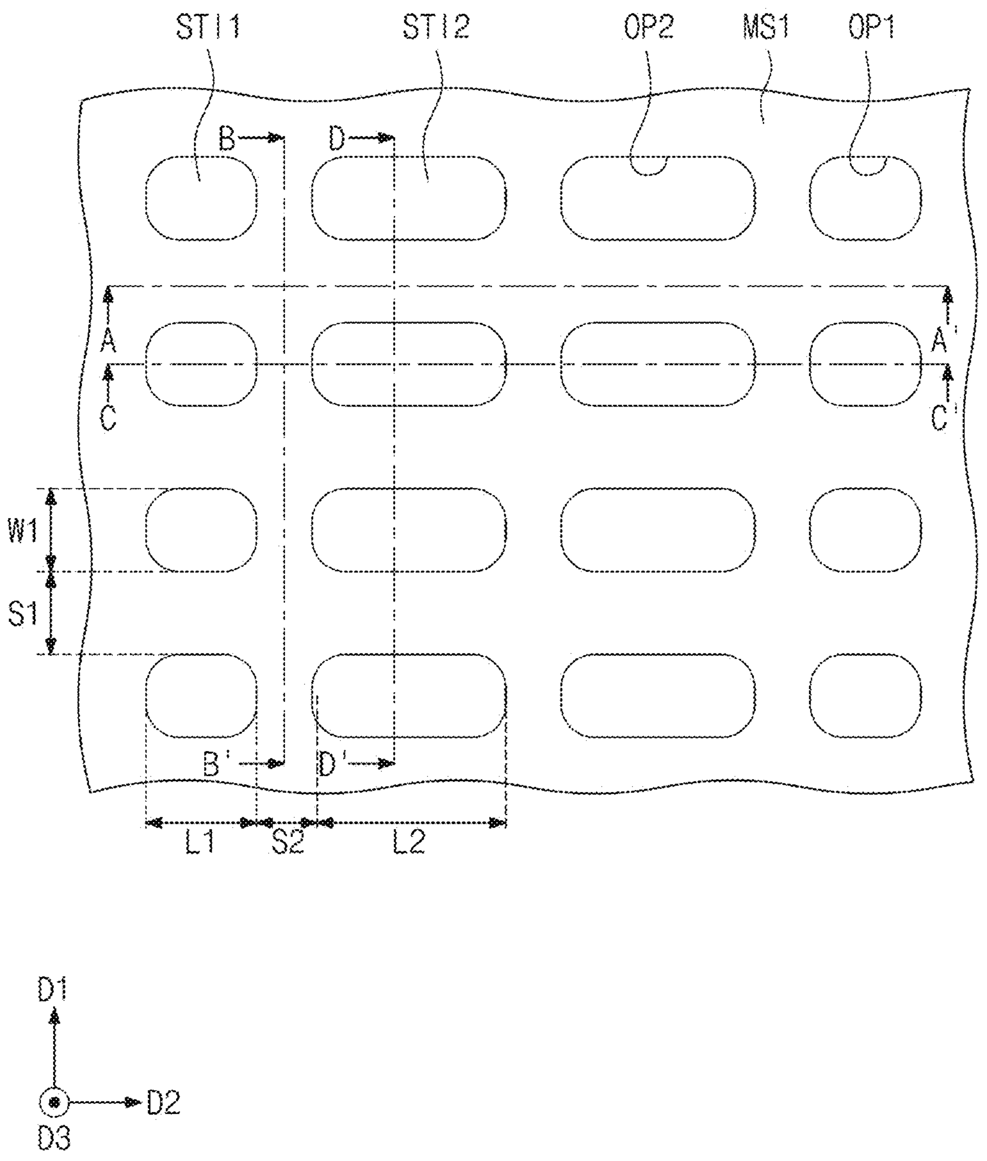
FIGS. 2A, 3A, 4A, 5A, 6A, 7A, 8A, 9A, 10A, 11A, 12A, 13A, 14A, 15A, 16A and 17A are plan views illustrating a method of fabricating a semiconductor memory device, according to an embodiment of the inventive concept.
Figure 2B:
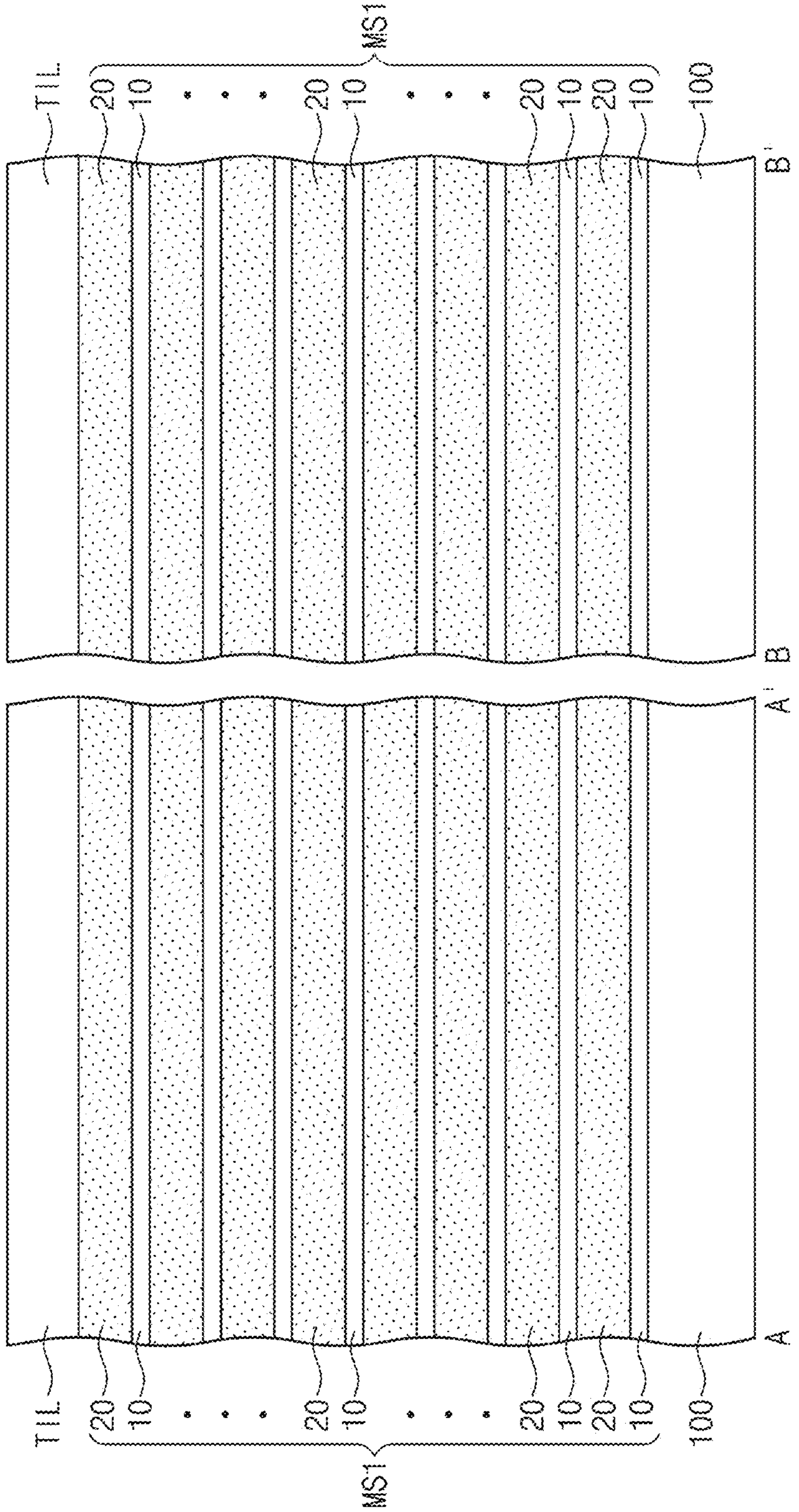
FIGS. 2B, 3B, 4B, 5B, 6B, 7B, 8B, 9B, 10B, 11B, 12B, 13B, 14B, 15B, 16B and 17B are cross-sectional views, which are taken along lines A-A' and B-B' of FIGS. 2A to 17A, illustrating a method of fabricating a semiconductor memory device, according to an embodiment of the inventive concept.
Figure 2C:
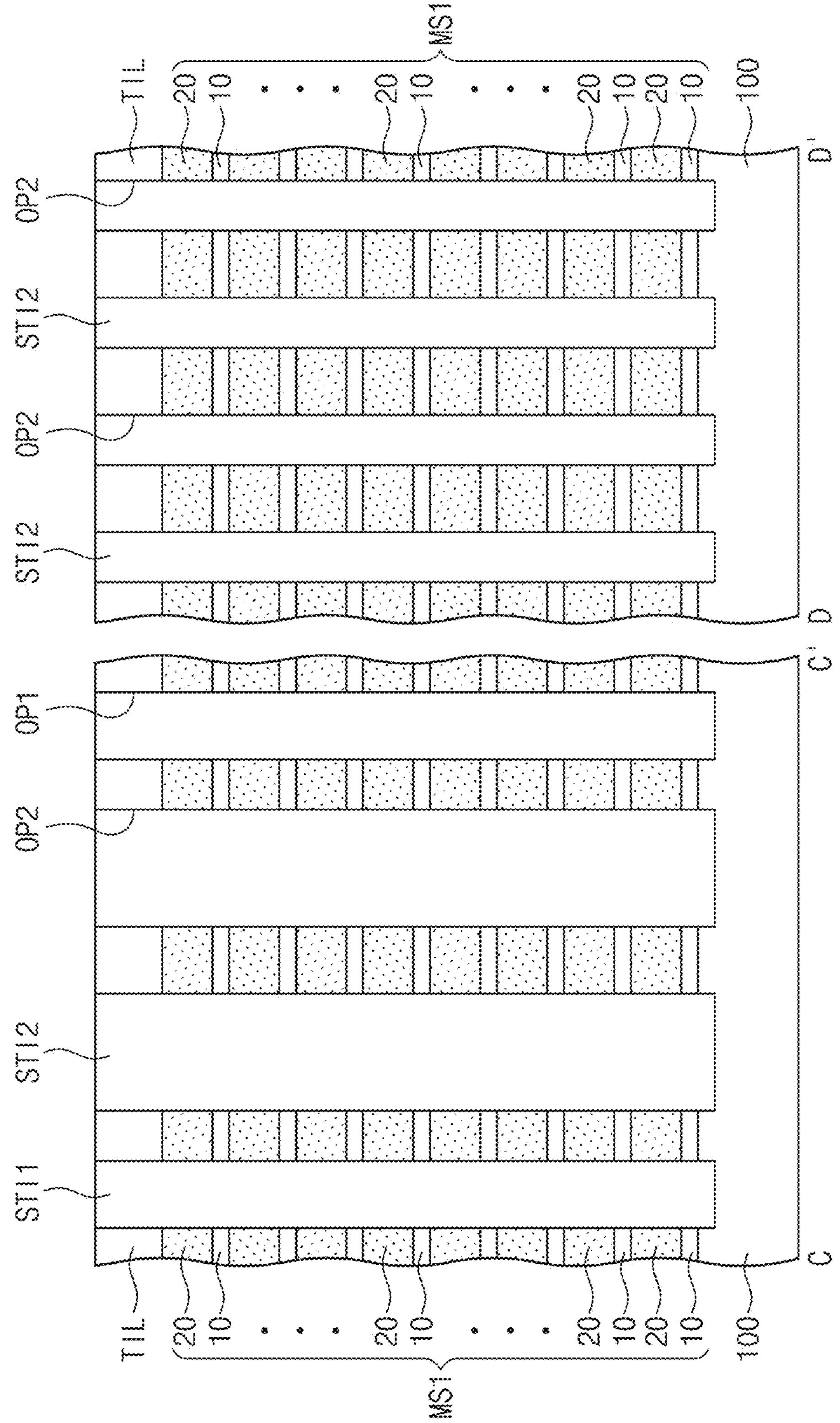
FIGS. 2C, 3C, 4C, 5C, 6C, 7C, 8C, 9C, 10C, 11C, 12C, 13C, 14C, 15C, 16C and 17C are cross-sectional views, which are taken along lines C-C' and D-D' of FIGS. 2A to 17A, illustrating a method of fabricating a semiconductor memory device, according to an embodiment of the inventive concept.

Referring to FIGS. 2A, 2B, and 2C, a first mold structure MS1 may be formed on a semiconductor substrate 100. The first mold structure MS1 may include first sacrificial layers 10 and semiconductor layers 20, which are alternately stacked on the semiconductor substrate 100.

The first sacrificial layers 10 may be formed of a material having an etch selectivity with respect to the semiconductor layers 20. For example, the first sacrificial layers 10 may be formed of or include at least one of, for example, silicon germanium, silicon oxide, silicon nitride, or silicon oxynitride. In an embodiment, the first sacrificial layers 10 may be formed of or include a semiconductor material (e.g., silicon germanium). In the first mold structure MS1, each of the first sacrificial layers 10 may be thinner than each of the semiconductor layers 20.

The semiconductor layers 20 may be formed of or include at least one of, for example, silicon, germanium, silicon-germanium, or indium gallium zinc oxide (IGZO). In an embodiment, the semiconductor layers 20 may be formed of or include the same semiconductor material as the semiconductor substrate 100. For example, the semiconductor layers 20 may be formed of or include single- or poly-crystalline silicon.

In an embodiment, the first sacrificial layers 10 and the semiconductor layers 20 may be formed by an epitaxial growth process. The semiconductor layers 20 may be single-crystalline silicon layers, and the first sacrificial layers 10 may be silicon germanium layers having a super lattice structure.

An upper insulating layer TIL may be formed on the first mold structure MS1 to cover the uppermost one of the semiconductor layers 20. The upper insulating layer TIL may be formed of an insulating material having an etch selectivity with respect to the first sacrificial layers 10 and the semiconductor layers 20. For example, the upper insulating layer TIL may be a silicon oxide layer.

Thereafter, the upper insulating layer TIL and the first mold structure MS1 may be patterned to form first and second openings OP1 and OP2 exposing the semiconductor substrate 100.

The formation of the first and second openings OP1 and OP2 may include forming a mask pattern, which has a plurality of openings corresponding to the first and second openings OP1 and OP2, on the first mold structure MS1, and then anisotropically etching the first mold structure MS1 using the mask pattern as an etch mask.

The first and second openings OP1 and OP2 may be formed to expose a top surface of the semiconductor substrate 100, and in a case in which the anisotropic etching is performed in an over-etching manner, the top surface of the semiconductor substrate 100 below the first and second openings OP1 and OP2 may be recessed.

The first openings OP1 may be spaced apart from each other in a first direction D1. The second openings OP2 may be spaced apart from each other in the first direction D1 and may be spaced apart from the first openings OP1 in a second direction D2. A pair of the second openings OP2 may be formed between a pair of the first openings OP1, which are adjacent to each other in the second direction D2.

The first and second openings OP1 and OP2 may be spaced apart from each other by a first distance S1 in the first direction D1. The first openings OP1 may be spaced apart from the second openings OP2 by a second distance S2, which is smaller than the first distance S1, in the second direction D2.

Each of the first and second openings OP1 and OP2 may have a first width W1 in the first direction D1. When measured in the second direction D2, the first openings OP1 may have a first length L1, and the second openings OP2 may have a second length L2 that is larger than the first length L1.

Next, first and second insulating separation patterns STI1 and STI2 may be formed to fill the first and second openings OP1 and OP2, respectively.

The first and second insulating separation patterns STI1 and STI2 may be in contact (e.g., direct contact) with the semiconductor substrate 100. The first and second insulating separation patterns STI1 and STI2 may be formed of or include at least one of, for example, silicon oxide, silicon oxynitride, or insulating materials, which are formed using a spin-on-glass (SOG) technology. The first and second insulating separation patterns STI1 and STI2 may be formed by depositing an insulating separation layer to fill the first and second openings OP1 and OP2 and then planarizing the insulating separation layer to expose a top surface of the upper insulating layer TIL.

Figure 3A:
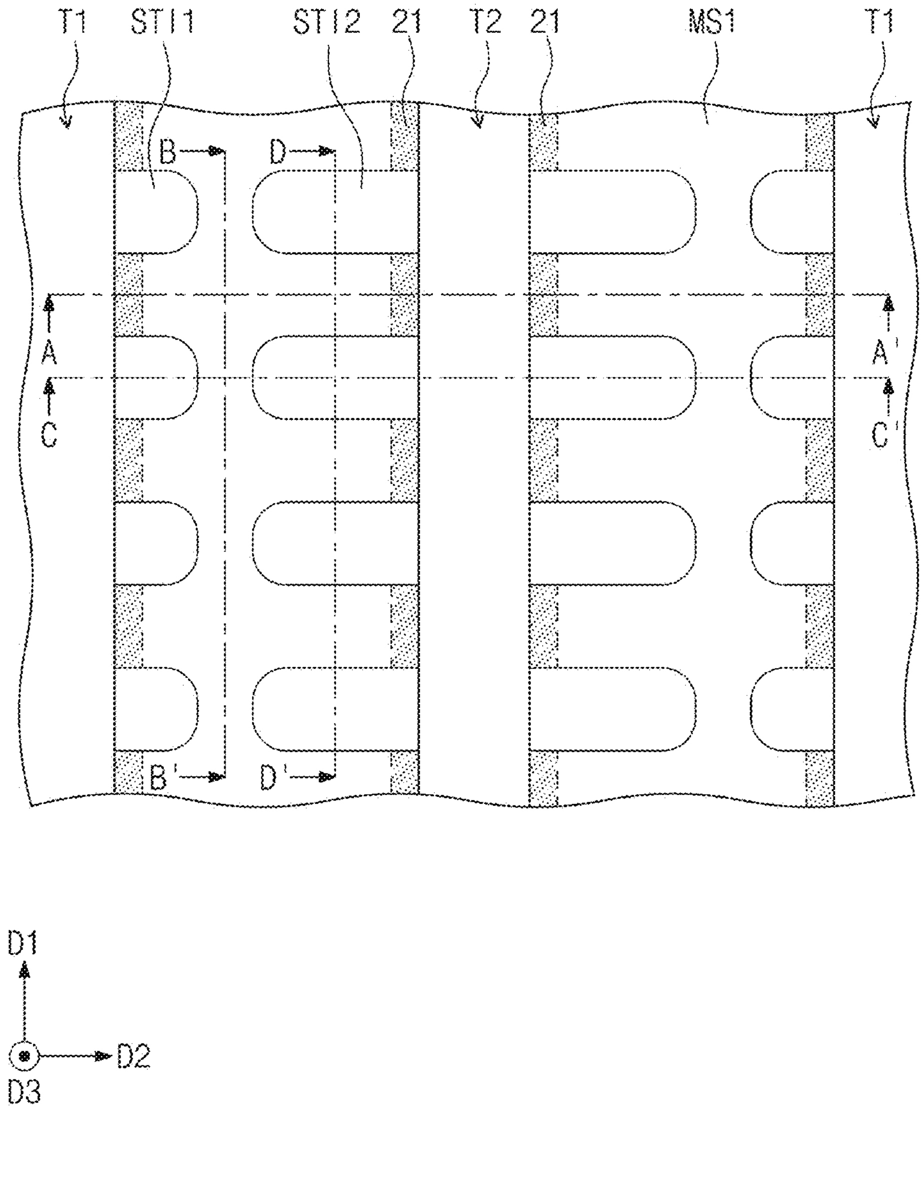
Figure 3B:
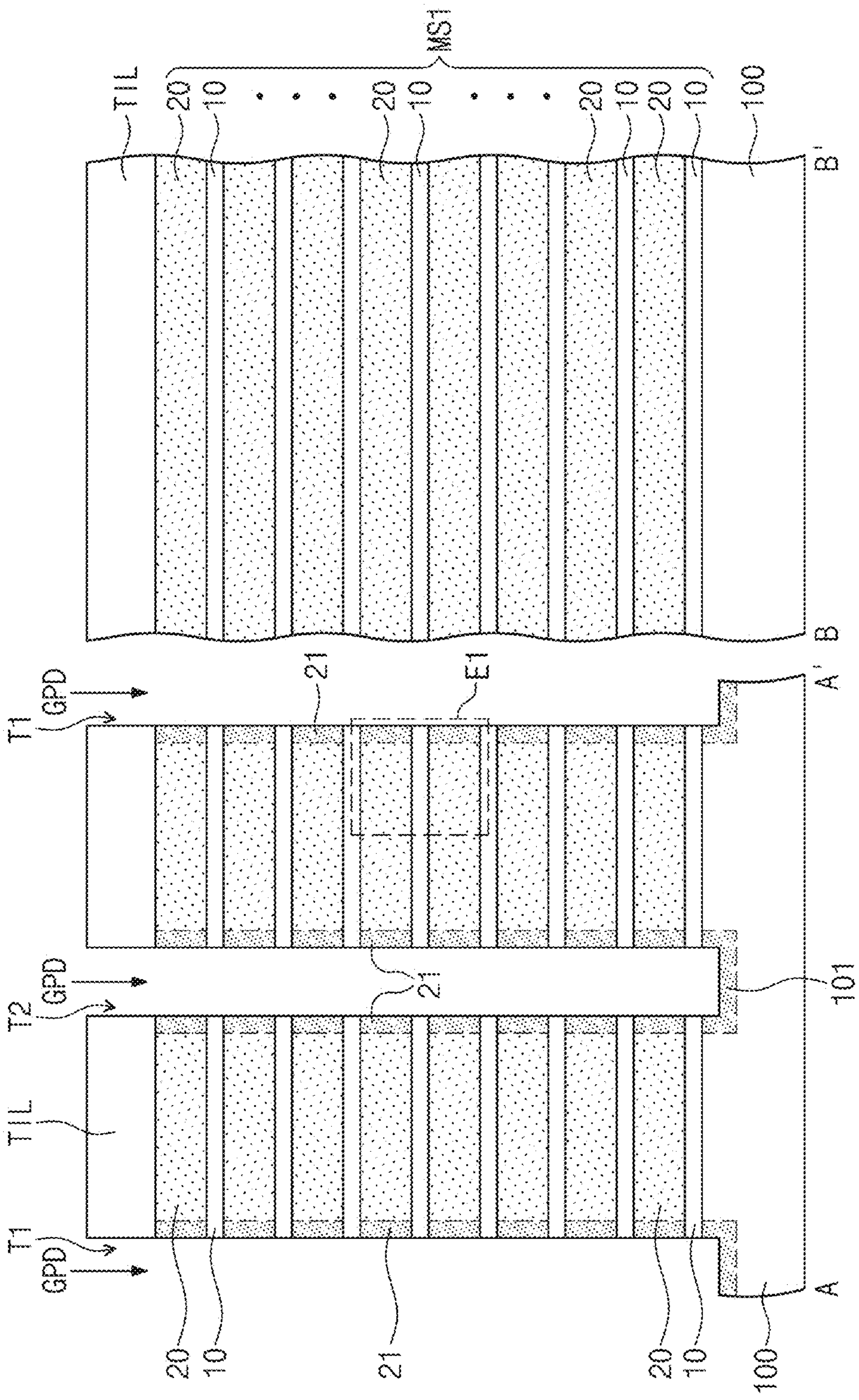
Figure 3C:
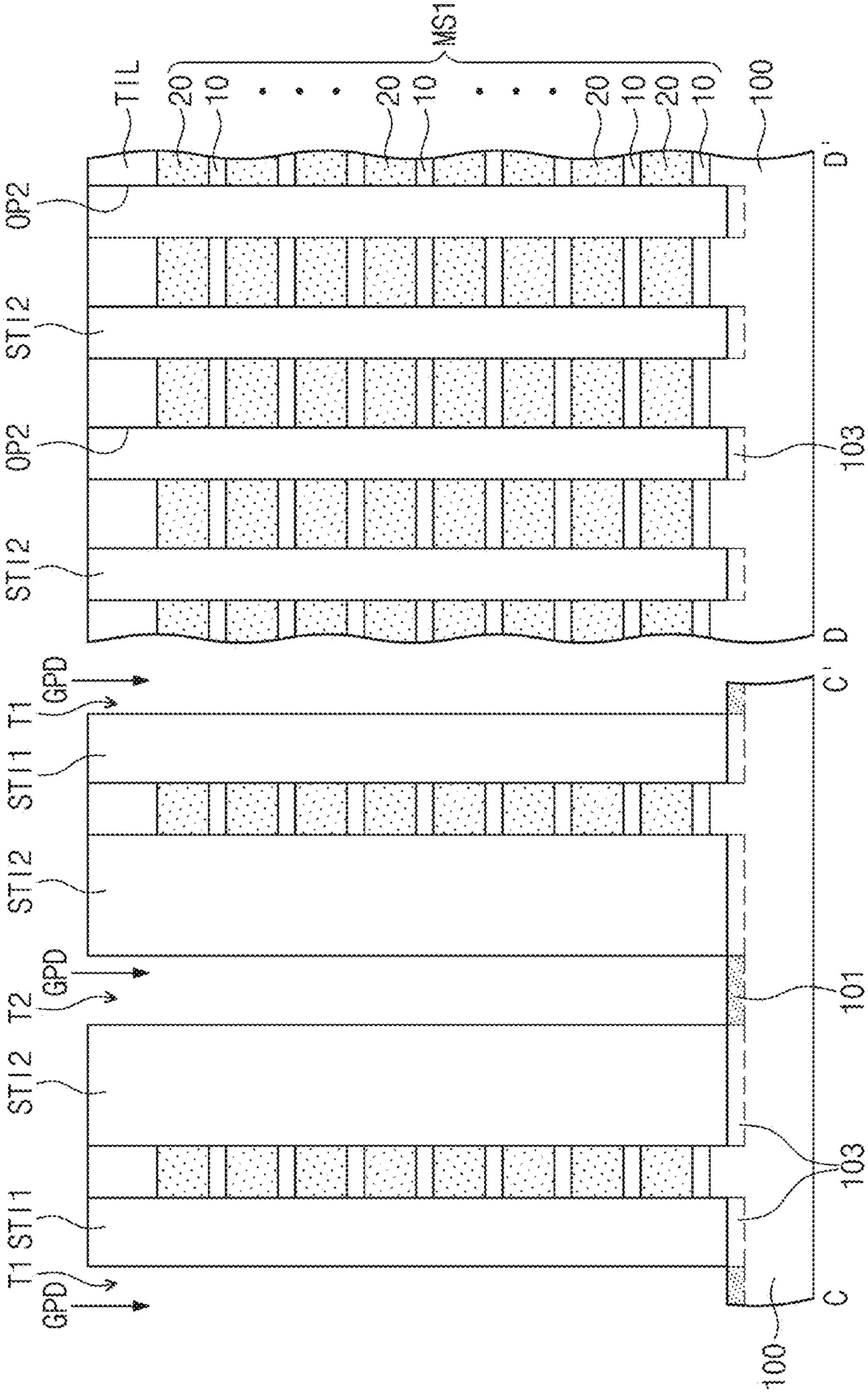

Referring to FIGS. 3A, 3B, and 3C, first and second trenches T1 and T2 may be formed to penetrate the first mold structure MS1 and to expose side surfaces of the first sacrificial layers 10 and the semiconductor layers 20.

The formation of the first and second trenches T1 and T2 may include forming a mask pattern, which has a plurality of openings corresponding to the first and second trenches T1 and T2, on the first mold structure MS1, and then anisotropically etching the first mold structure MS1 using the mask pattern as an etch mask. The first and second trenches T1 and T2 may be formed to expose the top surface of the semiconductor substrate 100, and in a case in which the anisotropic etching is performed in an over-etching manner, the top surface of the semiconductor substrate 100 below the first and second trenches T1 and T2 may be recessed to form a plurality of recess regions.

The first and second trenches T1 and T2 may extend in the first direction D1 and may be substantially parallel to each other. The first and second trenches T1 and T2 may be formed to expose the side surfaces of the first sacrificial layers 10 and the semiconductor layers 20. In addition, the first trenches T1 may extend in the first direction D1 to expose side surfaces of the first insulating separation patterns STI1.

Each of the second trenches T2 may be formed between an adjacent pair of the first trenches T1 and may extend in the first direction D1 to expose side surfaces of the second insulating separation patterns STI2.

After the formation of the first and second trenches T1 and T2, an impurity doping process may be performed to form sidewall impurity regions 21 in side portions of the semiconductor layers 20.

As an example, a gas phase doping (GPD) process, a beam line ion implantation process, or a plasma-assisted doping (PLAD) process may be performed as the impurity doping process. In an embodiment, a thermal treatment process may be further performed after the impurity doping process.

In the impurity doping process, an impurity-containing gas may be uniformly provided into the first and second trenches T1 and T2 to dope the side surfaces of the semiconductor layers 20, which are exposed through the first and second trenches T1 and T2, with impurities.

A source gas, which contains at least one of boron (B), carbon (C), or fluorine (F), may be used in the impurity doping process. In this case, the sidewall impurity regions 21 may include at least one of boron (B), carbon (C), or fluorine (F) as the impurities.

Figure 3D:
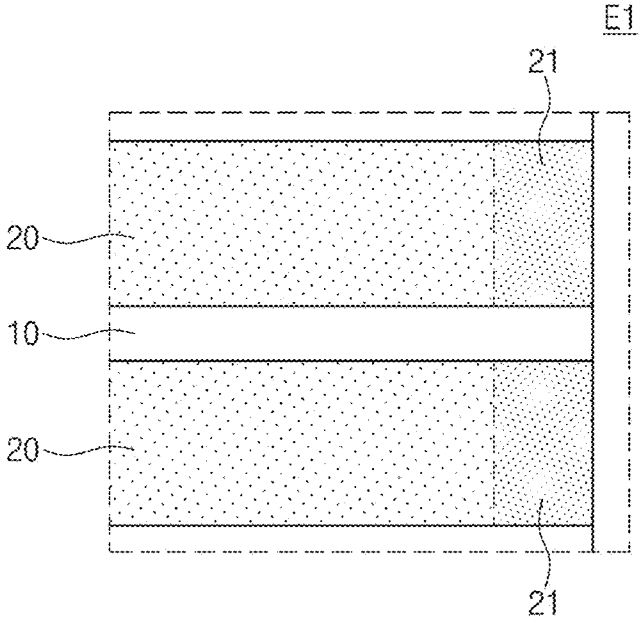
FIGS. 3D, 5D, 6D, and 7D are enlarged cross-sectional views illustrating portions E1, E2, E3, and E4 of FIGS. 3B, 5B, 6B, and 7B, respectively.

Referring to FIG. 3D, the sidewall impurity region 21 may be a side portion of the semiconductor layer 20 that is uniformly doped and is exposed to the first or second trench T1 or T2. In an embodiment, an impurity concentration in the sidewall impurity region 21 may gradually decrease as the distance from the side surfaces of the semiconductor layers 20 increases.

The impurity doping process may also be performed to dope the semiconductor substrate 100, which is exposed through the first and second trenches T1 and T2, with the impurities. Accordingly, substrate impurity layers 101 may be formed in the semiconductor substrate 100. The substrate impurity layers 101 may contain the same impurities as those in the sidewall impurity regions 21. In an embodiment, an impurity concentration in the substrate impurity layer 101 may gradually decrease as the distance from the surface of the semiconductor substrate 100 increases.

Although the sidewall impurity regions 21 have been described as being formed after the formation of the first and second trenches T1 and T2, embodiments of the inventive concept are not limited thereto. For example, in an embodiment, before forming the first and second insulating separation patterns STI1 and STI2, the sidewall impurity regions 21 may be formed in the side portions of the semiconductor layers 20 exposed through the first and second openings OP1 and OP2. In other words, after the formation of the first and second openings OP1 and OP2 as described with reference to FIGS. 2A, 2B, and 2C, the sidewall impurity regions 21 may be formed in the side portions of the semiconductor layers 20 that are exposed through the first and second openings OP1 and OP2.

Furthermore, if the impurity doping process is performed on the semiconductor layers 20 exposed through the first and second openings OP1 and OP2, substrate impurity layers 103 may be formed in the semiconductor substrate 100 below the first and second insulating separation patterns STI1 and STI2.

Figure 4A:
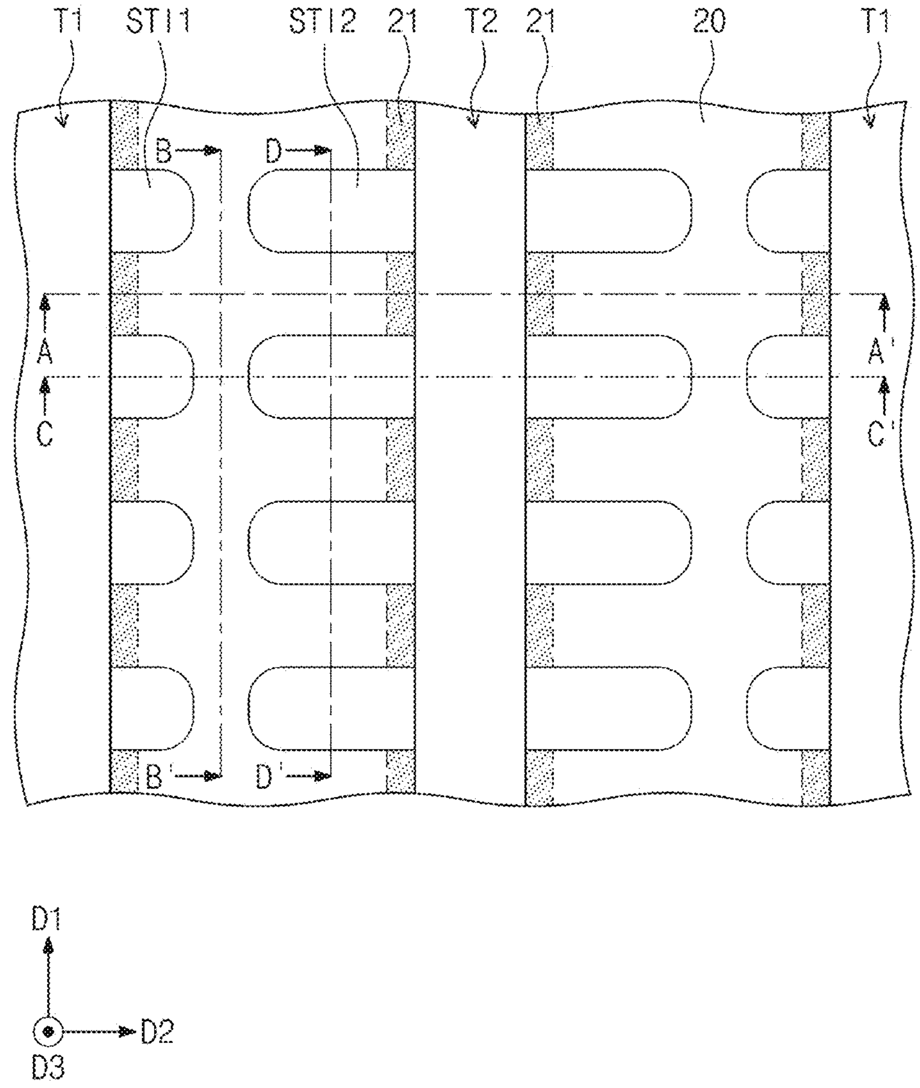
Figure 4B:
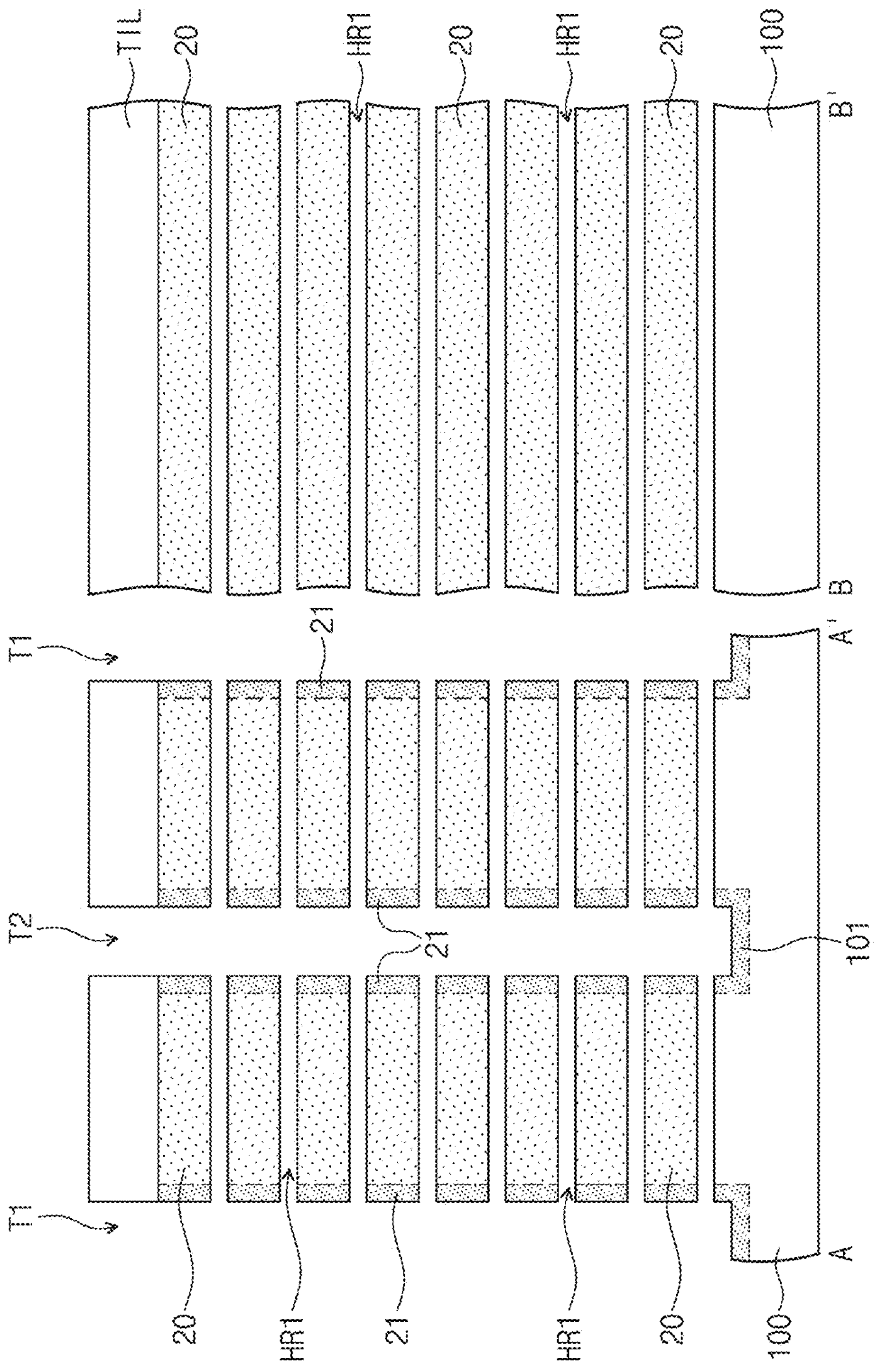
Figure 4C:
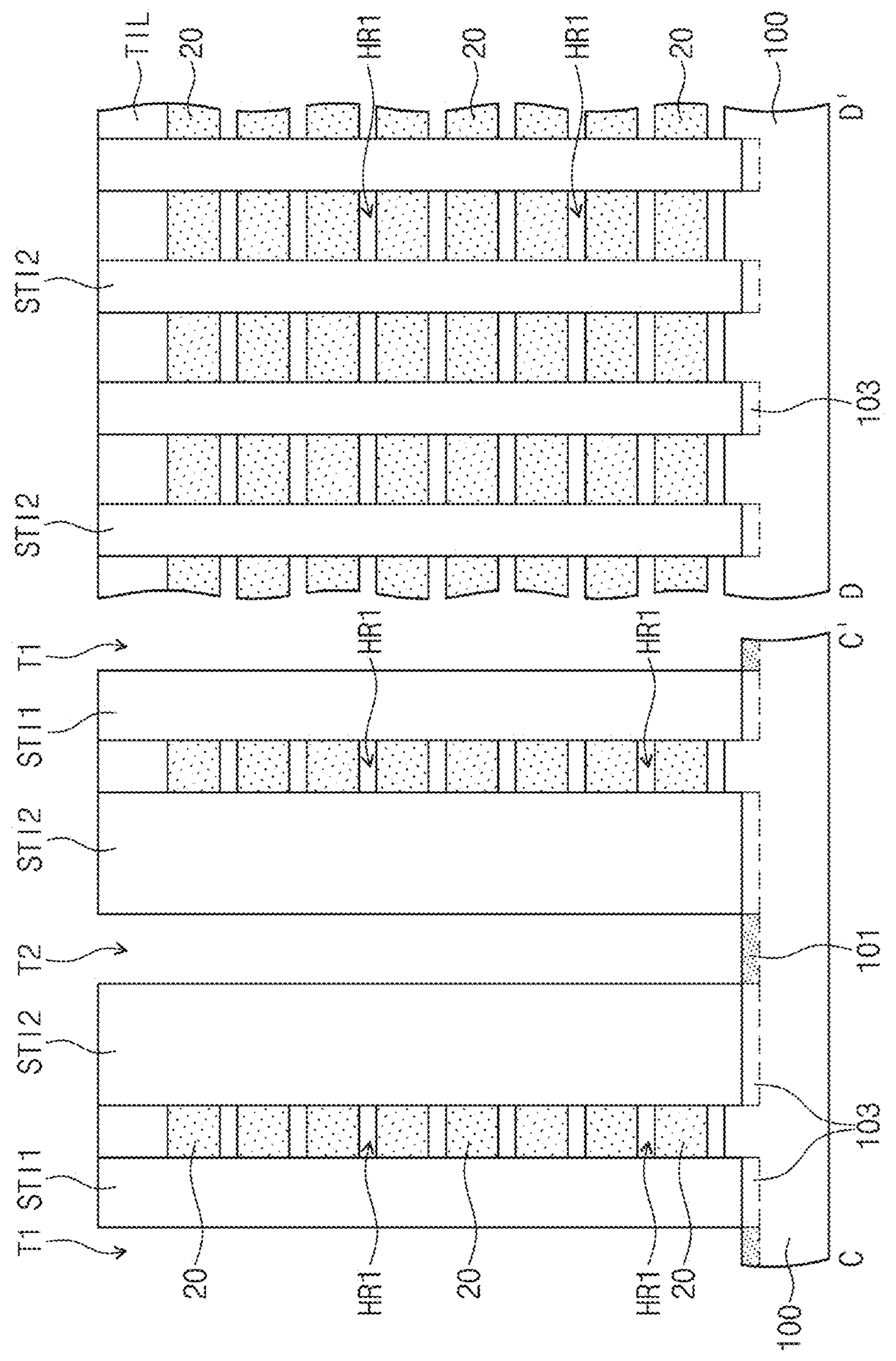

Referring to FIGS. 4A, 4B, and 4C, the first sacrificial layers 10, which are exposed through the first and second trenches T2, may be selectively removed, and thus, first horizontal regions HR1 may be formed between vertically adjacent layers of the semiconductor layers 20.

The formation of the first horizontal regions HR1 may include performing an etching process using an etch recipe, which has an etch selectivity with respect to the semiconductor substrate 100, the semiconductor layers 20, and the first and second insulating separation patterns STI1 and STI2, to isotropically etch the first sacrificial layers 10. Due to the first and second insulating separation patterns STI1 and STI2, in an embodiment, the semiconductor layers 20 are not collapsed and may be vertically spaced apart from each other during the removal of the first sacrificial layers 10.

A vertical thickness of the first horizontal region HR1 (e.g., a vertical distance between vertically adjacent layers of the semiconductor layers 20) may be substantially equal to a thickness of the first sacrificial layer 10.

Figure 5A:
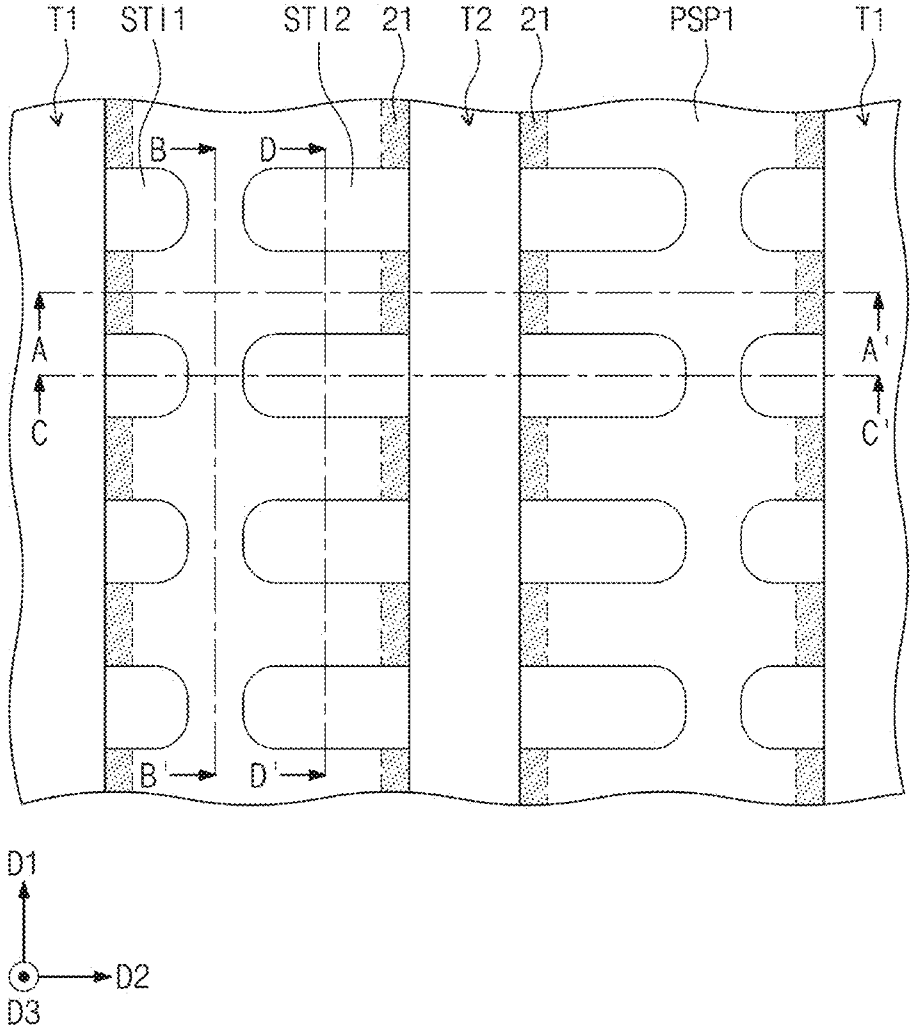
Figure 5B:
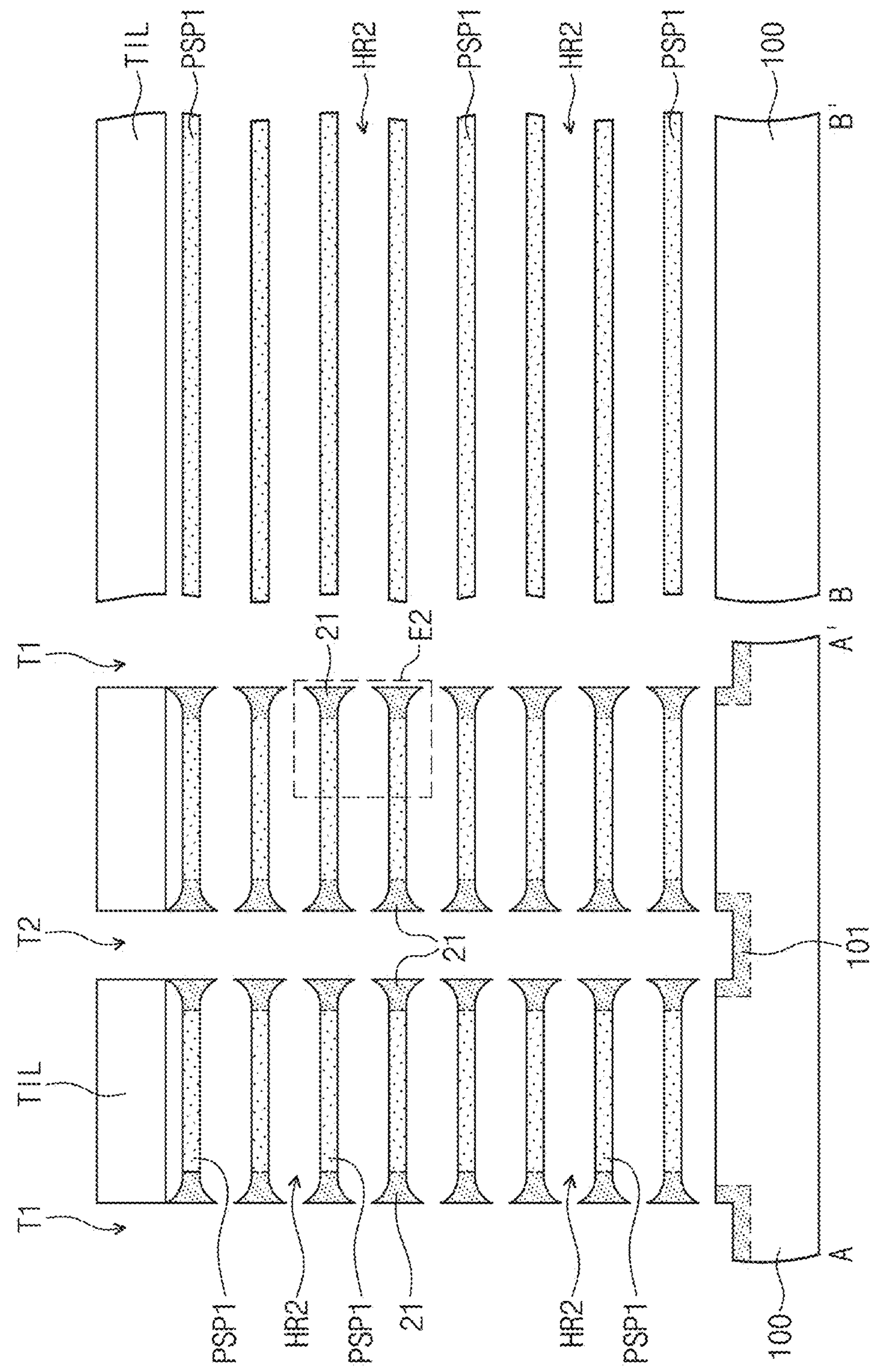
Figure 5C:
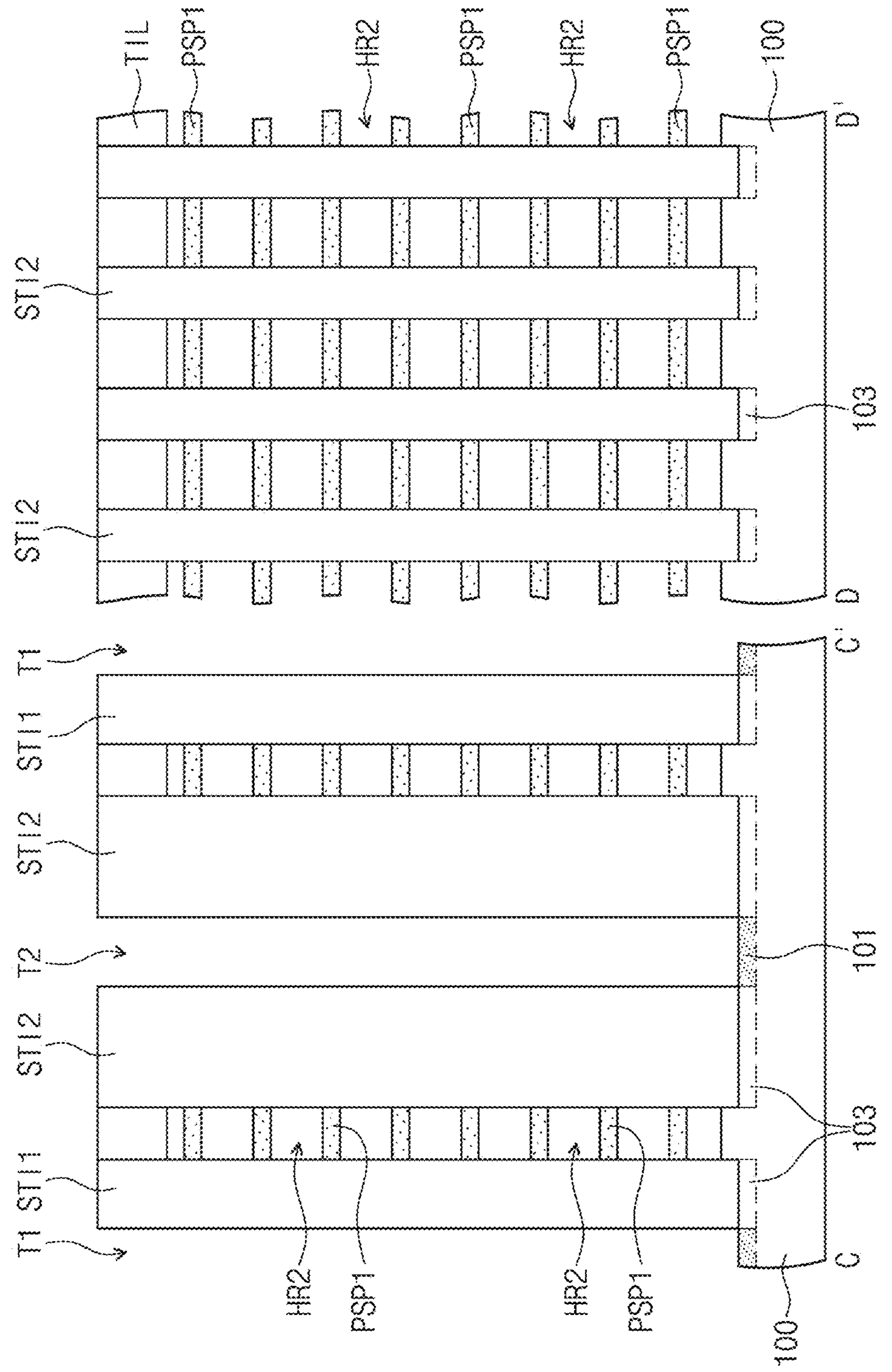

Referring to FIGS. 5A, 5B, and 5C, an enlargement process may be performed to increase the vertical thickness of the first horizontal regions HR1.

As an example, the enlargement process may include etching top and bottom surfaces of the semiconductor layers 20, which are exposed through the first horizontal regions HR1. The enlargement process may include performing an isotropic etching process using an etch recipe, which has an etch selectivity with respect to the upper insulating layer TIL and the first and second insulating separation patterns STI1 and STI2. A thickness of each of the semiconductor layers 20 may be reduced by the enlargement process. Accordingly, first preliminary semiconductor patterns PSP1 may be formed, and second horizontal regions HR2 may be respectively formed between vertically adjacent patterns of the first preliminary semiconductor patterns PSP1.

Since the sidewall impurity regions 21 are formed in the semiconductor layers 20, an etching amount of the semiconductor layer 20 may be significantly lower at its side portions than at its top and bottom portions during the isotropic etching process on the semiconductor layers 20. In other words, during the isotropic etching process on the semiconductor layers 20, the semiconductor layers 20 may be prevented from being etched in a horizontal direction. In addition, during the isotropic etching process on the semiconductor layers 20, the sidewall impurity regions 21 may prevent the side surfaces of the semiconductor layers 20 from being etched along its crystal facets and thereby from having wedge-shaped side surfaces. In other words, due to the sidewall impurity regions 21, a sidewall profile of the semiconductor layer 20 may be prevented from being deformed during the isotropic etching process on the semiconductor layers 20. Accordingly, the first preliminary semiconductor patterns PSP1 may have substantially flat side surfaces.

Furthermore, since the substrate impurity layer 101 is formed below the first and second trenches T1 and T2, a portion of the semiconductor substrate 100, which is exposed through the first and second trenches T1 and T2, may be prevented from being partially etched and thereby from having sigma-shaped undercut regions, during the isotropic etching process on the semiconductor layers 20.

Figure 5D:
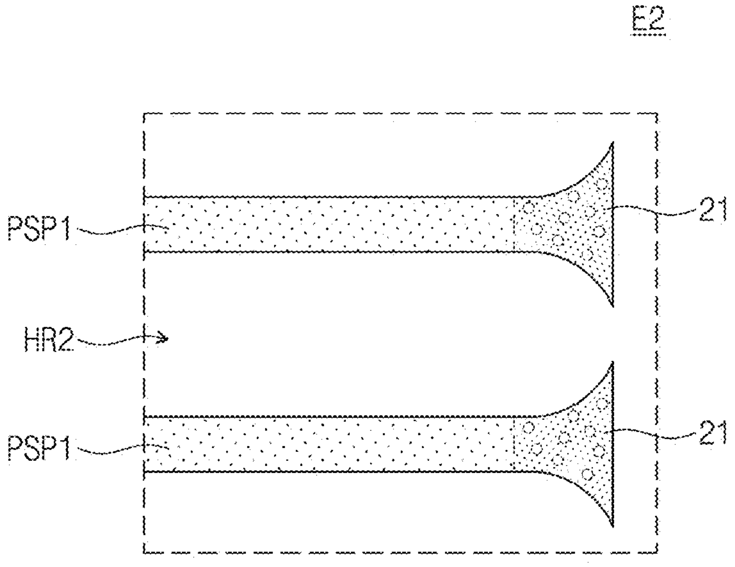

Since, during the isotropic etching process on the semiconductor layers 20, there is a difference in an etching amount between side and center portions of the semiconductor layers 20, the first preliminary semiconductor patterns PSP1 may have a sharp profile at its corner portions and may have the largest thickness at its side surfaces, which are exposed through the first and second trenches T1 and T2, as shown in FIG. 5D.

Since, during the isotropic etching process performed on the semiconductor layers 20, there is a difference in an etching amount between side and center portions of the semiconductor layers 20, a thickness of the first preliminary semiconductor pattern PSP1 may be larger at its side portion than at its center portion. In an embodiment, the first preliminary semiconductor patterns PSP1 may have a thickness of about 3 nm to about 13 nm at its center portion.

Figure 6A:
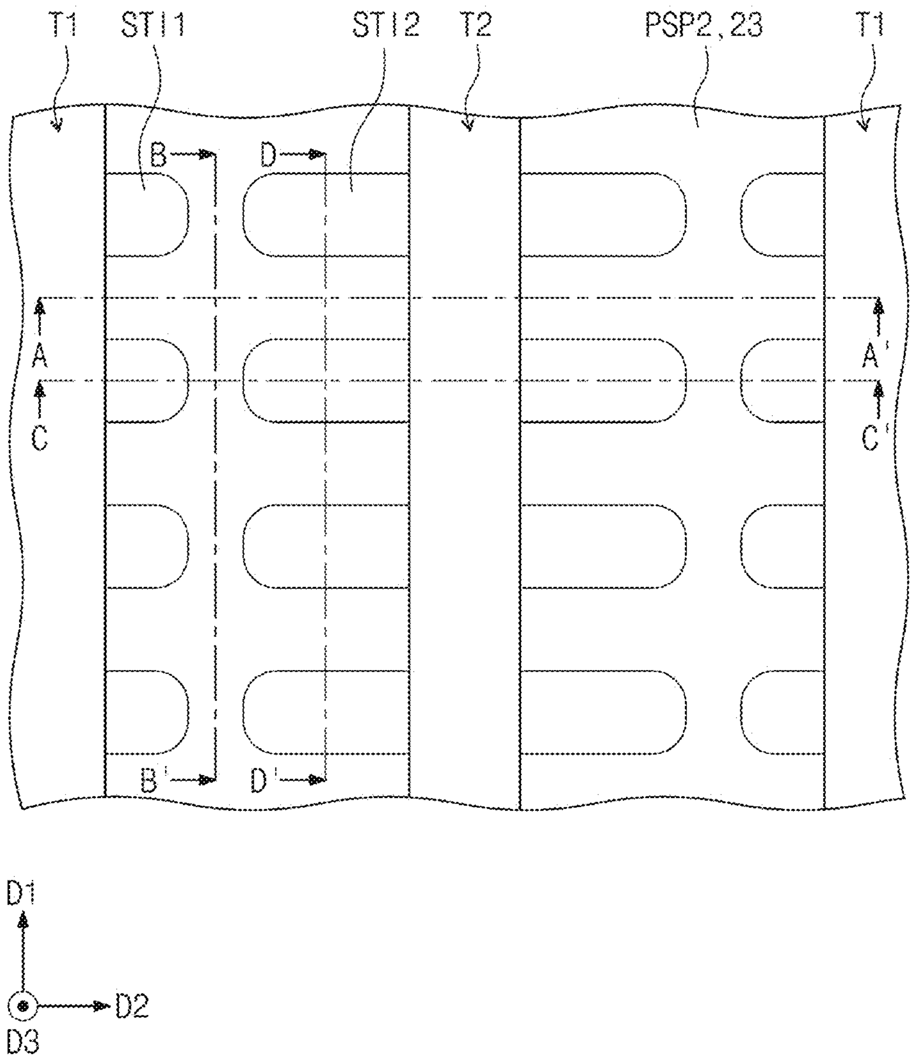
Figure 6B:
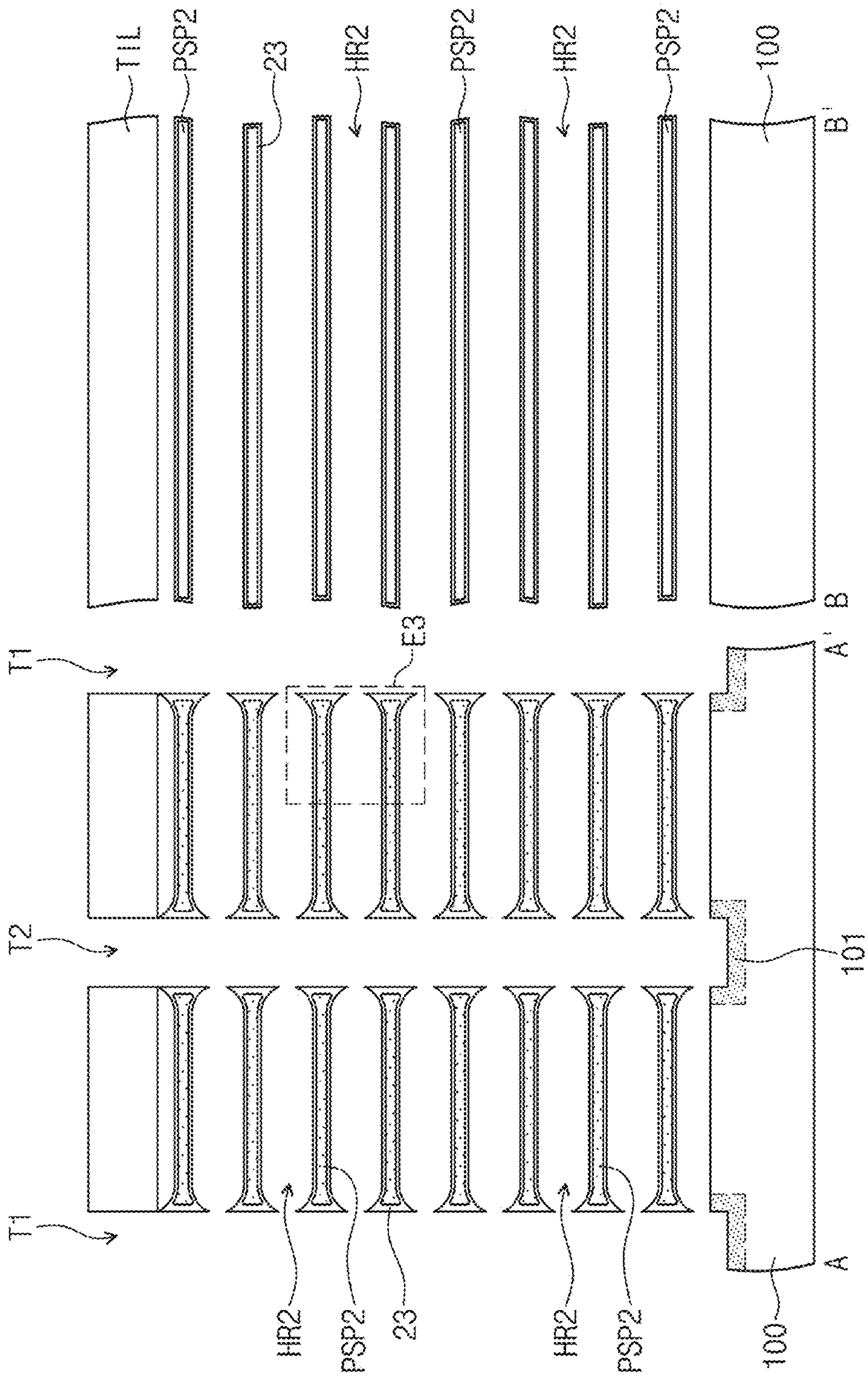
Figure 6C:
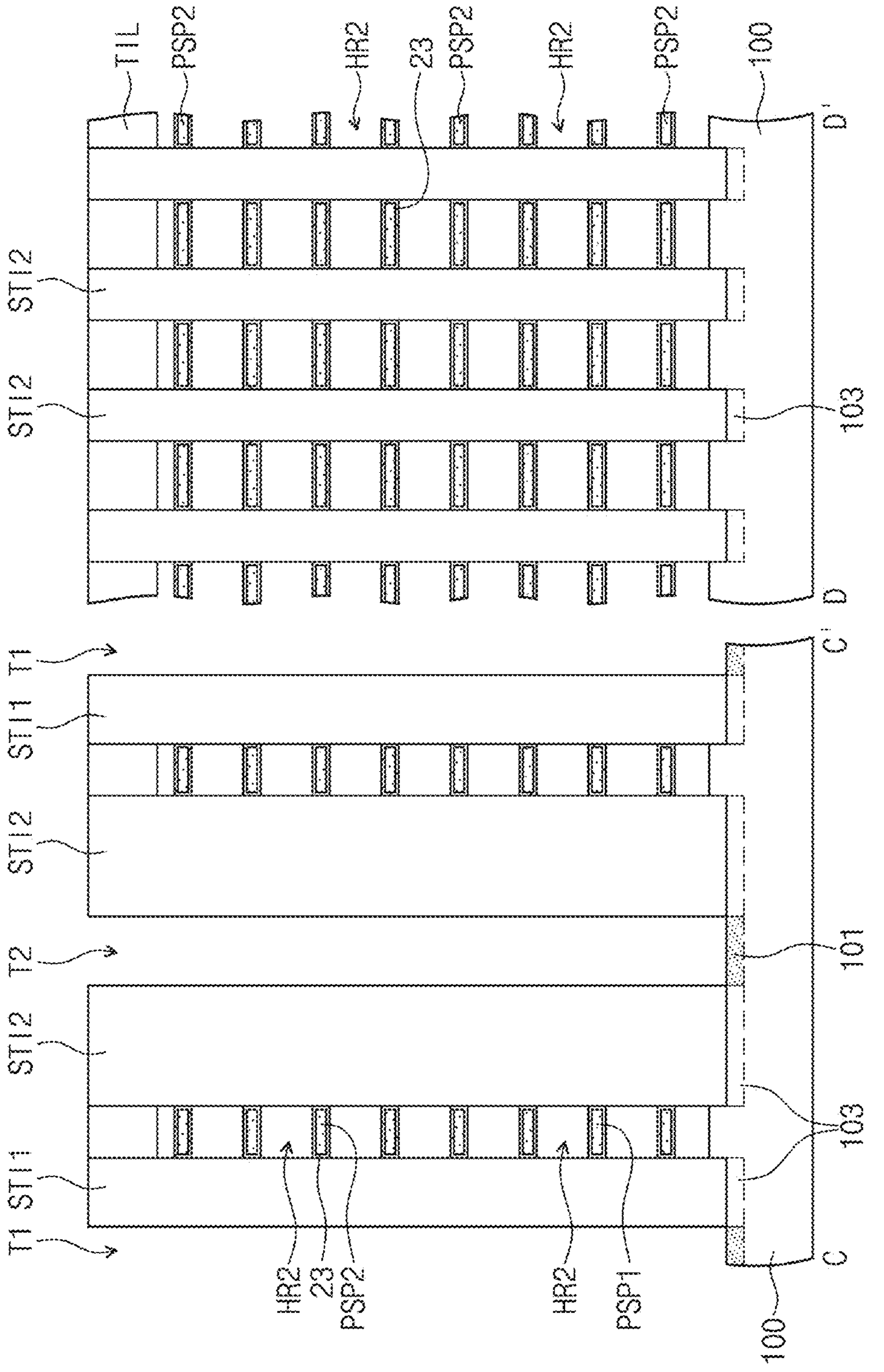
Figure 6D:
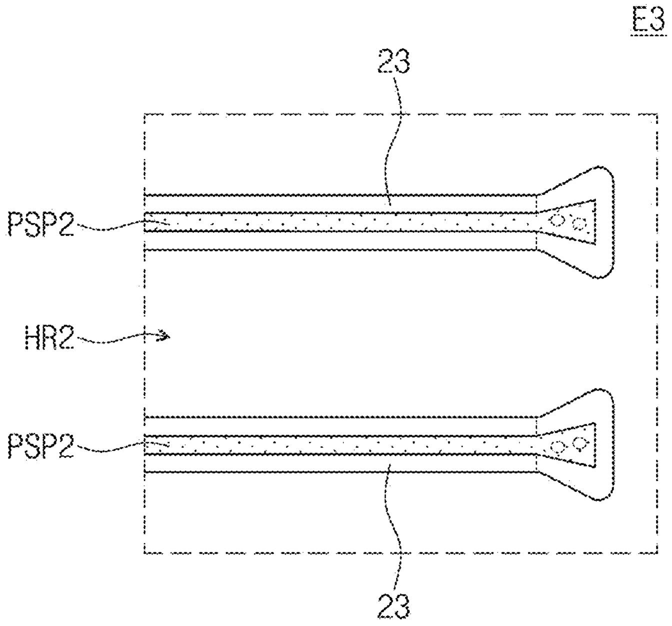

Referring to FIGS. 6A, 6B, and 6C, an oxidation process may be performed on the first preliminary semiconductor patterns PSP1, and thus, sacrificial oxide layers 23 may be formed along the exposed surfaces of the first preliminary semiconductor patterns PSP1.

As a result of the oxidation process, the sharp corner portions of the first preliminary semiconductor patterns PSP1 may be oxidized to form second preliminary semiconductor patterns PSP2 whose side portions are thinner than those of the first preliminary semiconductor pattern PSP1. In other words, the difference in thickness between the center and side portions of the second preliminary semiconductor patterns PSP2 may be reduced, compared with the first preliminary semiconductor patterns PSP1.

In an embodiment, when the sacrificial oxide layers 23 is formed, the sidewall impurity regions 21 may also be oxidized. In this case, in an embodiment, there are no impurities in the second preliminary semiconductor patterns PSP2, although the sacrificial oxide layers 23 contain the impurities.

Figure 7A:
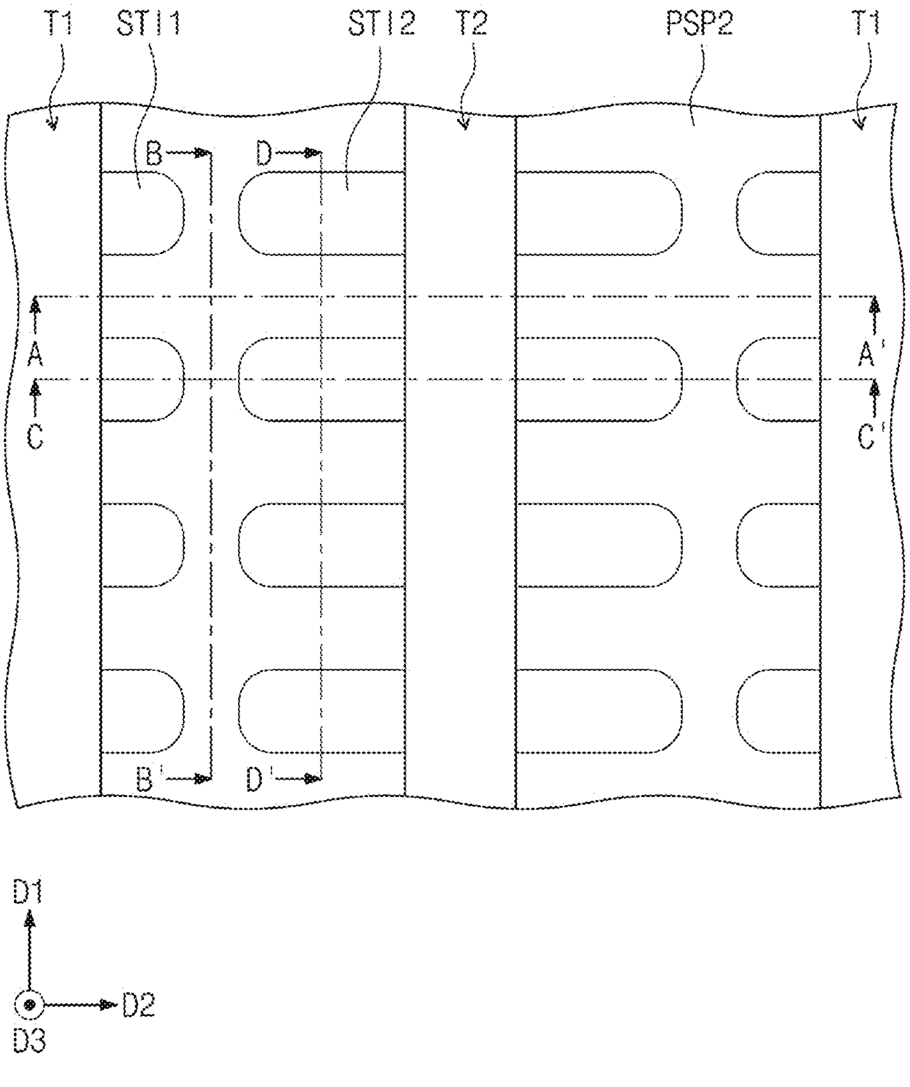
Figure 7B:
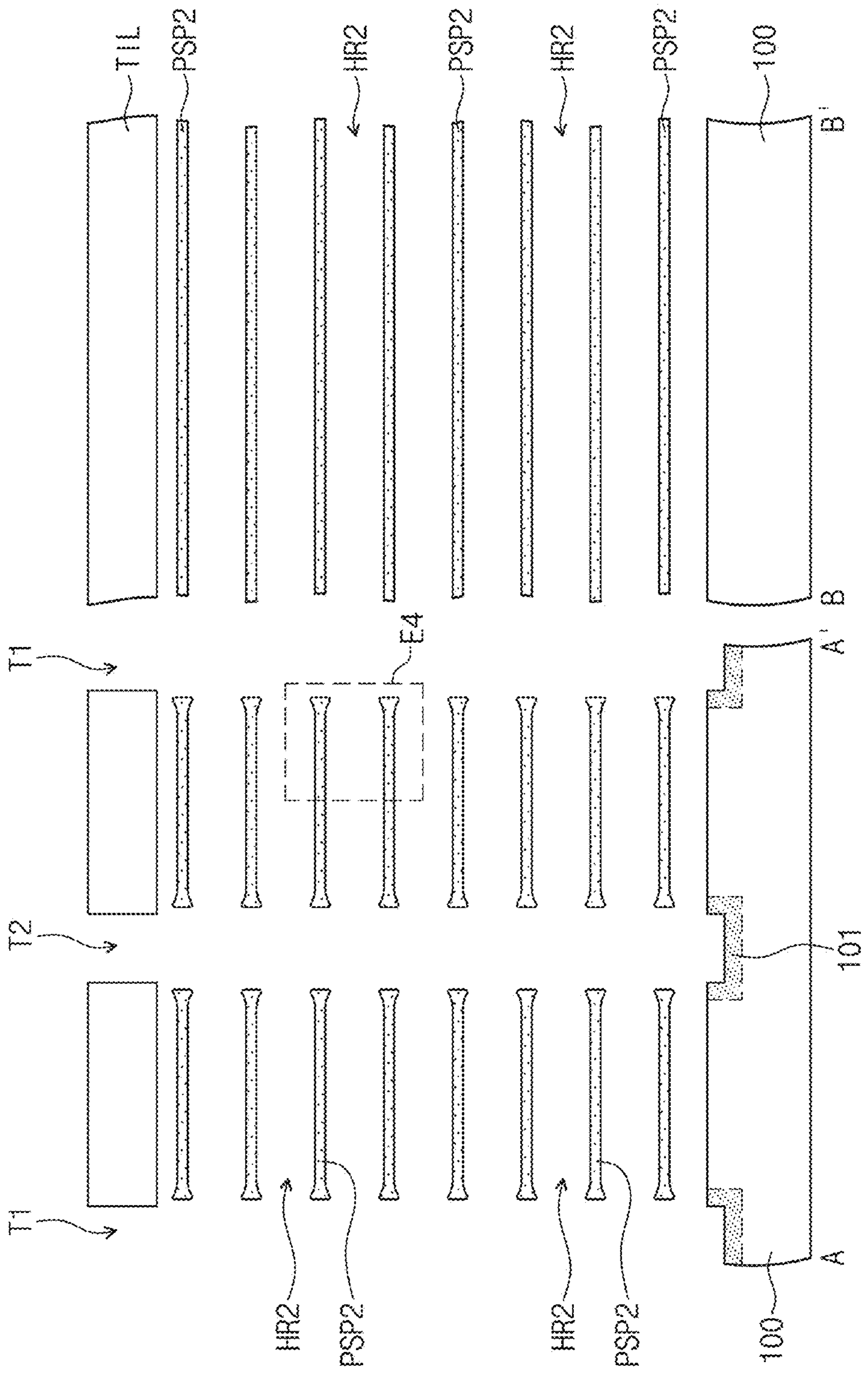
Figure 7C:
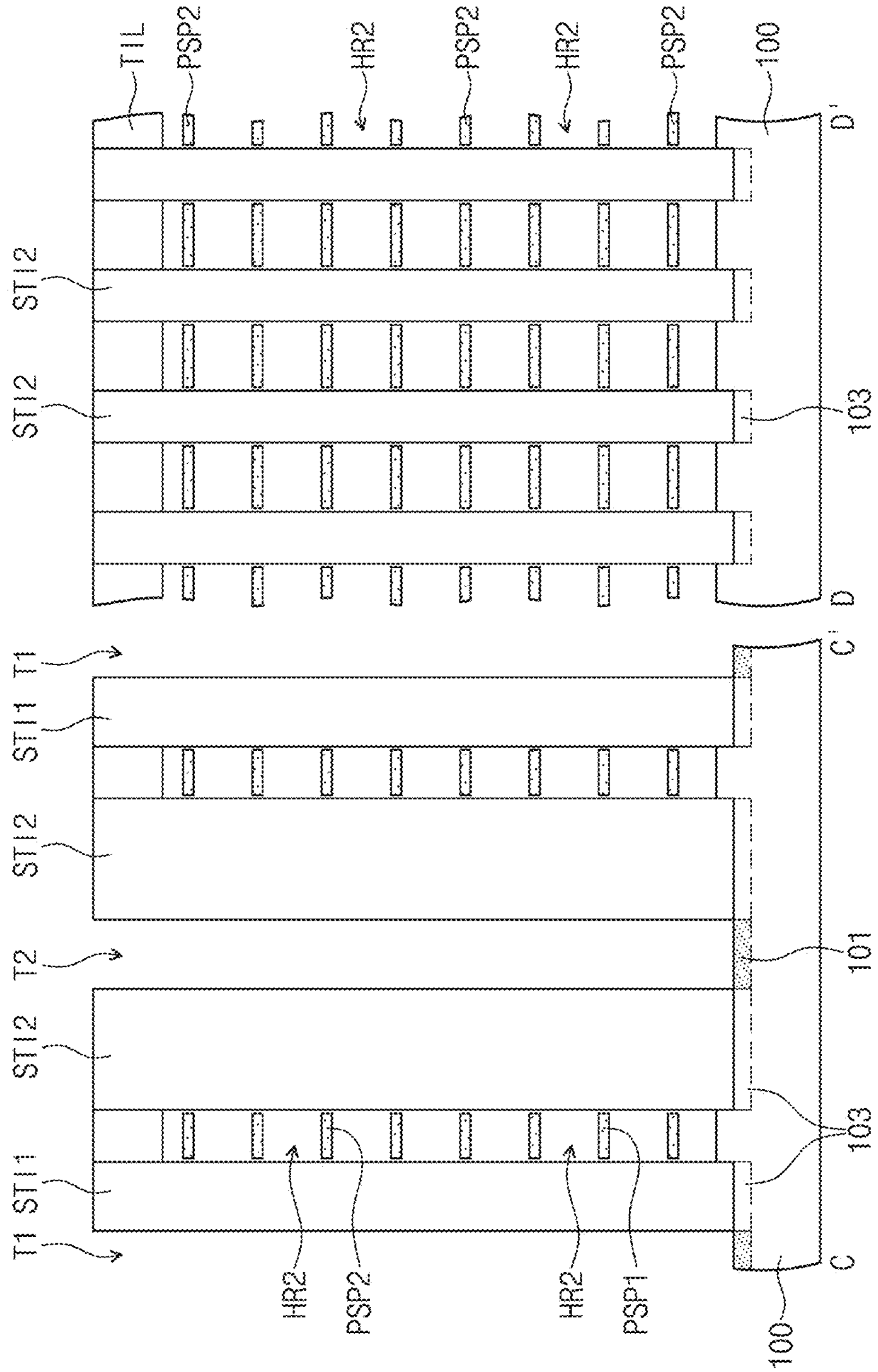

Next, referring to FIGS. 7A, 7B, and 7C, the sacrificial oxide layers 23 may be removed, and thus, surfaces of the second preliminary semiconductor patterns PSP2 may be exposed.

Figure 7D:
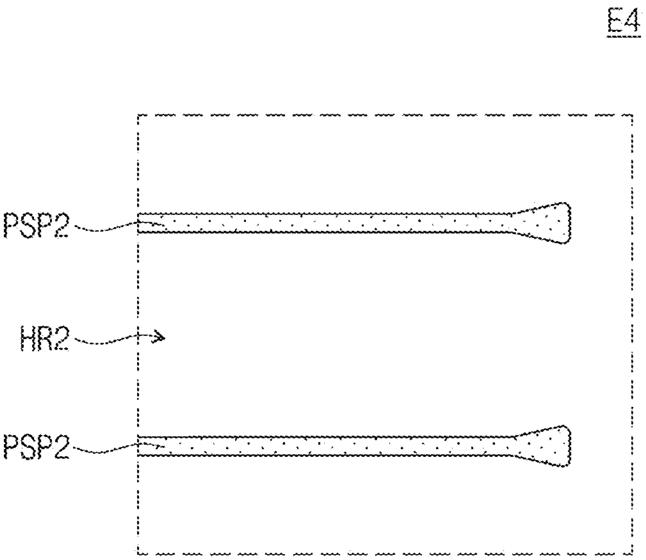

The second preliminary semiconductor patterns PSP2 may have substantially flat side surfaces, as shown in FIG. 7D, and corner portions between the side surface and the top and bottom surfaces may have a rounded profile. The side portion of the second preliminary semiconductor pattern PSP2 may have a thickness that is substantially equal to or larger than the center portion thereof. The second preliminary semiconductor patterns PSP2 may have a thickness ranging from about 2 nm to about 10 nm.

As a result of the removal of the sacrificial oxide layer 23, a distance between vertically adjacent patterns of the second preliminary semiconductor patterns PSP2 may be increased. In other words, the second horizontal regions HR2 may be vertically expanded.

Figure 8A:
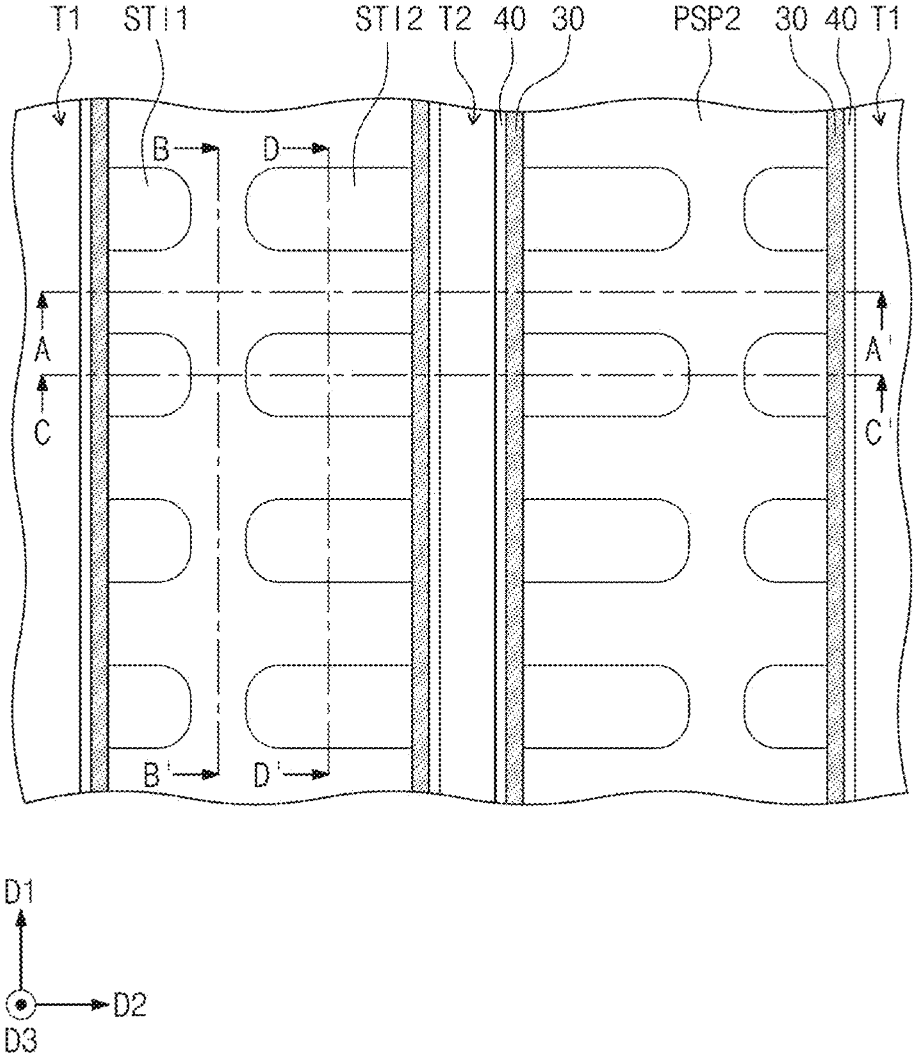
Figure 8B:
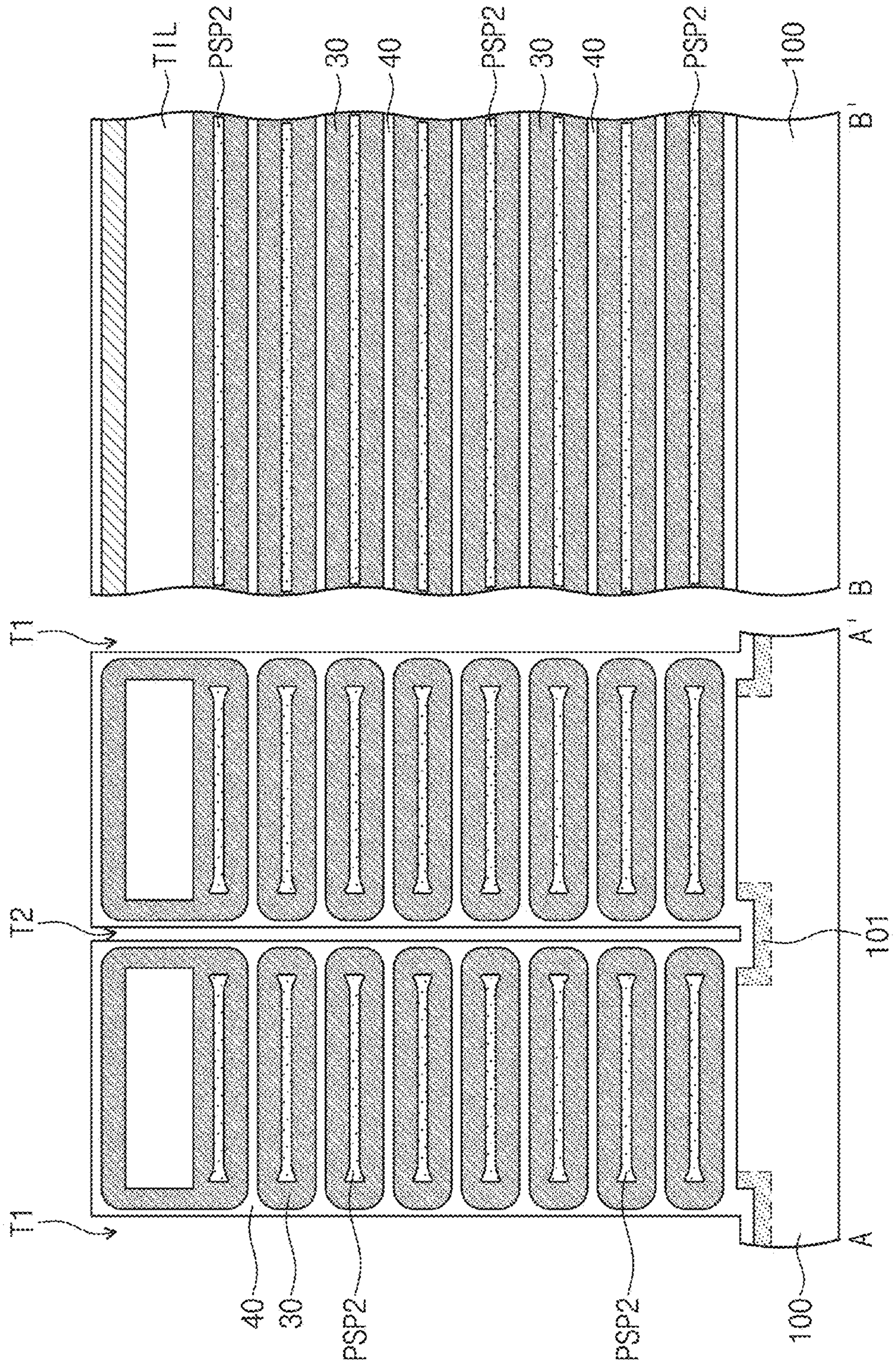
Figure 8C:
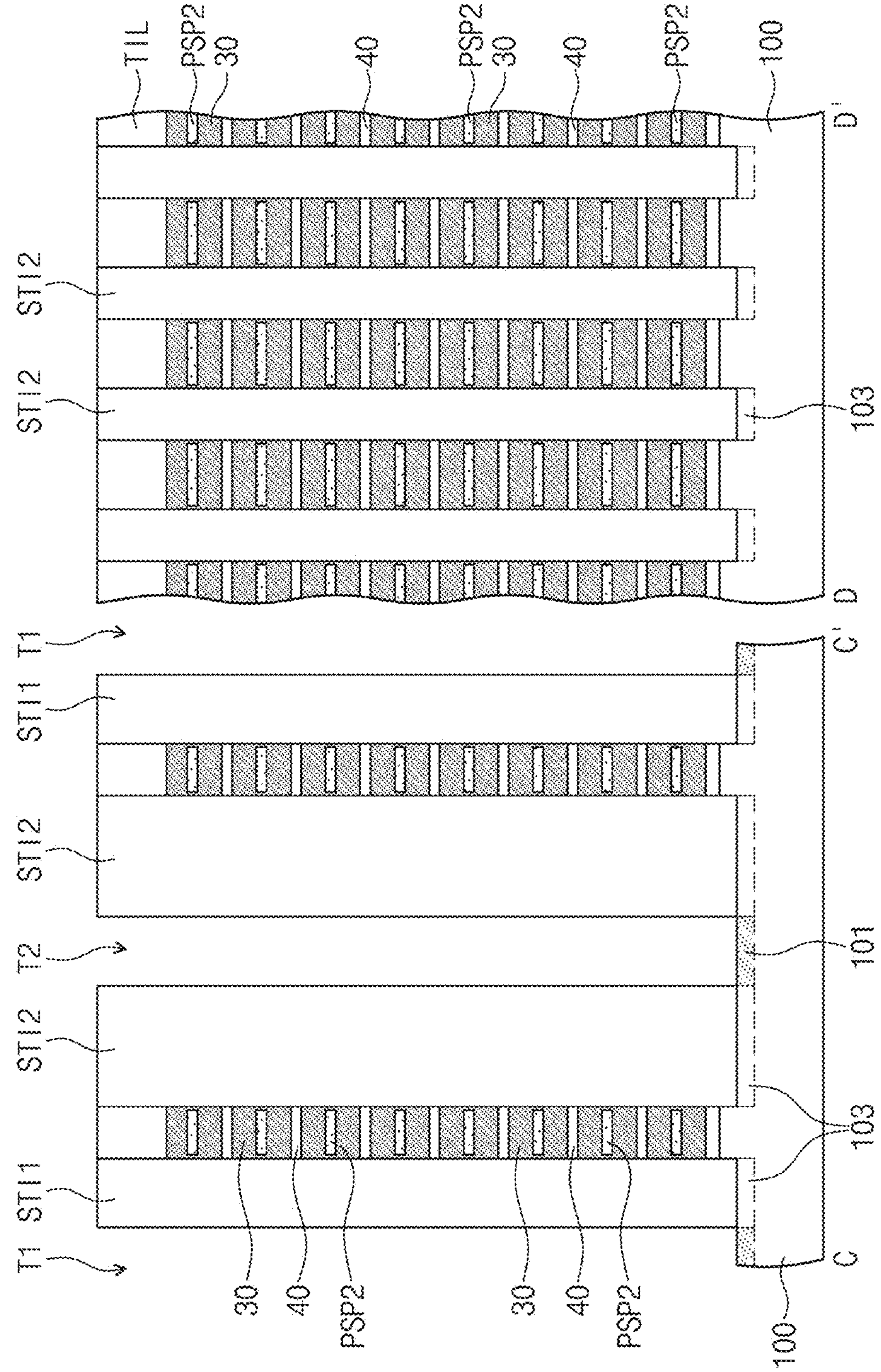

Referring to FIGS. 8A, 8B, and 8C, a second sacrificial layer 30 and an interlayer insulating layer 40 may be sequentially deposited on the surfaces of the second preliminary semiconductor patterns PSP2.

The second sacrificial layer 30 may be formed by depositing a material having an etch selectivity with respect to the semiconductor substrate 100 and the second preliminary semiconductor patterns PSP2. For example, the second sacrificial layer 30 may be formed of or include at least one of, for example, silicon oxide, silicon nitride, or silicon oxynitride. The second sacrificial layer 30 may be formed using an atomic layer deposition method or a chemical vapor deposition method.

The second sacrificial layer 30 may be deposited to surround each of the second preliminary semiconductor patterns PSP2. The second sacrificial layer 30 may be deposited to have a thickness that is smaller than about half of a vertical thickness of the second horizontal region HR2. For example, the deposition of the second sacrificial layer 30 may be performed to define gap regions between the vertically adjacent patterns of the second preliminary semiconductor patterns PSP2.

Thereafter, the interlayer insulating layer 40 may be formed on the second sacrificial layer 30 to fill the second horizontal regions HR2 provided with the second sacrificial layer 30. The interlayer insulating layer 40 may be formed of an insulating material having an etch selectivity with respect to the second sacrificial layer 30 and the semiconductor substrate 100. As an example, the interlayer insulating layer 40 may be a silicon oxide layer.

Figure 9A:
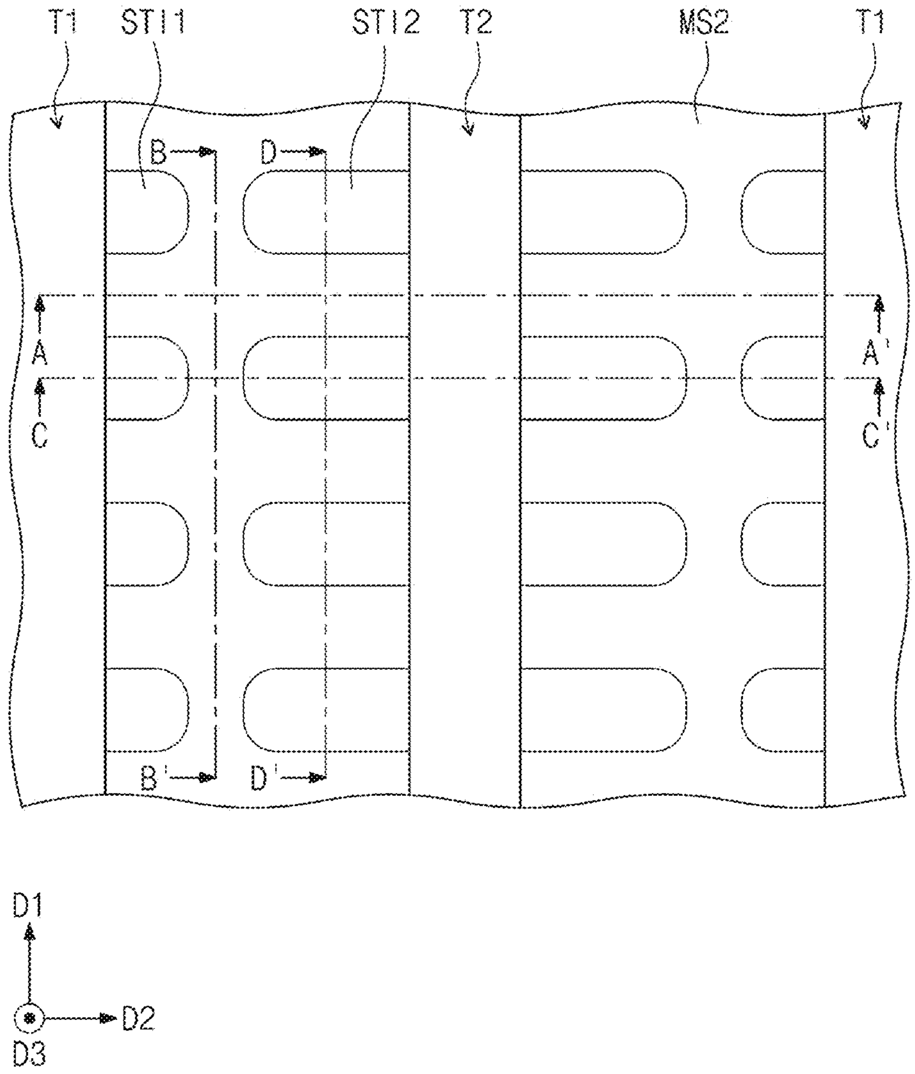
Figure 9B:
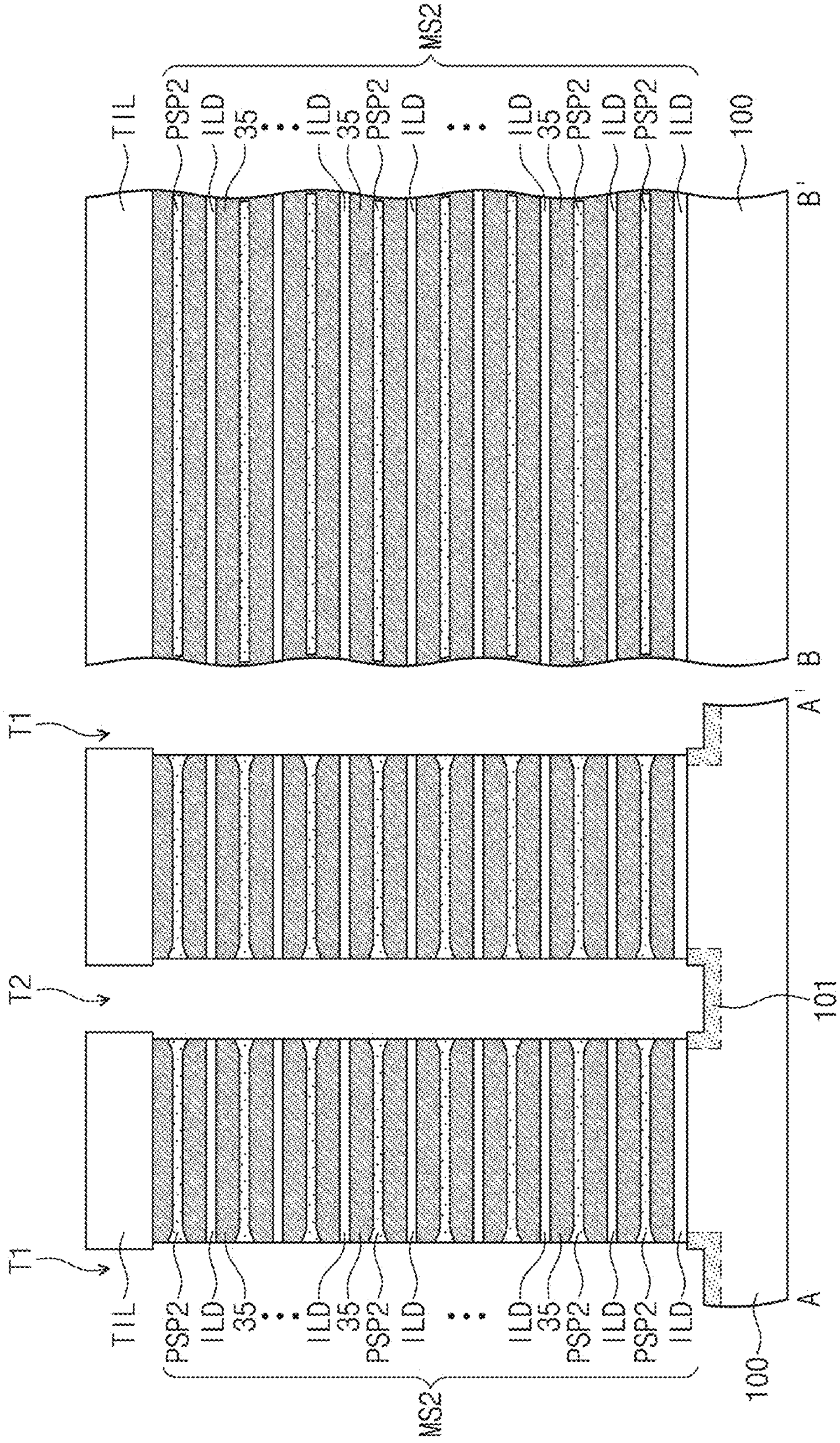
Figure 9C:
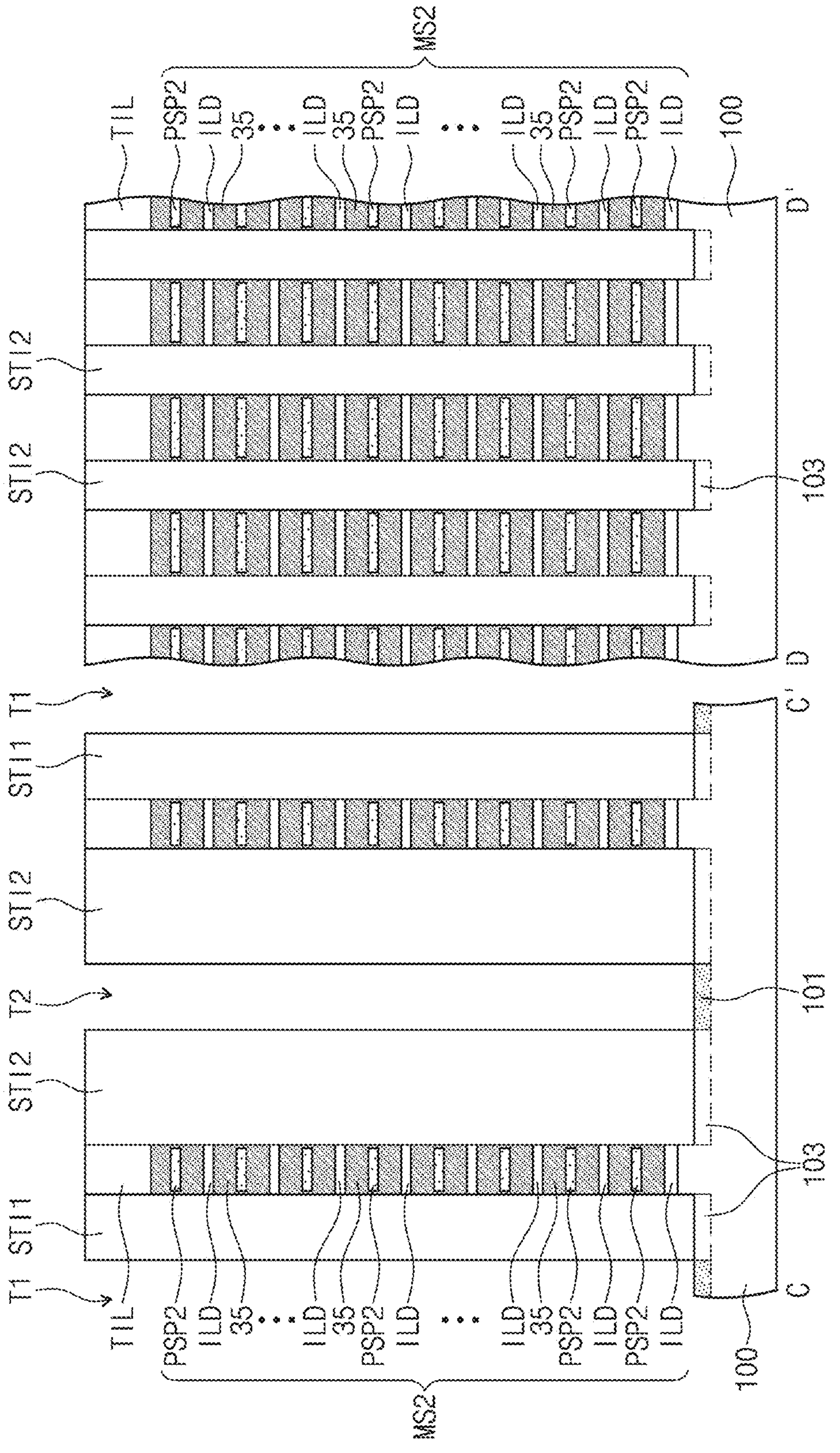

Next, referring to FIGS. 9A, 9B, and 9C, a second mold structure MS2 may be formed by sequentially performing a partial etching process on the interlayer insulating layer 40 and the second sacrificial layer 30.

For example, after the formation of the interlayer insulating layer 40, the interlayer insulating layer 40, which is exposed through the first and second trenches T1 and T2, may be . . . partially etched to form interlayer insulating patterns ILD. The formation of the interlayer insulating patterns ILD may include isotropically etching the interlayer insulating layer 40 until the second sacrificial layer 30 is exposed in the first and second trenches T1 and T2. In an embodiment, the interlayer insulating patterns ILD may have rounded side surfaces, as a result of the isotropic etching process. The interlayer insulating patterns ILD may be vertically spaced apart from each other.

After the formation of the interlayer insulating patterns ILD, the second sacrificial layer 30, which is exposed through the first and second trenches T1 and T2, may be partially etched to form second sacrificial patterns 35. The second sacrificial patterns 35 may be formed by isotropically etching the second sacrificial layer 30 until the second preliminary semiconductor patterns PSP2 are exposed. As a result of the isotropic etching process, the second sacrificial patterns 35 may have rounded side surfaces. The second sacrificial patterns 35 may be vertically spaced apart from each other, and the second preliminary semiconductor patterns PSP2 may be respectively disposed between pairs of the second sacrificial patterns 35, which are vertically adjacent to each other.

The second mold structure MS2, which is formed by the above-described method, may include the interlayer insulating patterns ILD, the second sacrificial patterns 35, and the second preliminary semiconductor patterns PSP2. That is, the second mold structure MS2 may include a plurality of stacks, each of which includes the second preliminary semiconductor pattern PSP2, the second sacrificial pattern 35, the interlayer insulating pattern ILD, and the second sacrificial pattern 35 that are sequentially stacked.

Figure 10A:
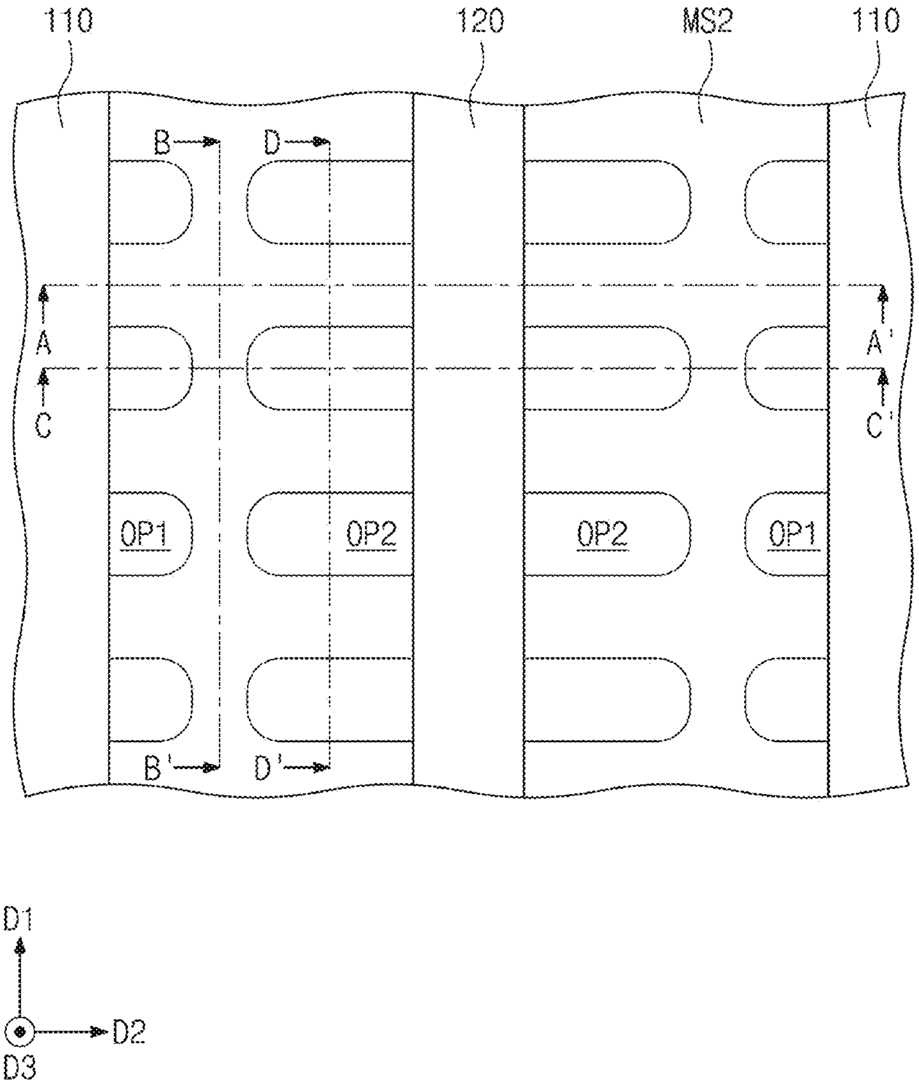
Figure 10B:
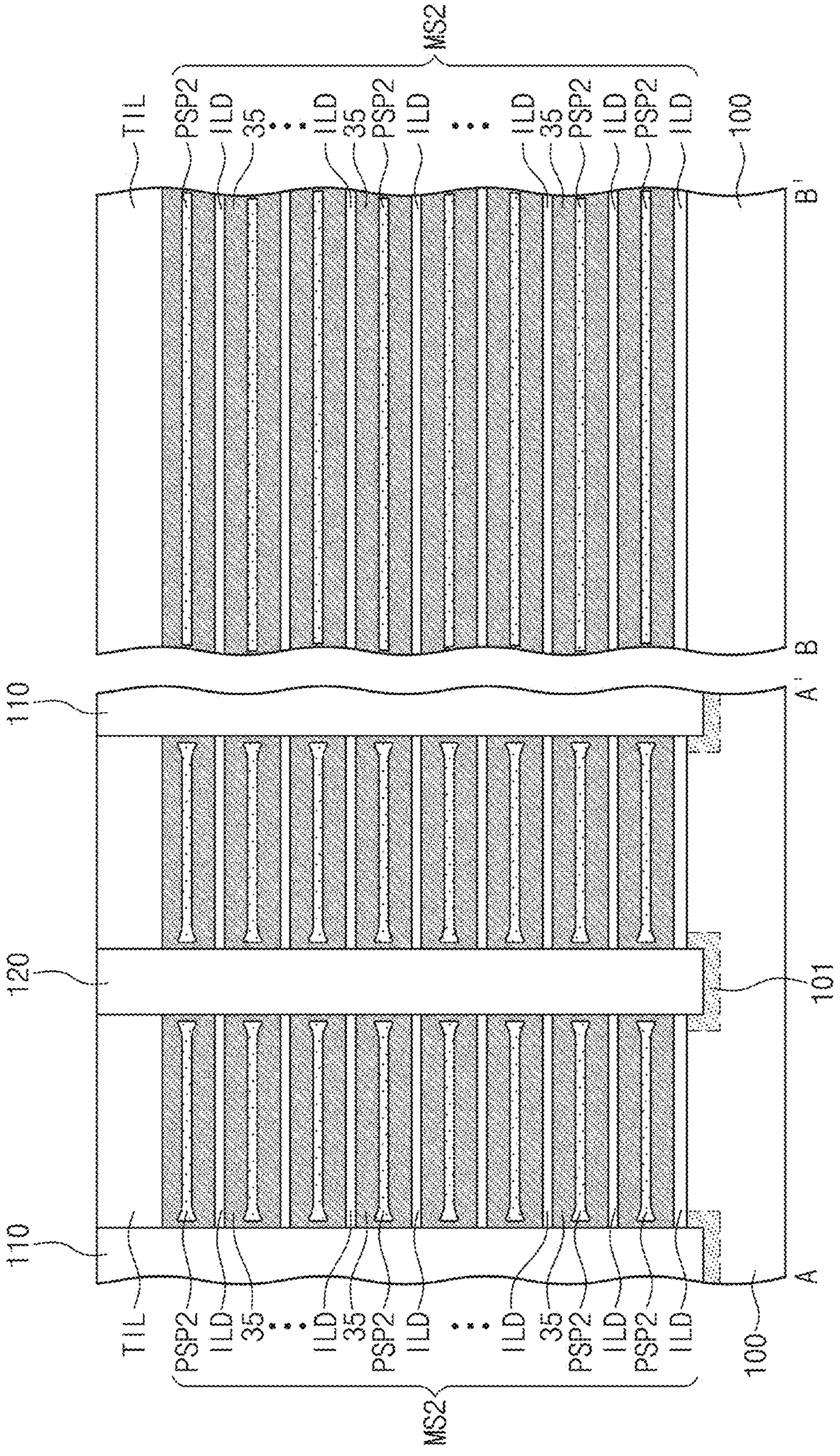
Figure 10C:
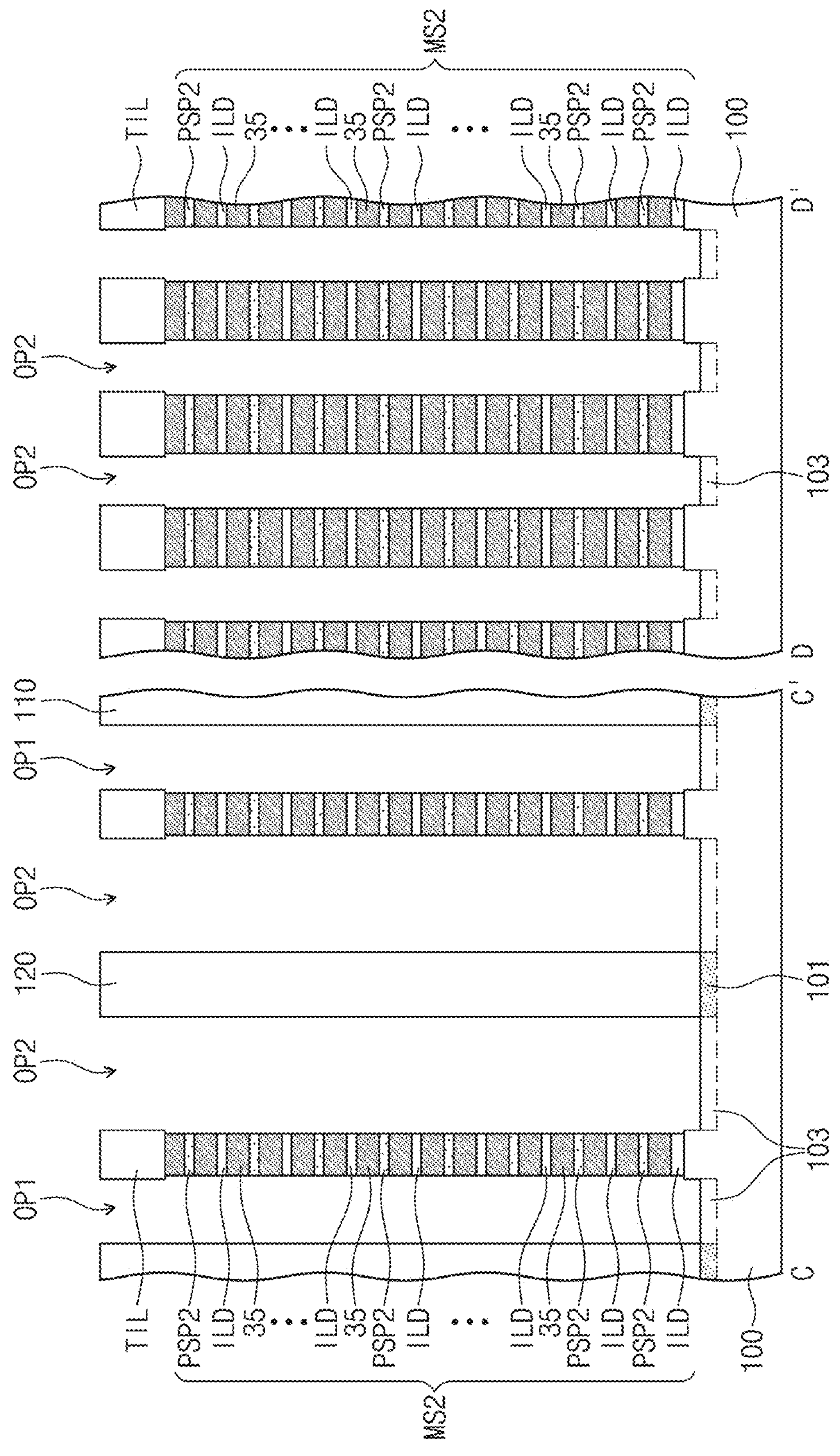

Referring to FIGS. 10A, 10B, and 10C, first and second gapfill insulating patterns 110 and 120 may be formed to fill the first and second trenches T1 and T2, after the formation of the second mold structure MS2. The first and second gapfill insulating patterns 110 and 120 may cover the substrate impurity layers 101.

The formation of the first and second gapfill insulating patterns 110 and 120 may include forming an insulating gapfill layer to fill the first and second trenches T1 and T2 and planarizing the insulating gapfill layer to expose the top surface of the upper insulating layer TIL. The planarization of the insulating gapfill layer may be performed using a planarization technology such as, for example, a chemical-mechanical polishing technology or an etch-back technology.

The first and second gapfill insulating patterns 110 and 120 may be formed of or include an insulating material having an etch selectivity with respect to the first and second insulating separation patterns STI1 and STI2. For example, the first and second gapfill insulating patterns 110 and 120 may be formed of or include at least one of, for example, silicon oxide, silicon nitride, or silicon oxynitride. Each of the first and second gapfill insulating patterns 110 and 120 may have a single- or multi-layered structure.

After the formation of the first and second gapfill insulating patterns 110 and 120, the first and second openings OP1 and OP2 may be formed again by removing the first and second insulating separation patterns STI1 and STI2. The first and second openings OP1 and OP2 may expose the side surfaces of the second preliminary semiconductor patterns PSP2, the side surfaces of the second sacrificial patterns 35, the side surfaces of the interlayer insulating patterns ILD, and portions of the top surface of the semiconductor substrate 100.

The removal of the first and second insulating separation patterns STI1 and STI2 may include performing an etching process using an etch recipe which is chosen to have an etch selectivity with respect to the semiconductor substrate 100, the second sacrificial patterns 35, the second preliminary semiconductor patterns PSP2, and the first and second gapfill insulating patterns 110 and 120. As an example, in a case in which the first and second insulating separation patterns STI1 and STI2 include silicon oxide, a dry etching process, a chemical etching process, or a wet etching process may be performed on the first and second insulating separation patterns STI1 and STI2. The wet etching process performed on the first and second insulating separation patterns STI1 and STI2 may be performed using, for example, buffered oxide etchant (BOE), hydrogen fluoride (HF), or the like. The dry etching process on the first and second insulating separation patterns STI1 and STI2 may be performed using, for example, $CF_4$, $NH_3$, $CHF_3$, $C_2F_6$, $BF_3$, or the like.

Figure 11A:
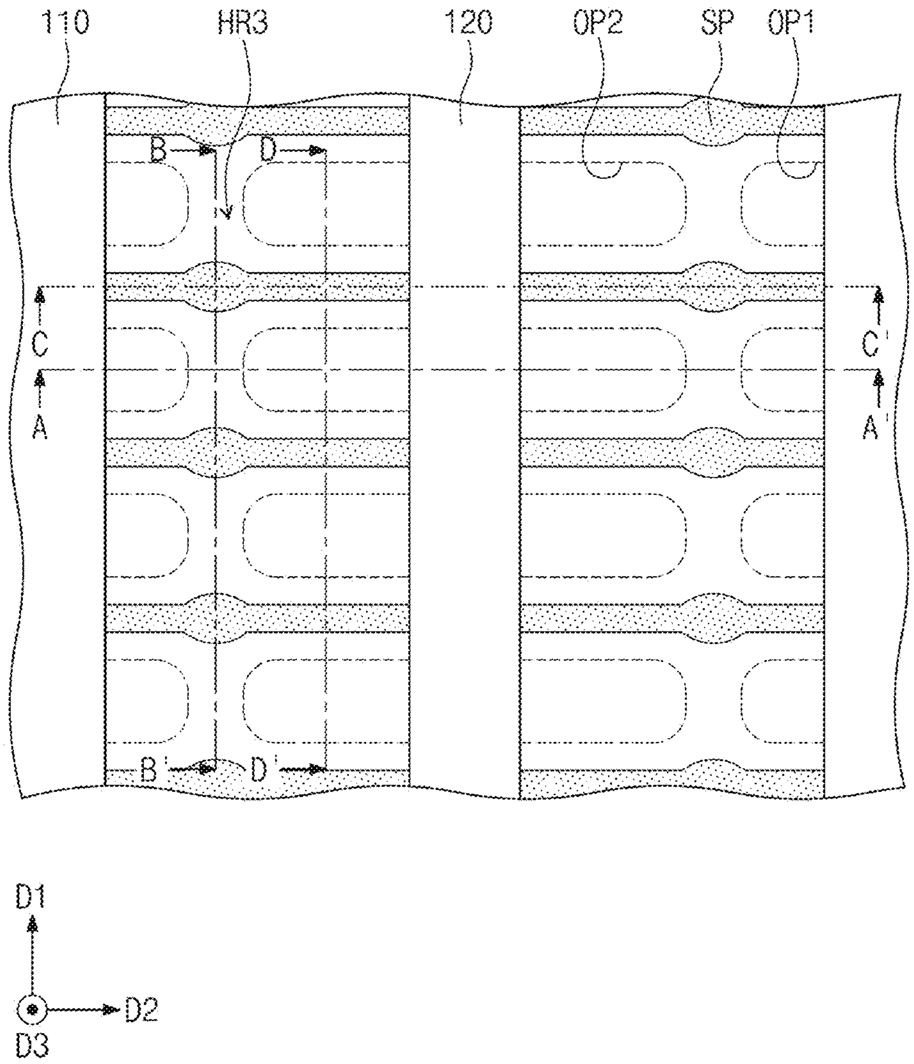
Figure 11B:
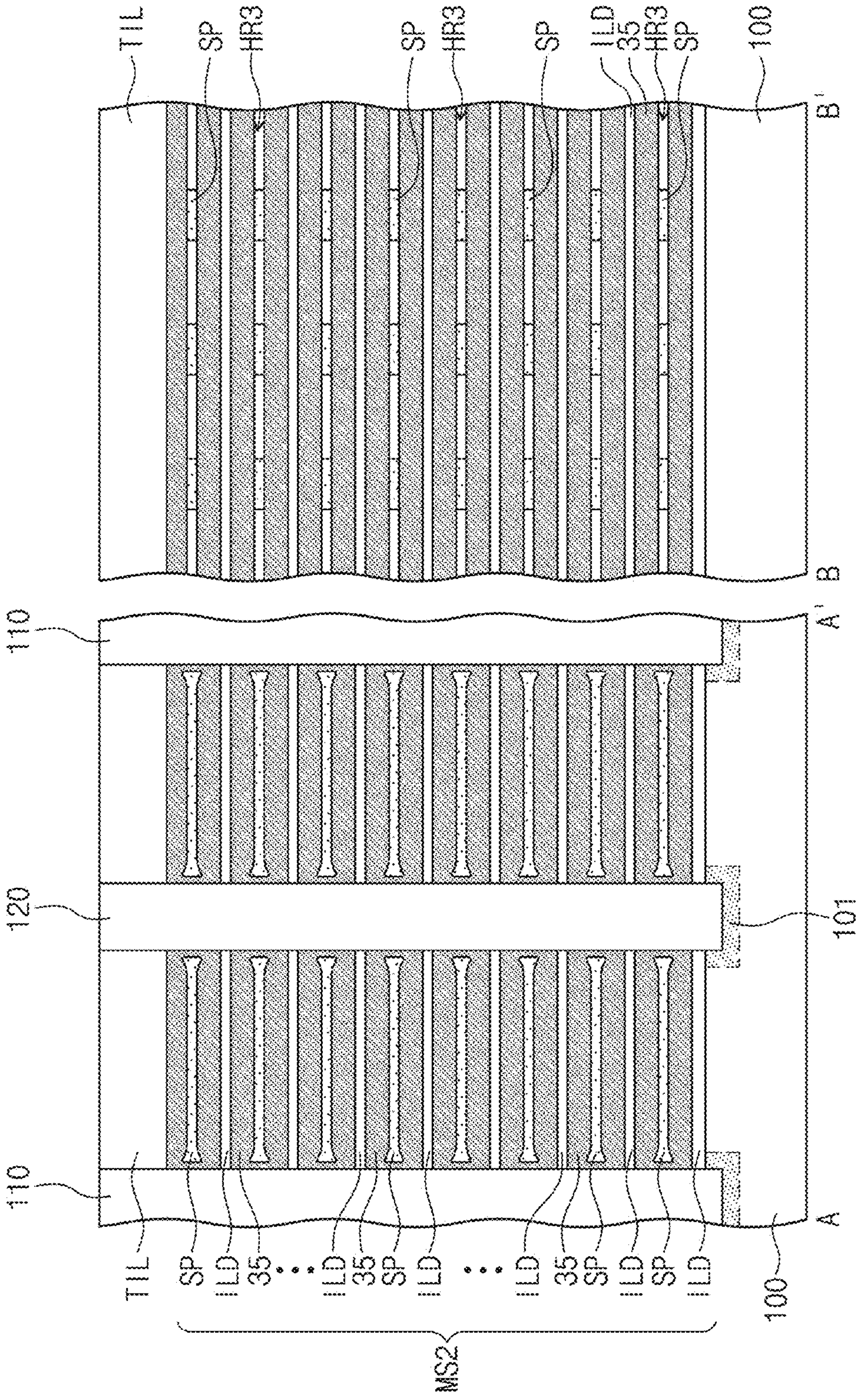
Figure 11C:
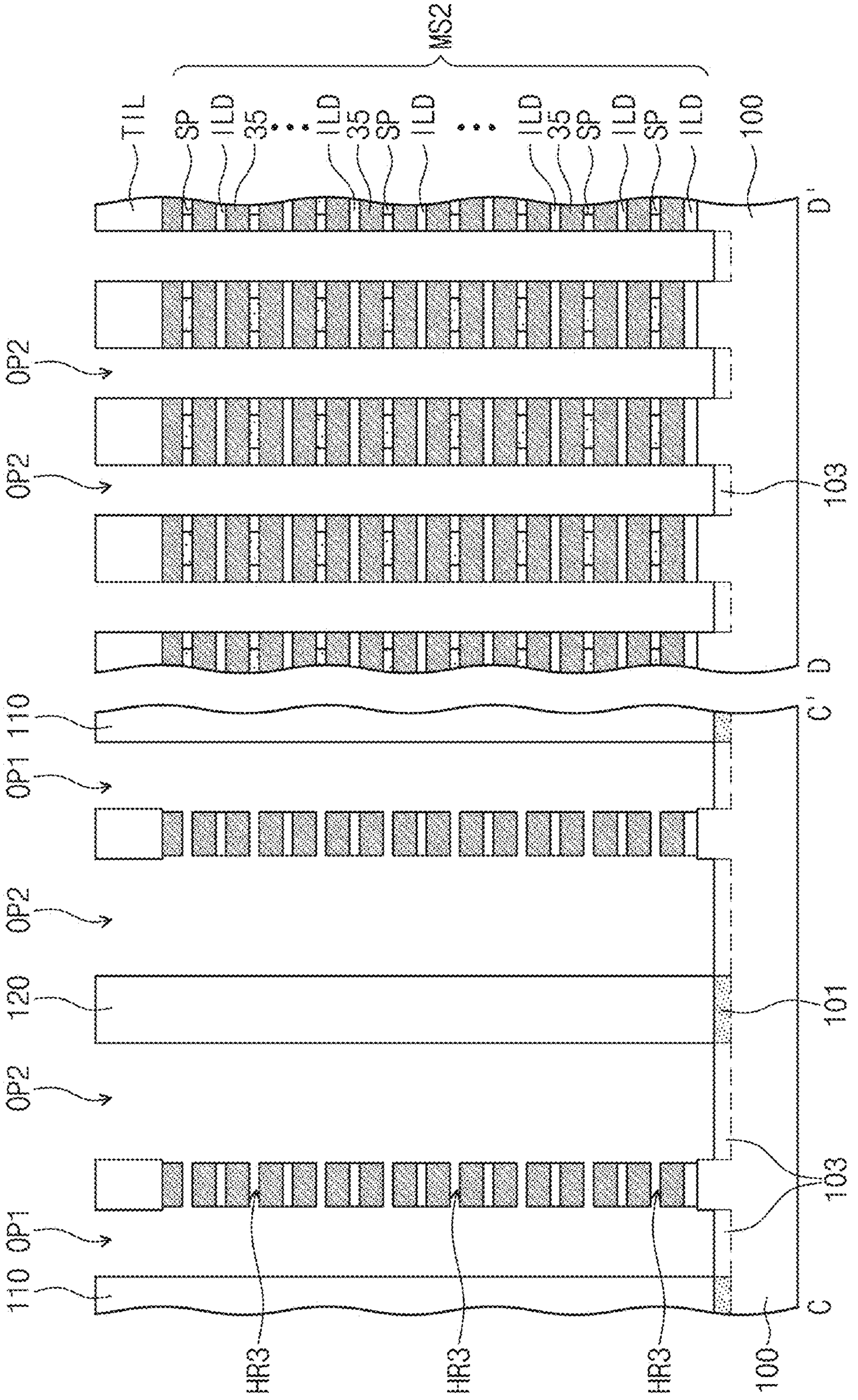

Referring to FIGS. 11A, 11B, and 11C, an etching process may be performed on portions of the second preliminary semiconductor patterns PSP2, which are exposed through the first and second openings OP1 and OP2. Accordingly, semiconductor patterns SP, which are spaced apart from each other in the first direction D1, may be formed.

The formation of the semiconductor patterns SP may include isotropically etching the second preliminary semiconductor patterns PSP2, which are exposed through the first and second openings OP1 and OP2. For example, the second preliminary semiconductor patterns PSP2 may be laterally etched in the first and second directions D1 and D2 by an etchant, which is supplied through the first and second openings OP1 and OP2. Since a distance between the first openings OP1 and a distance between the second openings OP2 is larger than a distance between the first and second openings OP1 and OP2, the second preliminary semiconductor patterns PSP2 may be etched to form the semiconductor patterns SP, which are spaced apart from each other in the first direction D1. As a result of the isotropic etching process, a width of each of the semiconductor patterns SP in the first direction D1 may be larger at its center portion than at its side portion. For example, in an embodiment, a width of each of the semiconductor patterns SP in the first direction D1 may be larger at a channel region of the semiconductor patterns SP than at source/drain regions of the semiconductor patterns SP.

As a result of the above-described process to form the semiconductor patterns SP, third horizontal regions HR3 exposing the side surfaces of the semiconductor patterns SP may be formed between the second sacrificial patterns 35. The third horizontal regions HR3 may correspond to empty regions that are formed by etching the second preliminary semiconductor patterns PSP2.

Figure 12A:
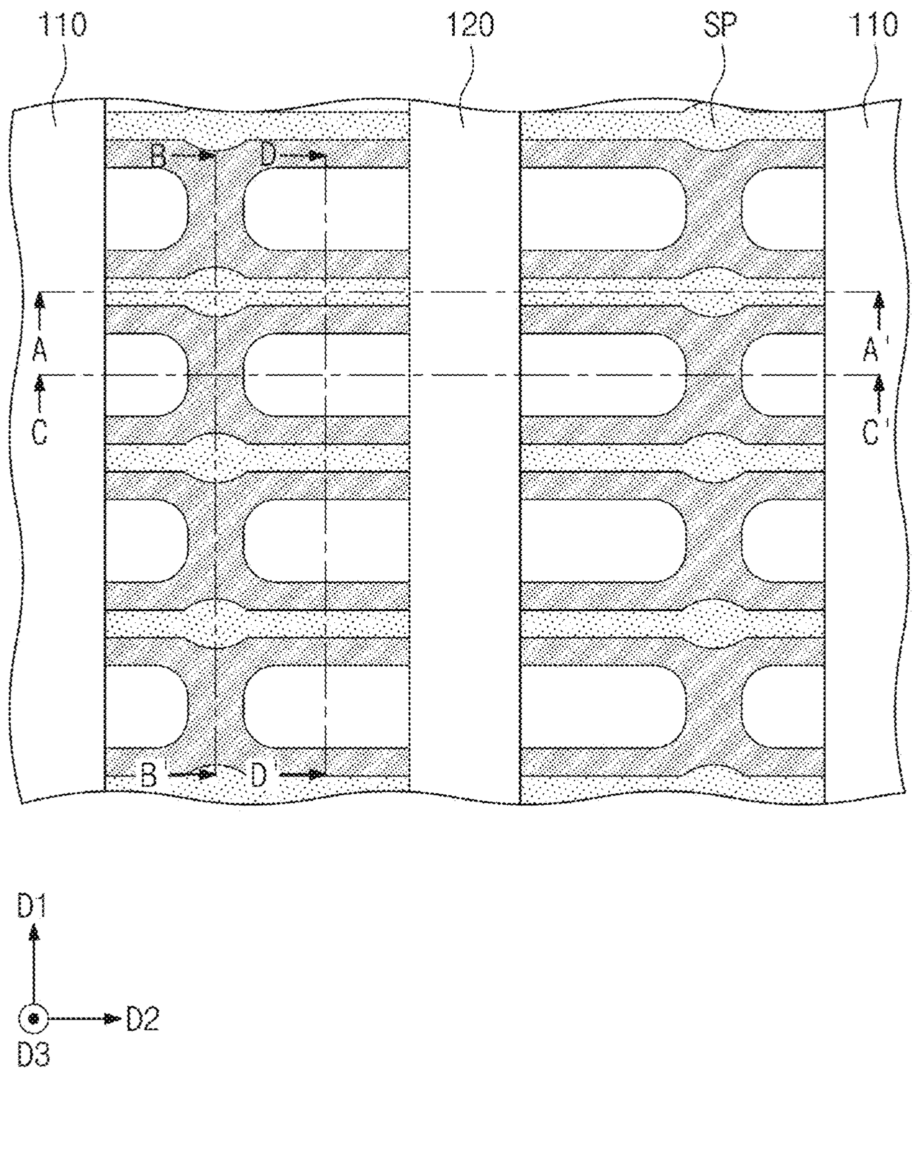
Figure 12B:
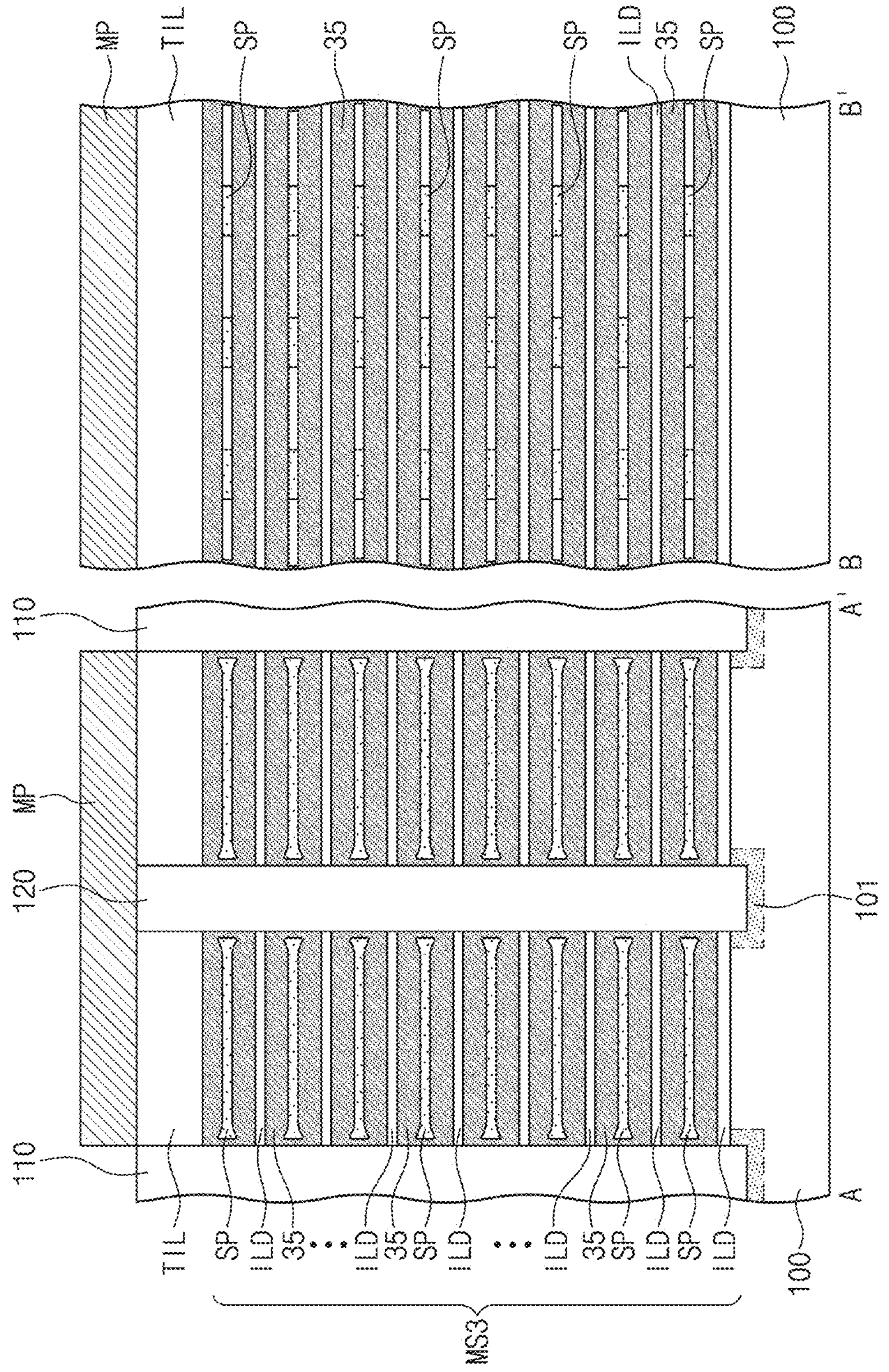
Figure 12C:
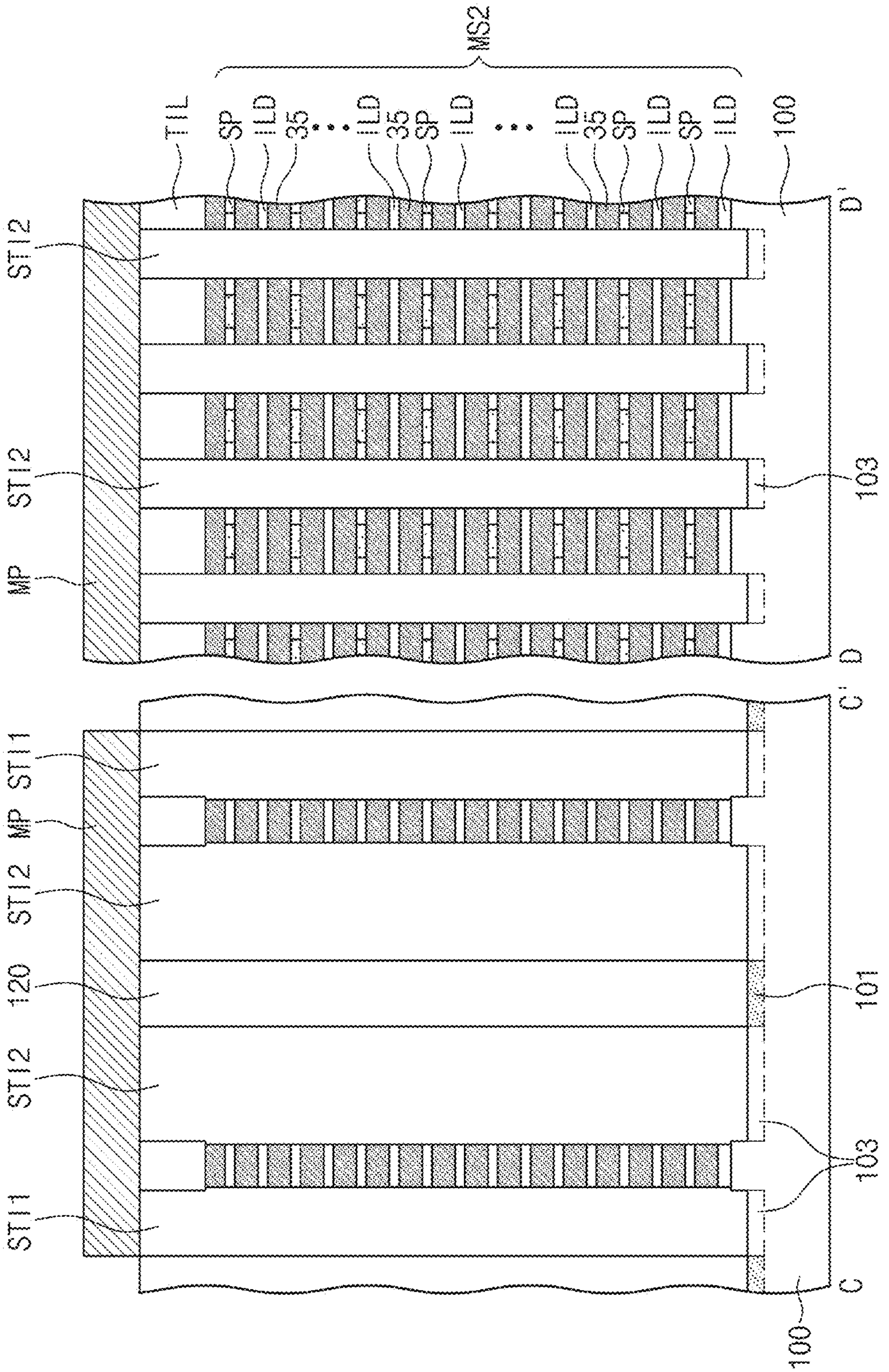

Referring to FIGS. 12A, 12B, and 12C, the first and second insulating separation patterns STI1 and STI2 may be formed again by filling the first and second openings OP1 and OP2 with an insulating material, after the formation of the semiconductor patterns SP.

The first and second insulating separation patterns STI1 and STI2 may be formed of an insulating material having an etch selectivity with respect to the second sacrificial patterns 35 and the interlayer insulating patterns ILD. The first and second insulating separation patterns STI1 and STI2 may be formed of or include at least one of, for example, silicon oxide, silicon oxynitride, or silicon nitride. The first and second insulating separation patterns STI1 and STI2 may have a single- or multi-layered structure.

The formation of the first and second insulating separation patterns STI1 and STI2 may include forming an insulating layer to fill the first and second openings OP1 and OP2 and planarizing the insulating layer to expose the top surface of the upper insulating layer TIL. The planarization of the insulating layer may be performed using a planarization technology such as, for example, a chemical-mechanical polishing technology or an etch-back technology. The insulating layer filling the first and second openings OP1 and OP2 may be formed using, for example, an atomic layer deposition (ALD) process, a chemical vapor deposition (CVD) process, or a spin-on-glass (SOG) process.

During the formation of the first and second insulating separation patterns STI1 and STI2, the third horizontal regions HR3 may be filled with the insulating material or may be left as empty regions.

After the re-formation of the first and second insulating separation patterns STI1 and STI2, a mask pattern MP may be formed on the upper insulating layer TIL to expose the first gapfill insulating patterns 110.

Figure 13A:
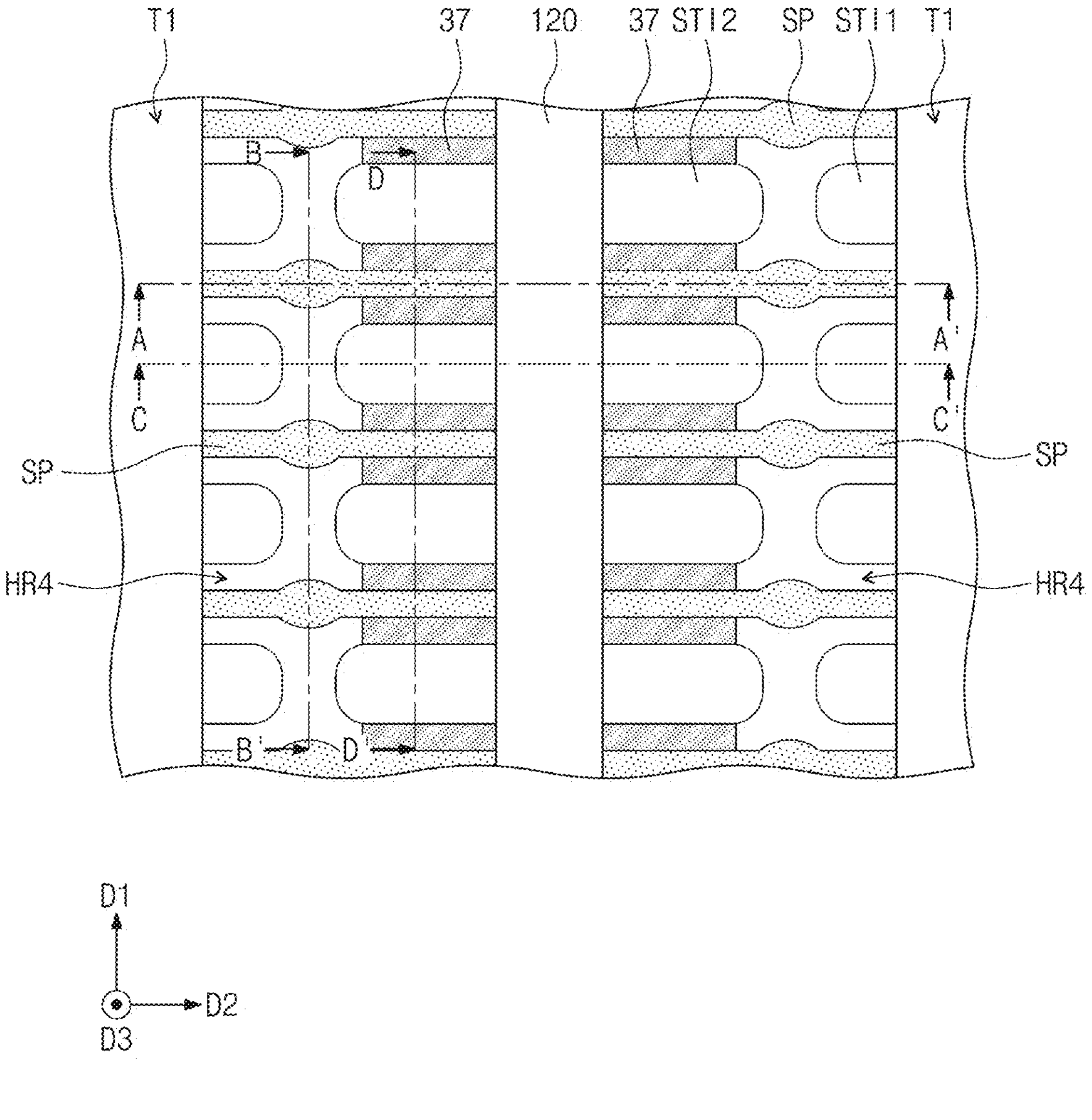
Figure 13B:
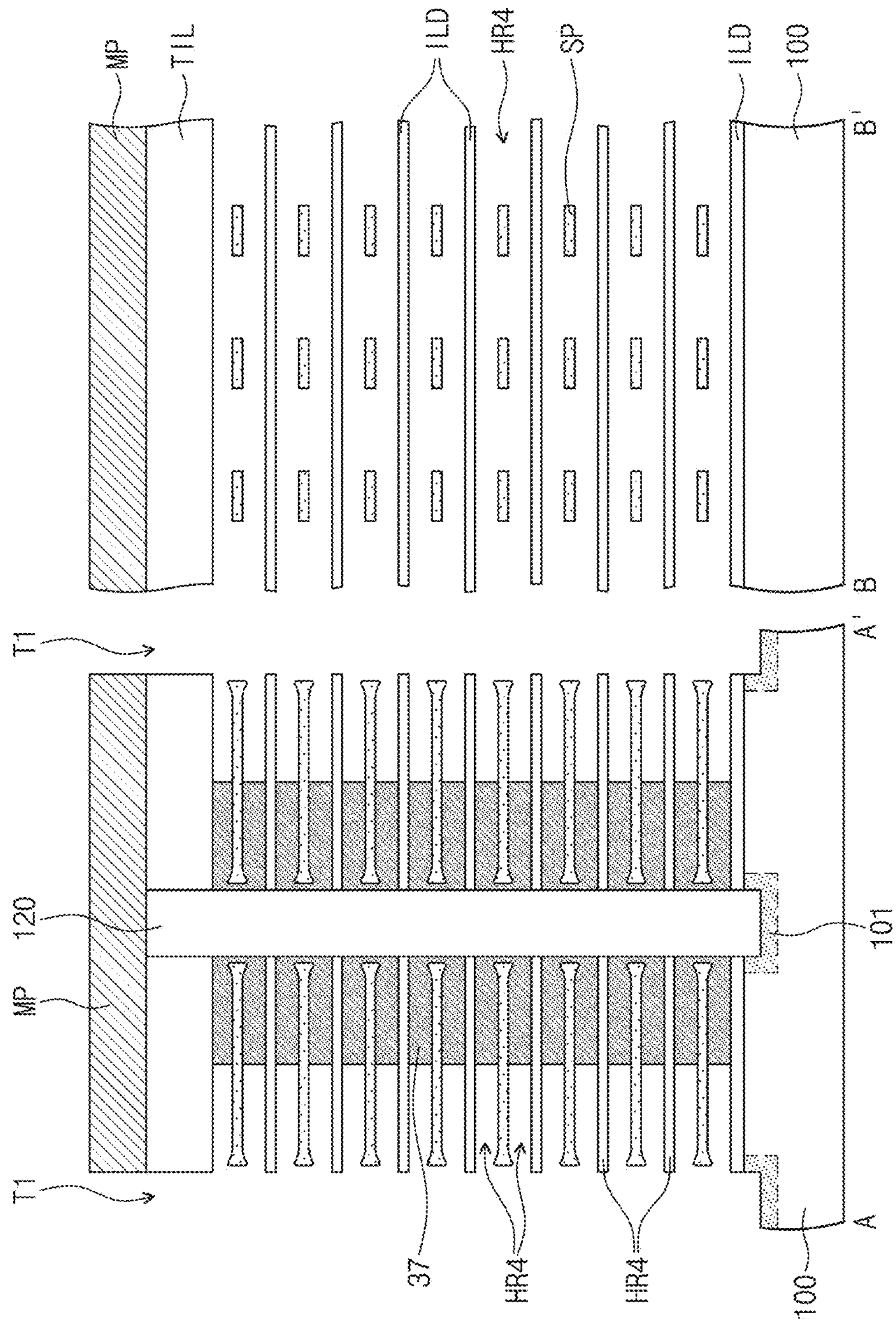
Figure 13C:
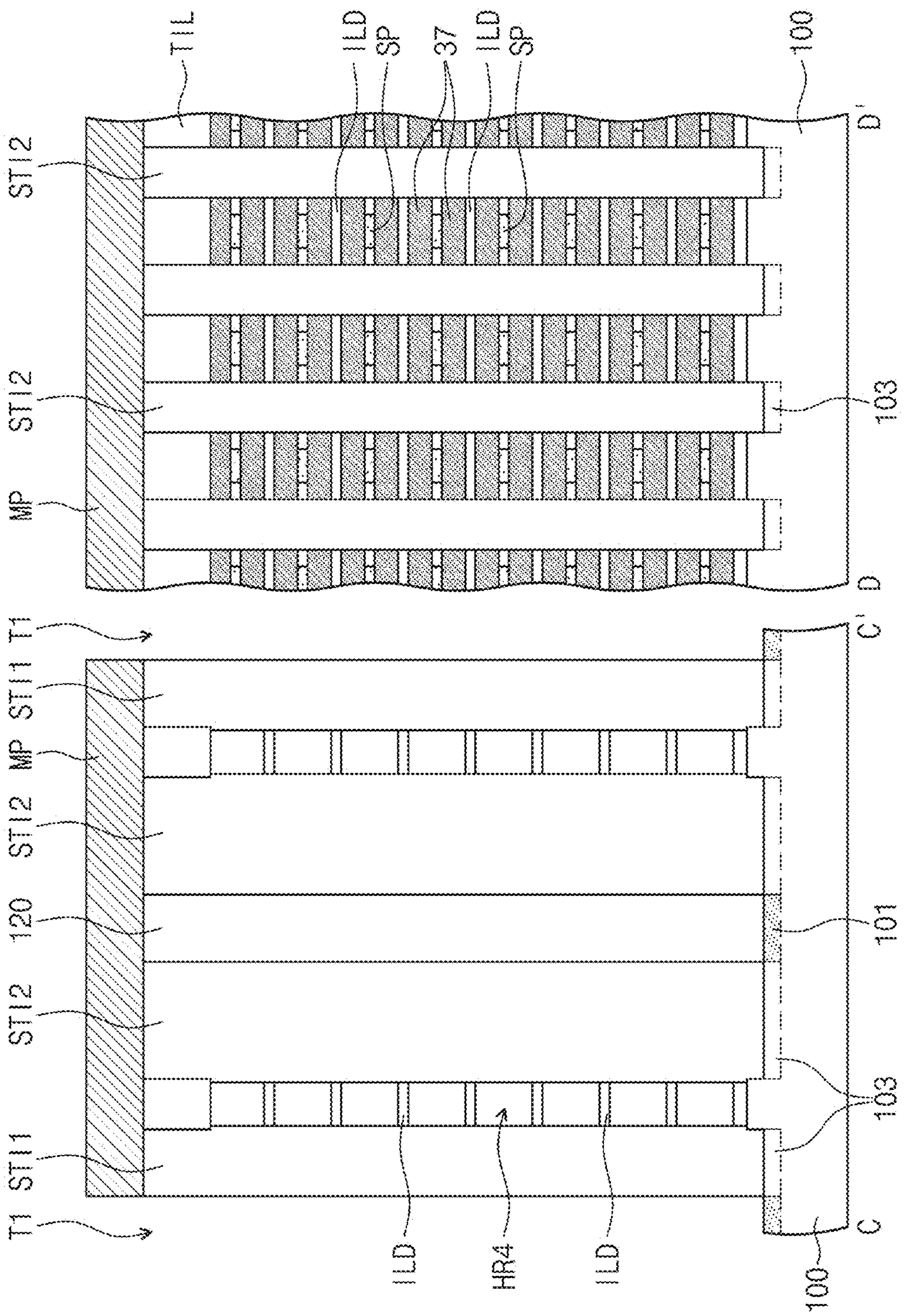

Referring to FIGS. 13A, 13B, and 13C, the first trenches T1 exposing the semiconductor substrate 100 may be formed again by etching the first gapfill insulating patterns 110 using the mask pattern MP as an etch mask. The first trenches T1 may be formed to expose the side surfaces of the semiconductor patterns SP, the side surfaces of the second sacrificial patterns 35, and the side surfaces of the interlayer insulating patterns ILD.

Next, fourth horizontal regions HR4 may be respectively formed between the semiconductor patterns SP and the interlayer insulating patterns ILD by partially removing the second sacrificial patterns 35, which are exposed through the first trenches T1.

The fourth horizontal regions HR4 may be formed by isotropically etching the second sacrificial patterns 35 using an etch recipe that is chosen to have an etch selectivity with respect to the semiconductor patterns SP and the interlayer insulating patterns ILD. As an example, in a case in which the second sacrificial patterns 35 are silicon nitride layers and the interlayer insulating patterns ILD are silicon oxide layers, the etching step of forming the fourth horizontal regions HR4 may include isotropically etching the second sacrificial patterns 35 using an etching solution containing phosphoric acid. The fourth horizontal regions HR4 may extend from regions between the first and second insulating separation patterns STI1 and STI2, in the first direction D1.

When the fourth horizontal regions HR4 are formed, portions of the second sacrificial patterns 35 may be left to form third sacrificial patterns 37. The third sacrificial patterns 37 may be separated from each other in the first direction D1 by the second insulating separation patterns STI2.

Figure 14A:
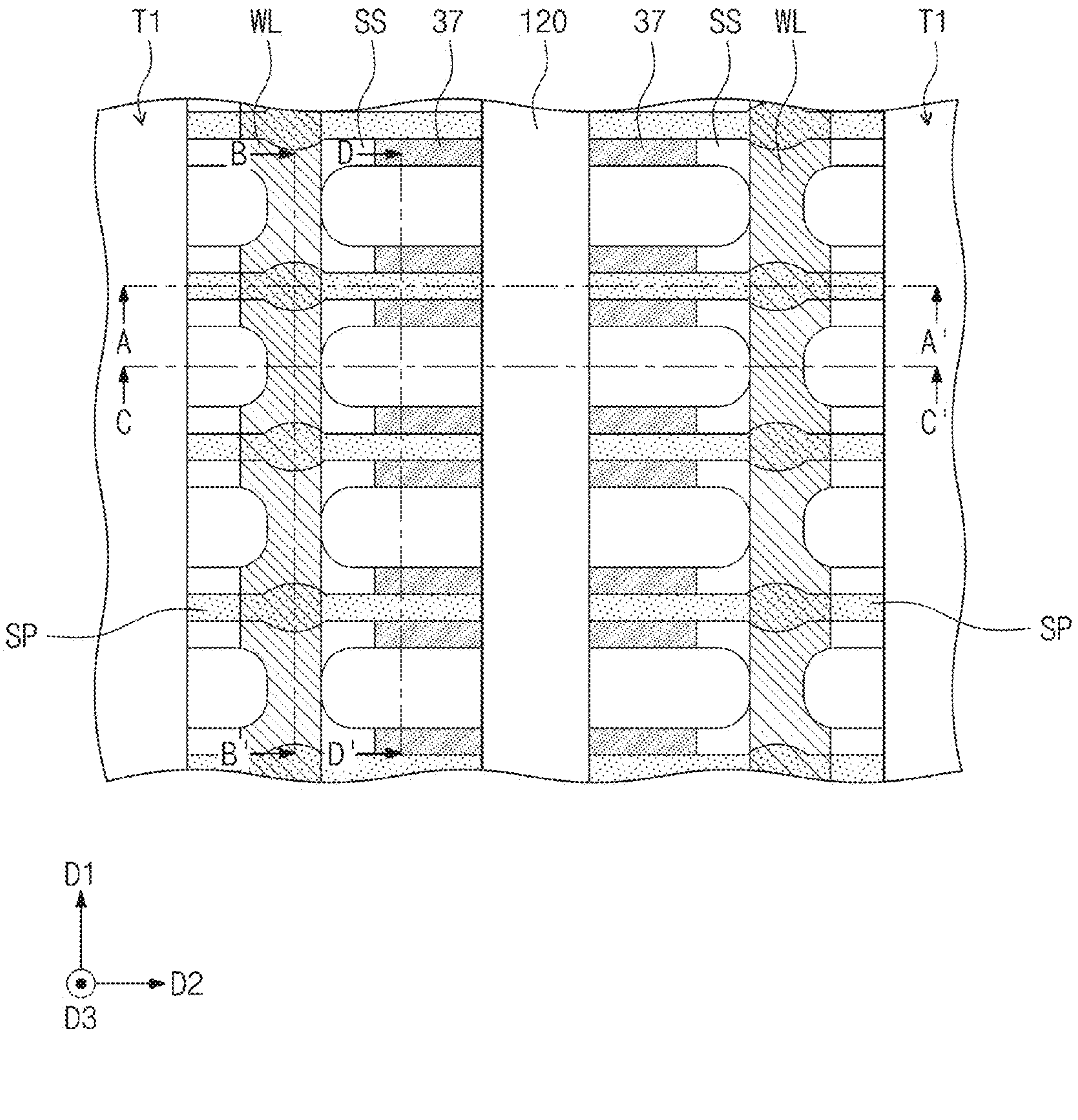
Figure 14B:
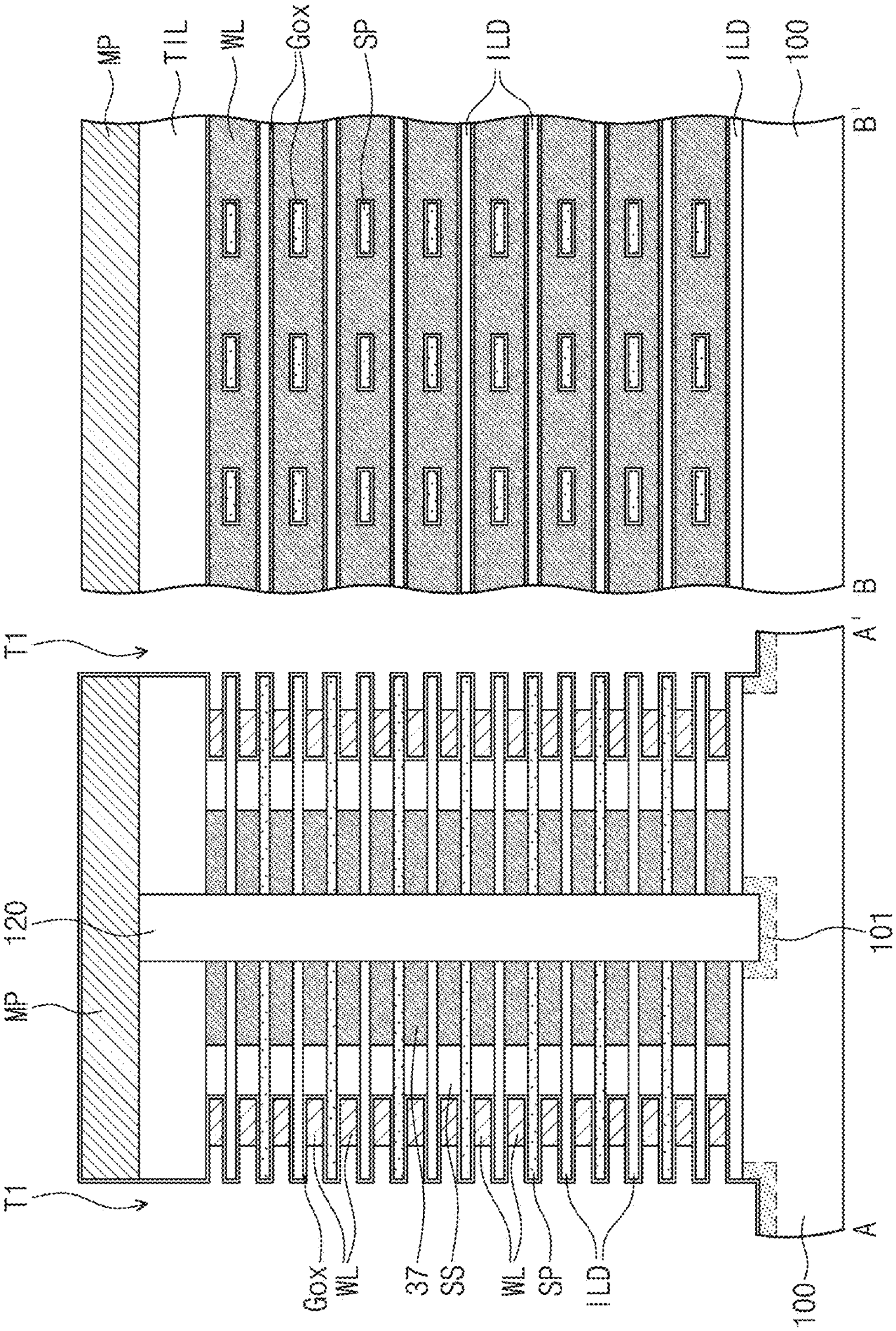
Figure 14C:
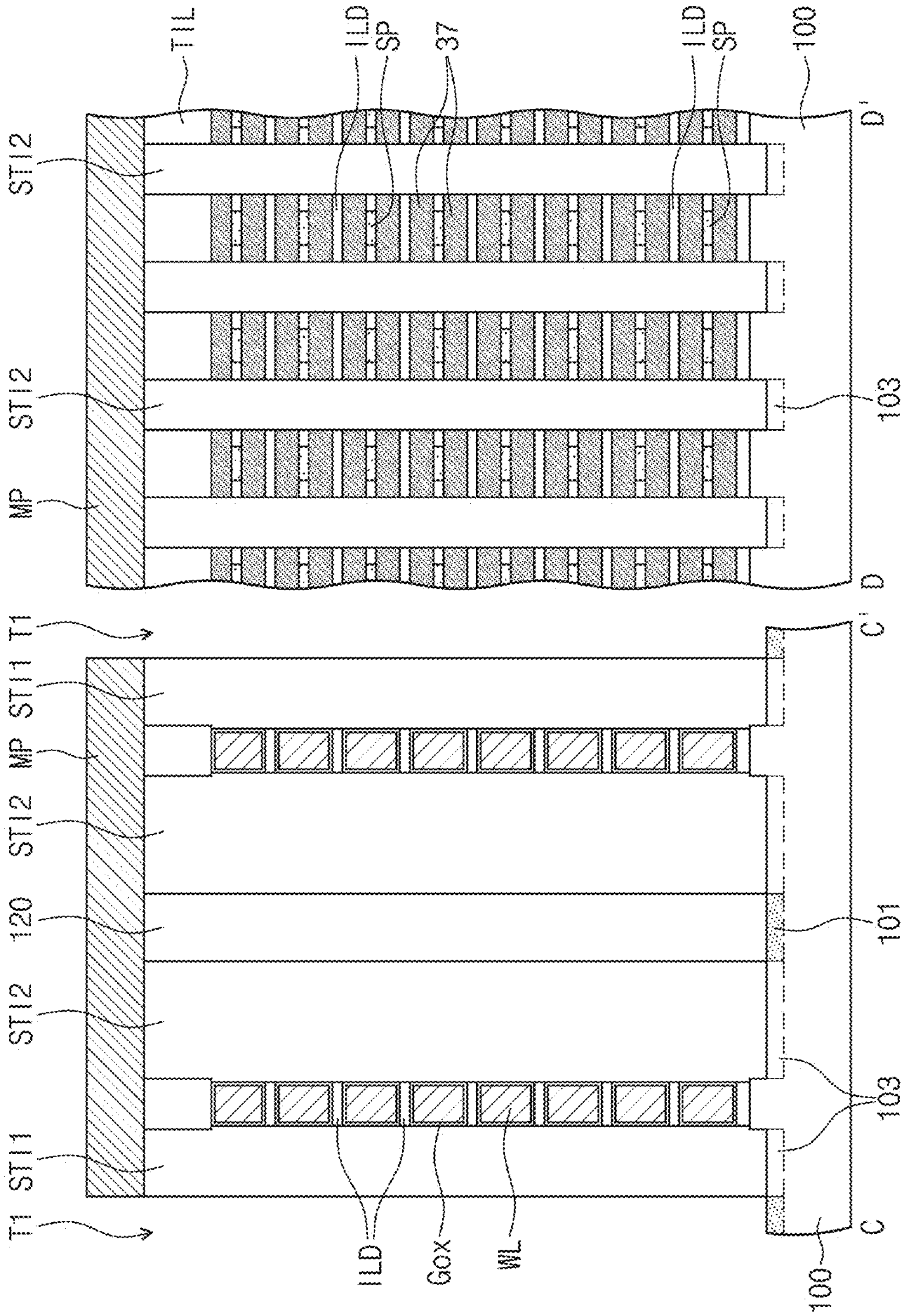

Referring to FIGS. 14A, 14B, and 14C, spacer insulating patterns SS may be formed to partially fill the fourth horizontal regions HR4.

The formation of the spacer insulating patterns SS may include depositing an insulating layer to fill the fourth horizontal regions HR4 and partially etching the insulating layer in the fourth horizontal regions HR4. The spacer insulating patterns SS may be separated from each other in the first direction D1 by the second insulating separation patterns STI2.

Next, a gate insulating layer Gox and word lines WL may be sequentially formed in the fourth horizontal regions HR4 provided with the spacer insulating patterns SS.

The formation of the gate insulating layer Gox and the word lines WL may include forming the gate insulating layer Gox to conformally cover the fourth horizontal regions HR4 provided with the spacer insulating patterns SS, forming a gate conductive layer on the gate insulating layer Gox to fill the fourth horizontal regions HR4, and removing the gate conductive layer from the first trenches T1 to form the word lines WL, which are vertically spaced apart from each other. The side surfaces of the word lines WL may be recessed inward relative to the side surfaces of the semiconductor patterns SP, and thus, the word lines WL may fill portions of the fourth horizontal regions HR4. The word lines WL may be formed to extend in the first direction D1 and to surround the center portions (e.g., the channel portions) of the semiconductor patterns SP. In other words, each of the word lines WL may have a structure (e.g., a gate-all-around structure) completely surrounding the channel portion of the semiconductor pattern SP. Alternatively, the channel portion of each semiconductor pattern SP may be located between a pair of the word lines WL extending in the first direction D1. Near the side surfaces of the first insulating separation patterns STI1, the word lines WL may have substantially the same profile as the first insulating separation patterns STI1. In other words, each of the word lines WL may have a non-uniform width in the second direction D2.

Figure 15A:
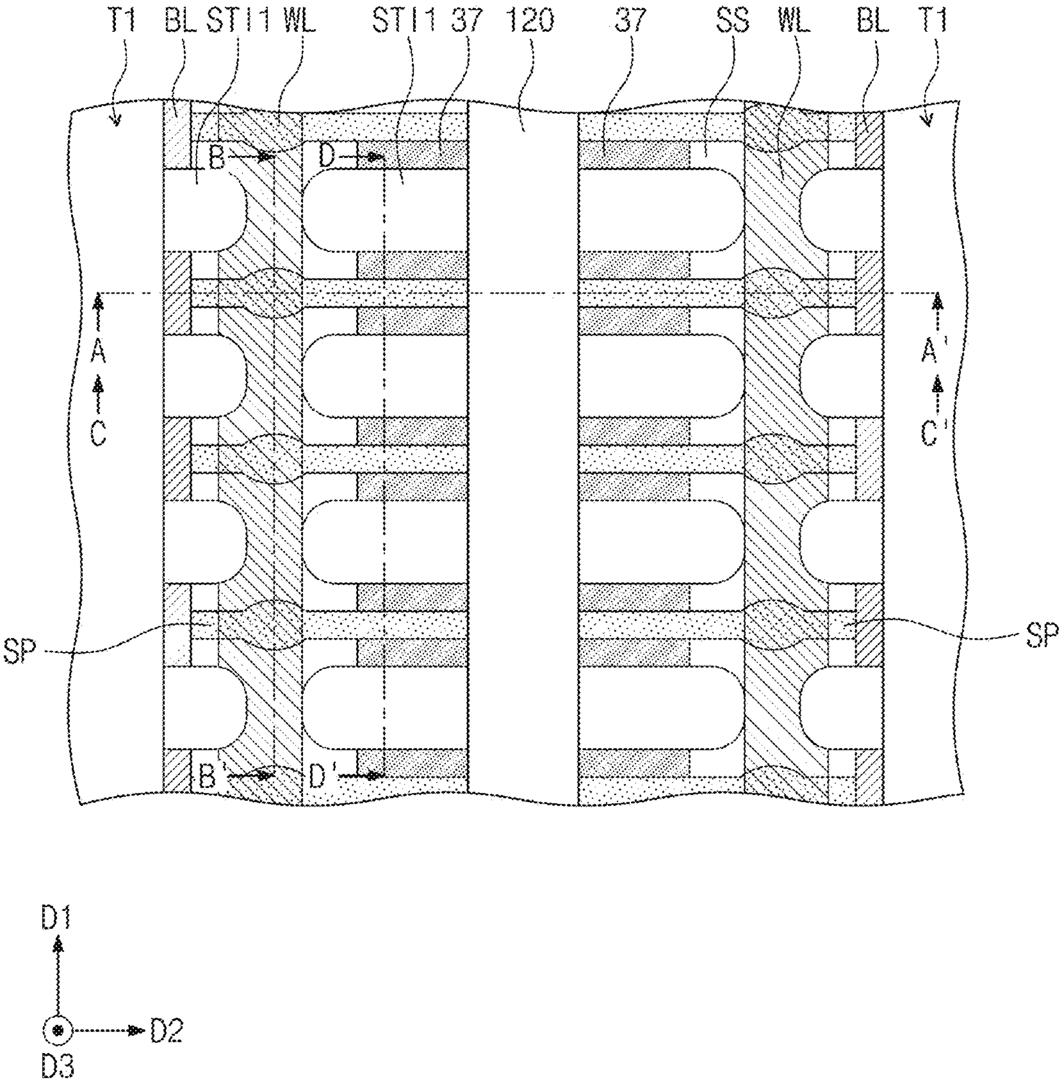
Figure 15B:
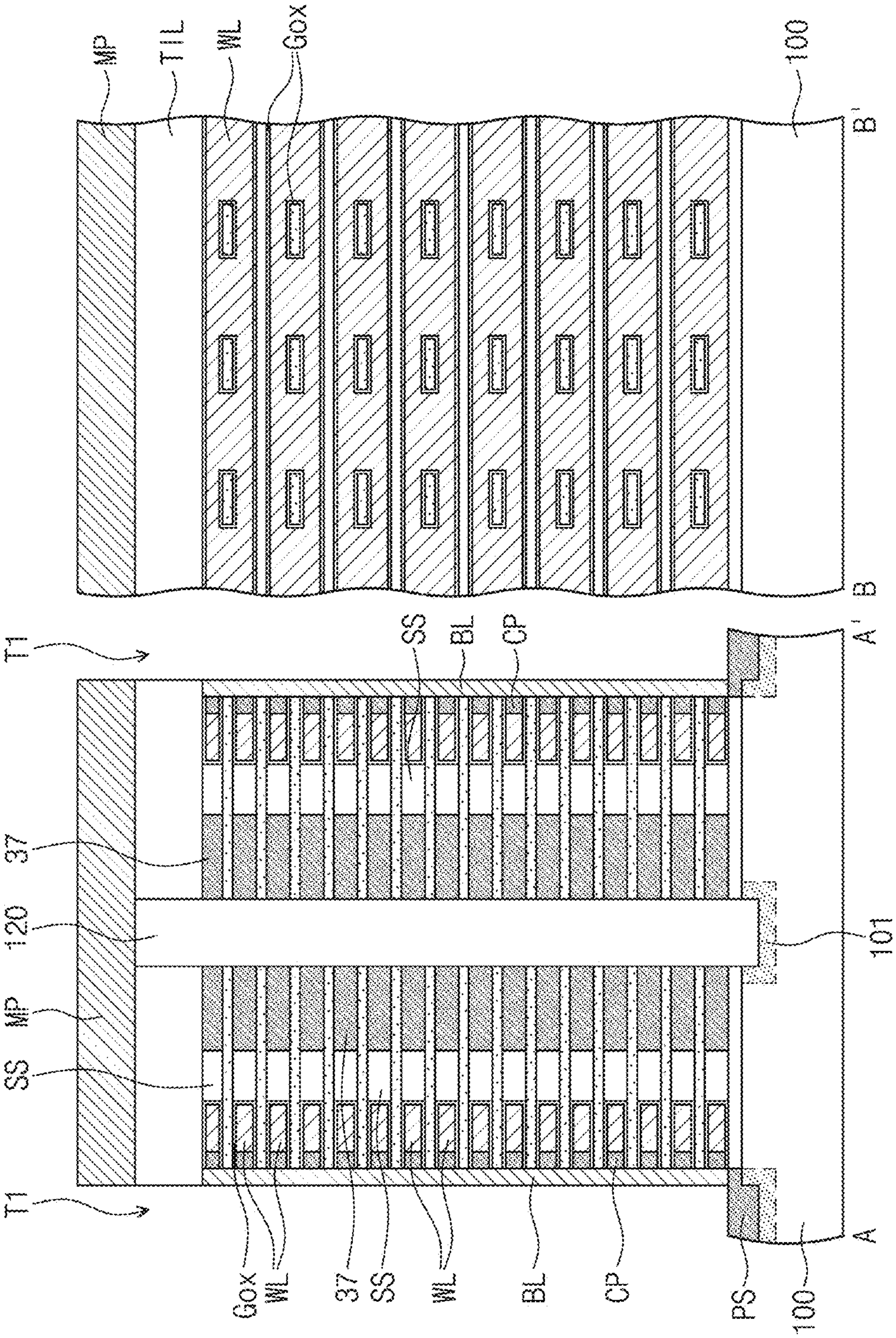
Figure 15C:
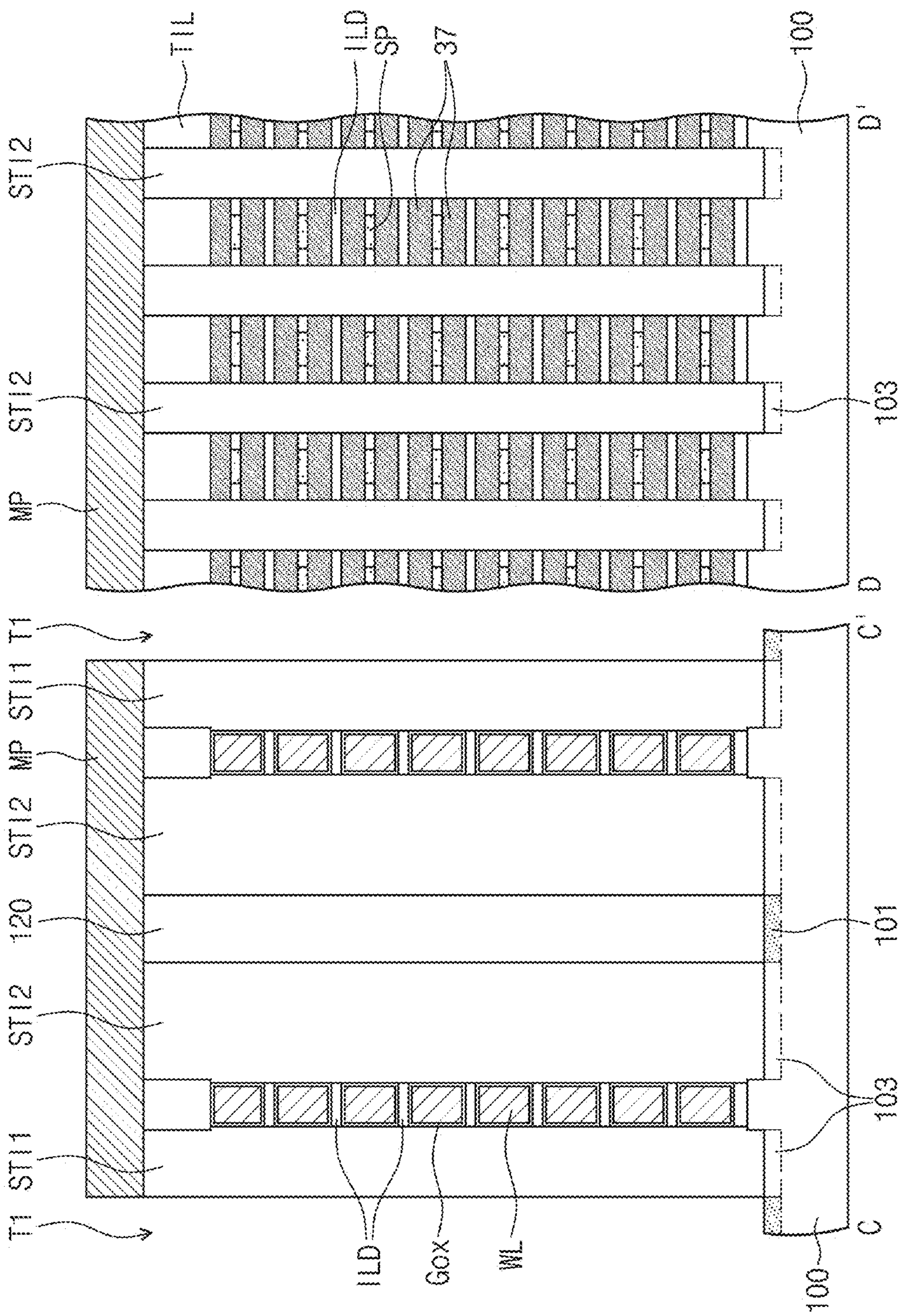

Referring to FIGS. 15A, 15B, and 15C, capping insulating patterns CP may be formed to fill the fourth horizontal regions HR4 provided with the word lines WL.

The formation of the capping insulating patterns CP may include forming a capping insulating layer on inner surfaces of the first trenches T1 to fill the fourth horizontal regions HR4 and removing the capping insulating layer from the first trenches T1 to expose side surfaces of the interlayer insulating patterns ILD. The capping insulating layer may be etched by an isotropic etching process, which is performed using an etch recipe having etch selectivity with respect to the interlayer insulating patterns ILD and the semiconductor patterns SP.

In an embodiment, when the capping insulating patterns CP are formed, a portion of the capping insulating layer may be left on a bottom surface of the first trench T1 (e.g., on the top surface of the substrate impurity layer 101) to form a lower protection pattern PS. The formation of the lower protection pattern PS may include forming the capping insulating layer on the inner surfaces of the first trenches T1, forming a sacrificial pattern on the capping insulating layer to fill lower regions of the first trenches T1, and isotropically etching the capping insulating layer to expose the side surfaces of the interlayer insulating patterns ILD.

Portions of the semiconductor patterns SP, which are exposed through the first trenches T1, may be doped with impurities, before or after the formation of the capping insulating patterns CP. Accordingly, first source/drain regions may be formed in the semiconductor patterns SP. The first source/drain regions may be formed by performing a gas phase doping (GPD) process or a plasma-assisted doping (PLAD) process through the first trenches T1.

The bit lines BL may be formed in the first trenches T1, after the formation of the capping insulating patterns CP and the lower protection pattern PS.

The formation of the bit lines BL may include depositing a conductive layer on the inner surfaces of the first trenches T1 to fill regions between the first insulating separation patterns STI1 and removing the conductive layer on the inner surfaces of the first trenches T1 to expose the side surfaces of the first insulating separation patterns STI1.

The bit lines BL, which are formed by the above-described process, may extend in a third direction D3, which is substantially perpendicular to the top surface of the semiconductor substrate 100, and may be spaced apart from each other in the first direction D1 by the first insulating separation patterns STI1. Each of the bit lines BL may be in contact (e.g., direct contact) with the first source/drain regions of the semiconductor patterns SP. The bit lines BL may be formed of or include at least one of, for example, doped silicon, metallic materials, metal nitrides, or metal silicides. For example, the bit lines BL may be formed of or include tantalum nitride or tungsten. The mask pattern MP may be removed, after the formation of the bit lines BL.

Figure 16A:
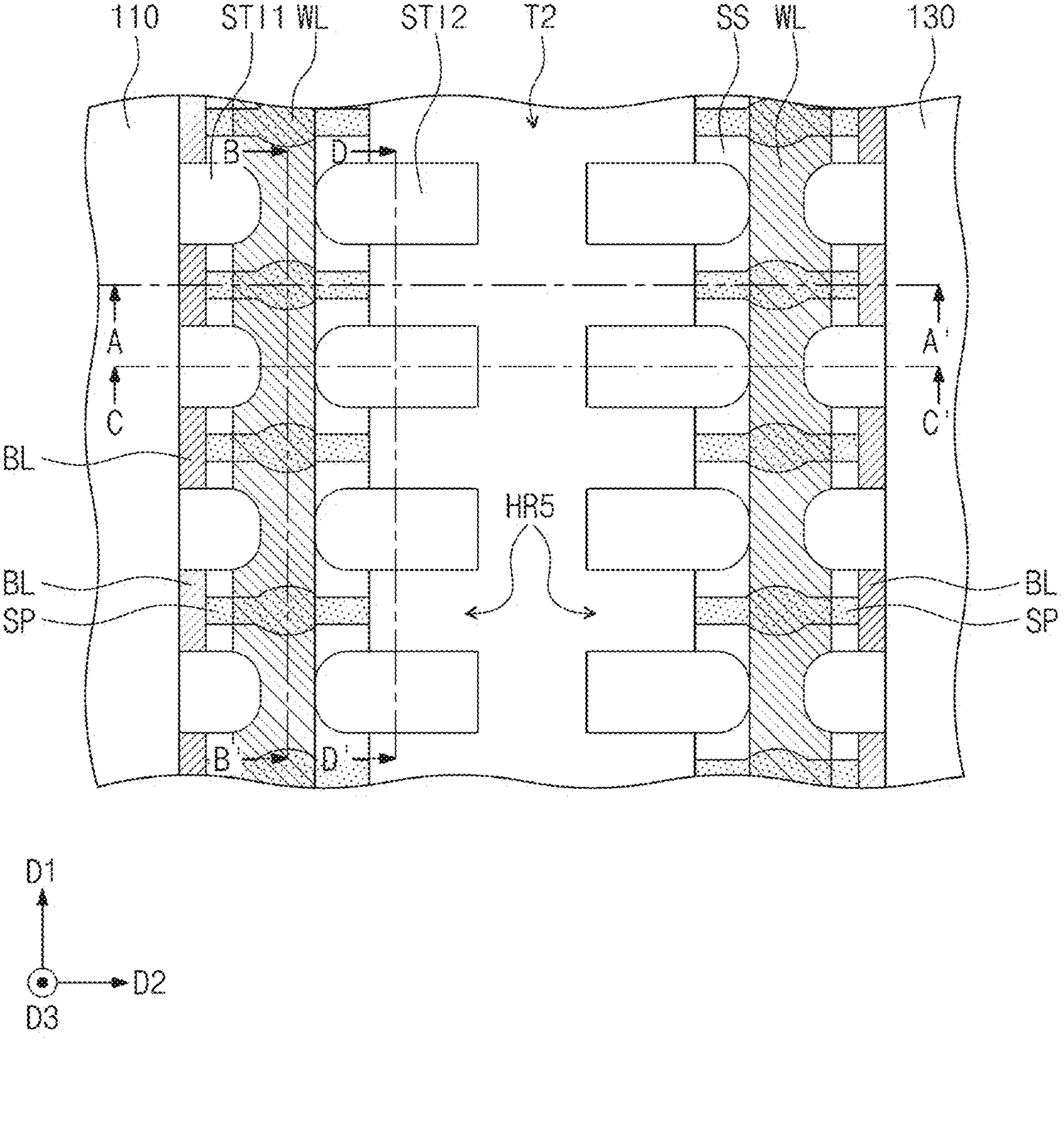
Figure 16B:
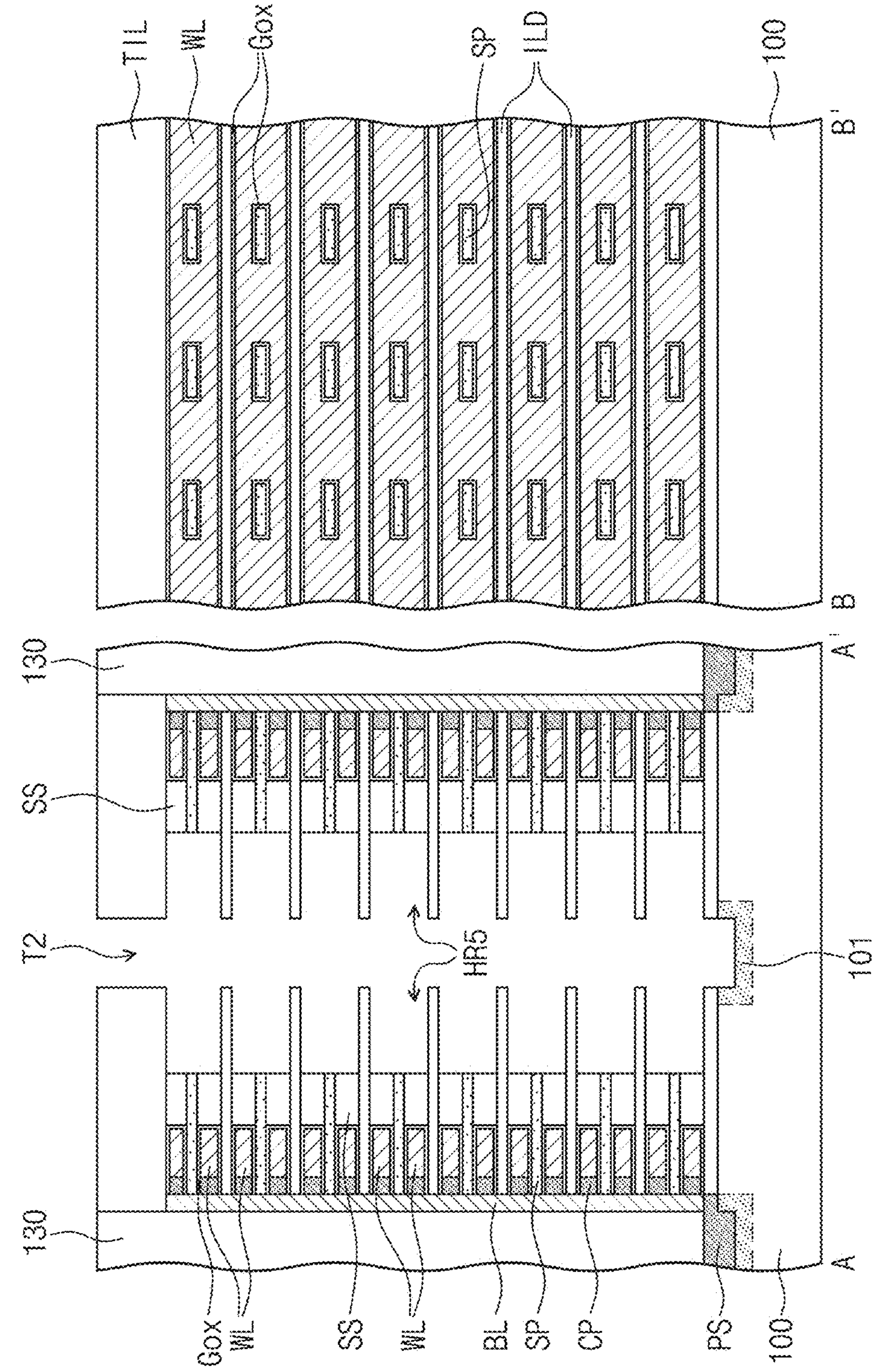
Figure 16C:
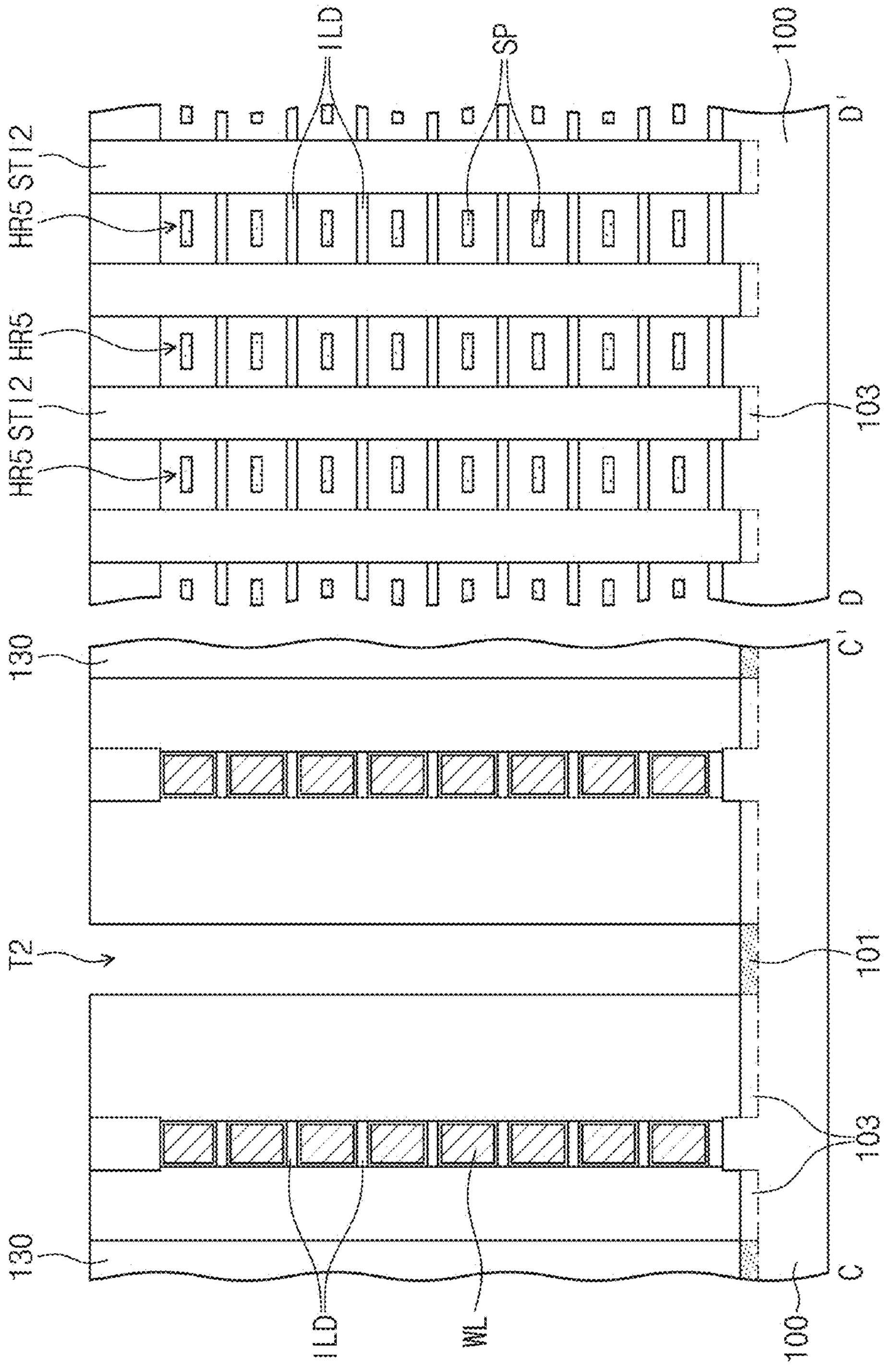

Referring to FIGS. 16A, 16B, and 16C, third gapfill insulating patterns 130 may be formed in the first trenches T1, after the formation of the bit lines BL. The third gapfill insulating patterns 130 may be provided on the lower protection patterns PS and may extend in the first direction D1. The third gapfill insulating patterns 130 may cover the side surfaces of the bit lines BL and the side surfaces of the first insulating separation patterns STI1. The third gapfill insulating patterns 130 may be formed of or include at least one of, for example, silicon oxide, silicon oxynitride, or insulating materials, which are formed using a spin-on-glass (SOG) technology.

Thereafter, the second trenches T2 may be formed again by removing the second gapfill insulating pattern 120. The second trenches T2 may be formed to expose the substrate impurity layer 101, the side surfaces of the third sacrificial patterns 37, the side surfaces of the semiconductor patterns SP, and the side surfaces of the interlayer insulating patterns ILD.

Thereafter, the third sacrificial patterns 37, which are exposed through the second trenches T2, may be removed to form fifth horizontal regions HR5 exposing the spacer insulating patterns SS.

The formation of the fifth horizontal regions HR5 may include isotropically etching the third sacrificial patterns 37 by an etching process using an etch recipe, which is chosen to have an etch selectivity with respect to the semiconductor substrate 100, the semiconductor patterns SP, and the interlayer insulating patterns ILD. The spacer insulating patterns SS may be used as an etch stop layer, when the third sacrificial patterns 37 are isotropically etched.

The fifth horizontal regions HR5 may be formed between the interlayer insulating patterns ILD and the semiconductor patterns SP, when viewed in a cross-sectional view, and may be formed between the second insulating separation patterns STI2, when viewed in a plan view.

Next, portions of the semiconductor patterns SP, which are exposed through the fifth horizontal regions HR5, may be etched to reduce lengths of the semiconductor patterns SP in the second direction D2. For example, the portions of the semiconductor patterns SP may be isotropically etched, after the formation of the fifth horizontal regions HR5.

Figure 17A:
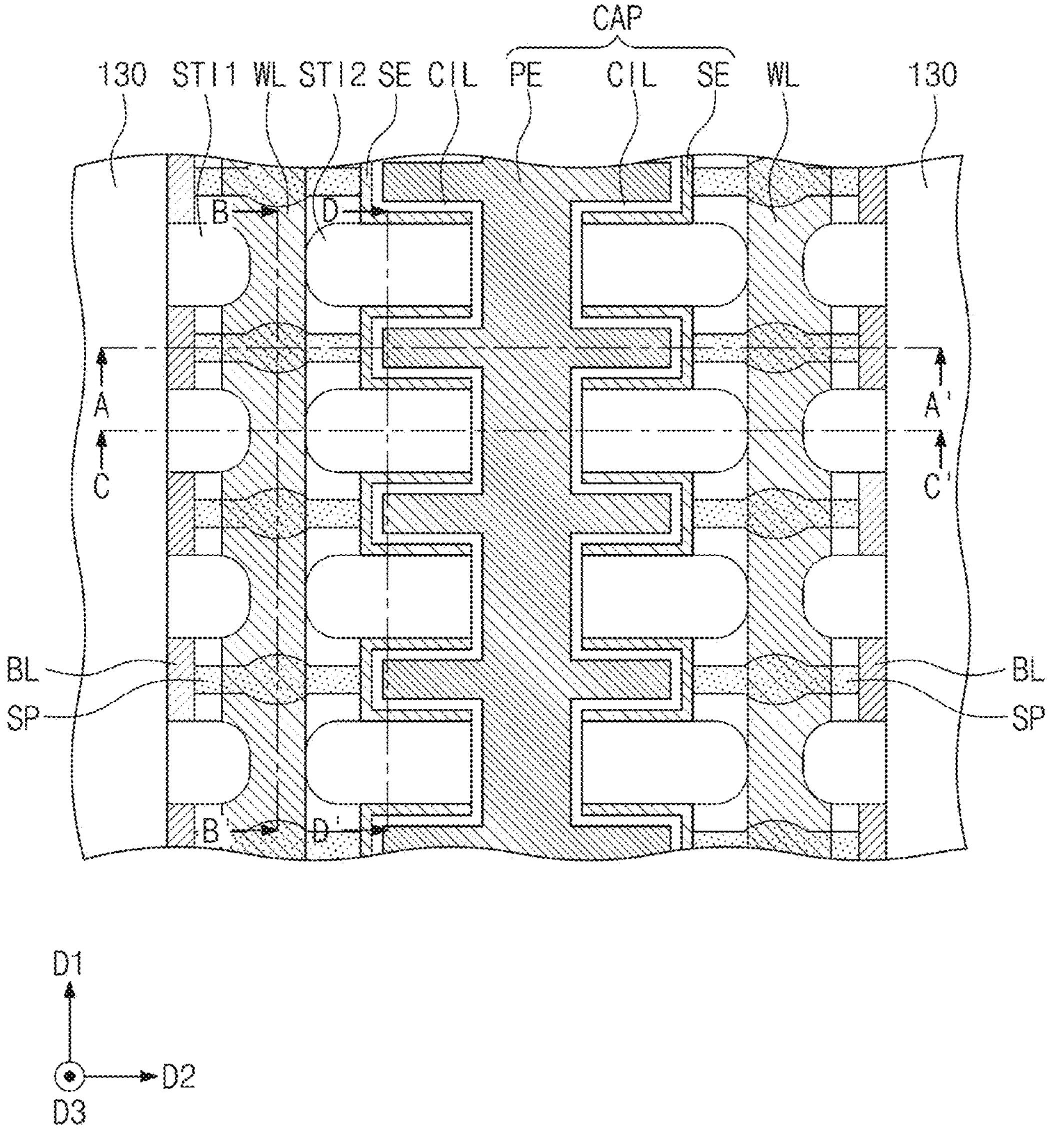
Figure 17B:
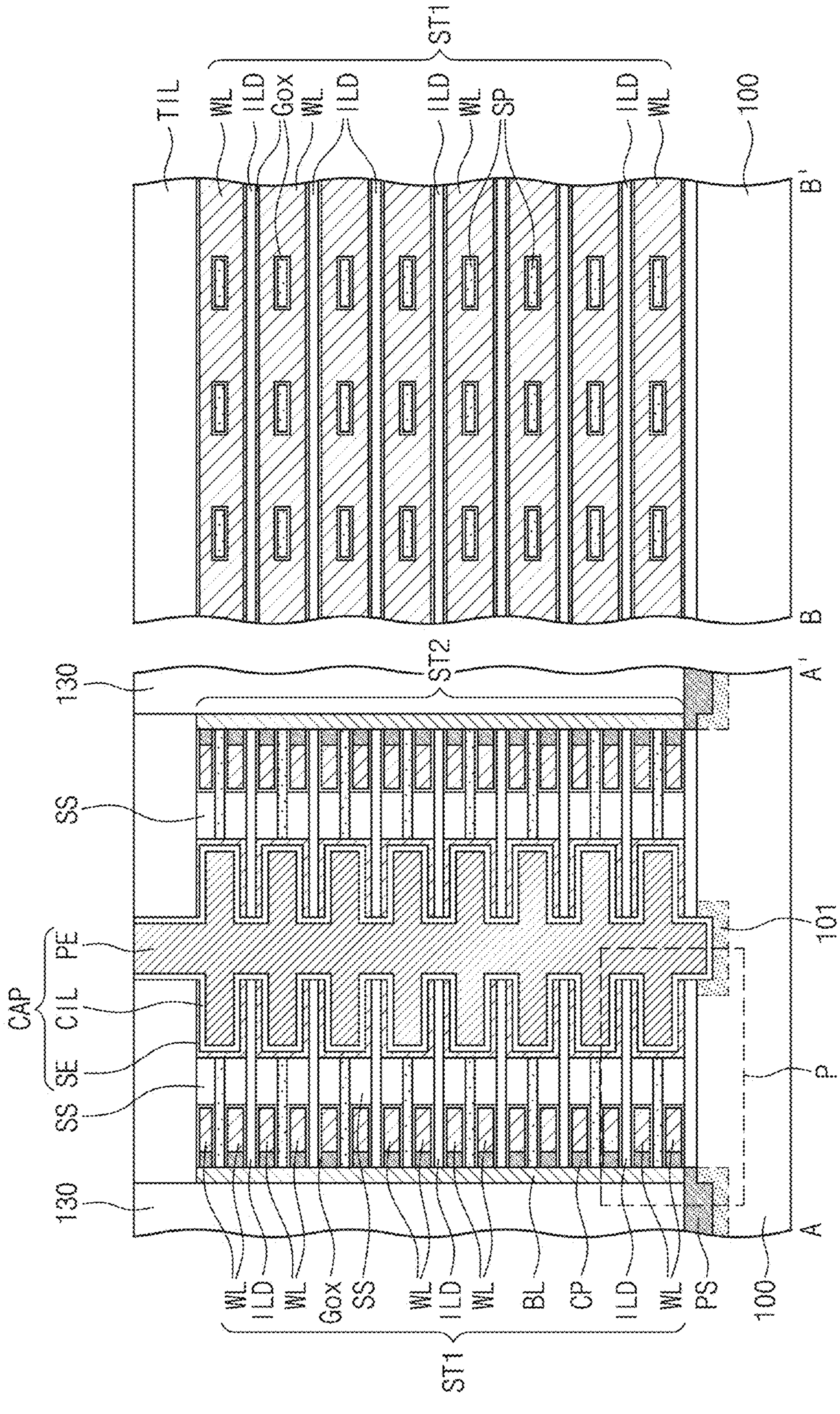
Figure 17C:
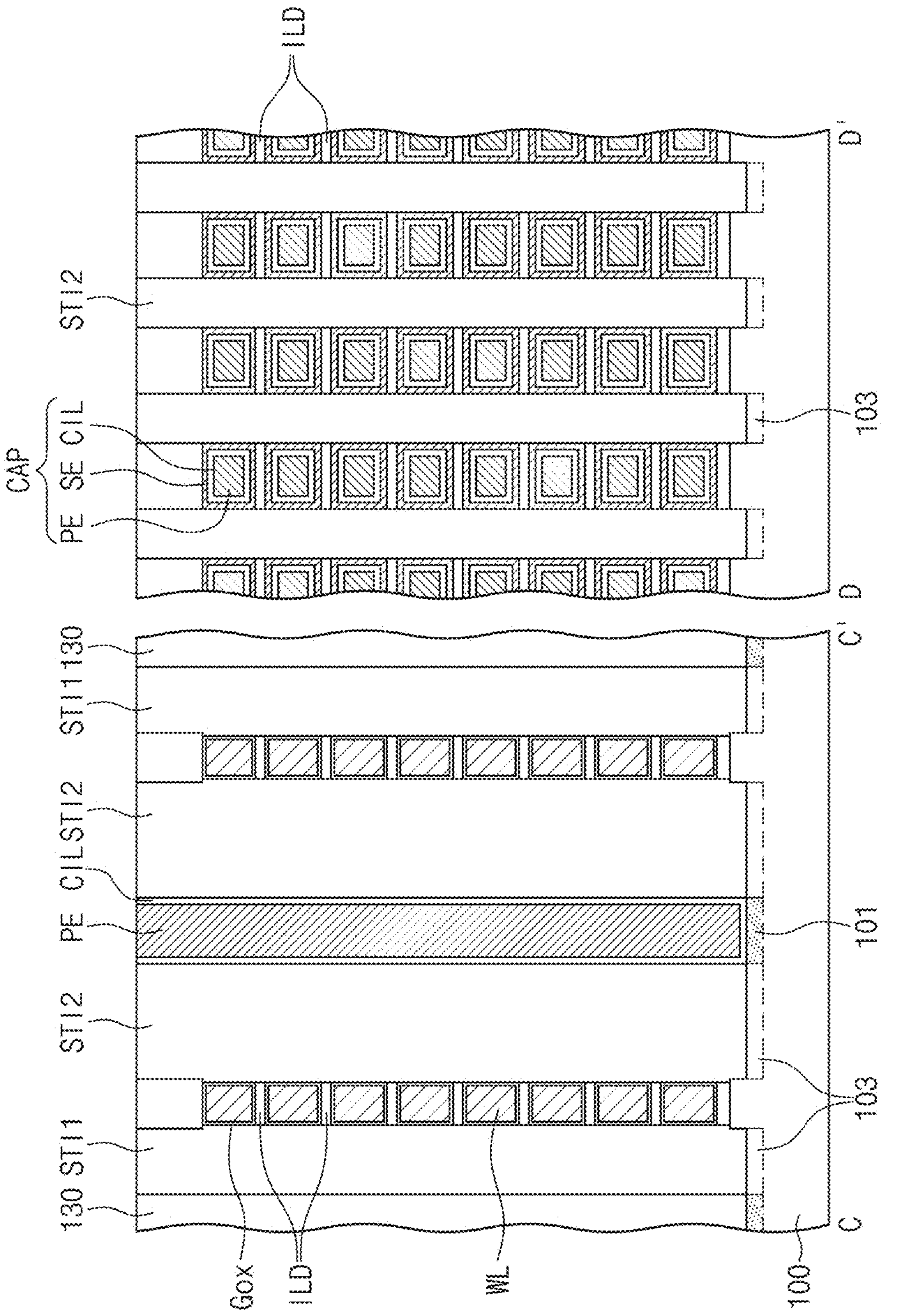
Figure 18A:
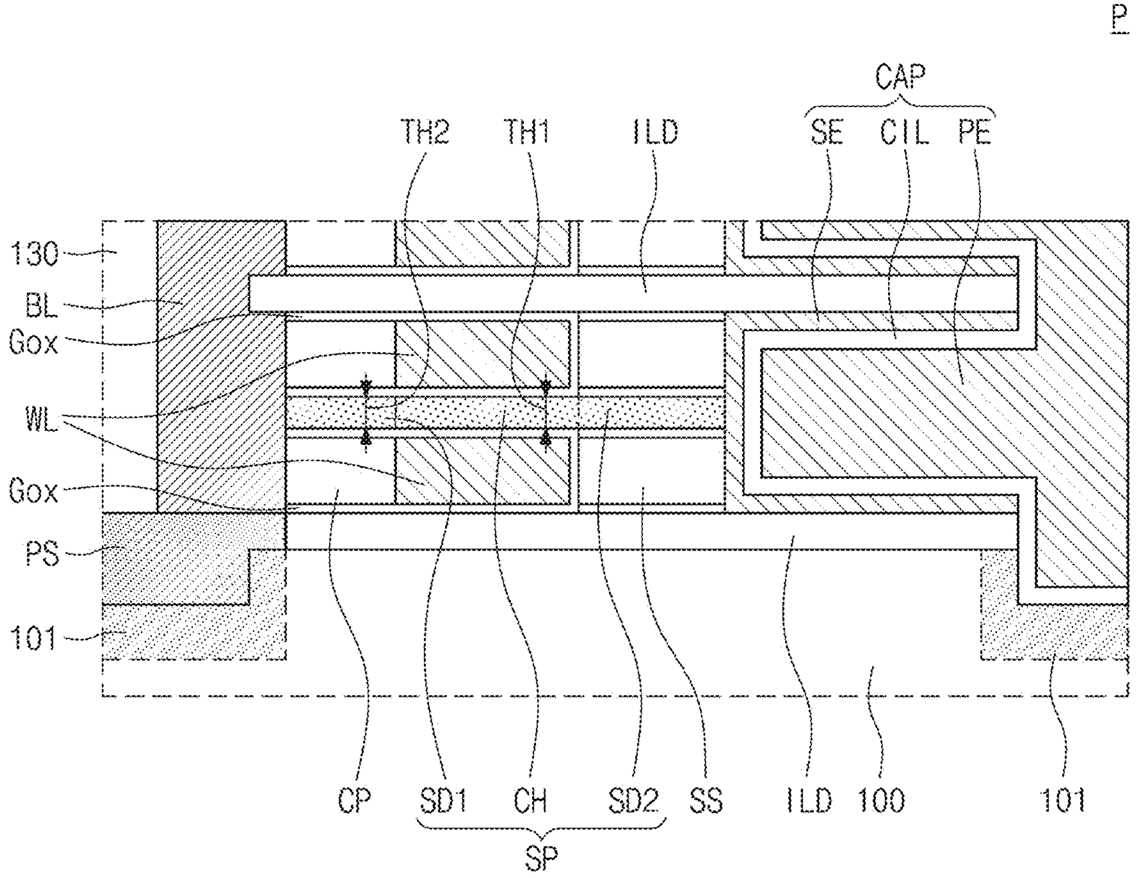
FIGS. 18A, 18B, and 18C are enlarged cross-sectional views illustrating a portion (e.g., P of FIG. 17B) of a semiconductor memory device according to an embodiment of the inventive concept.
Figure 18B:
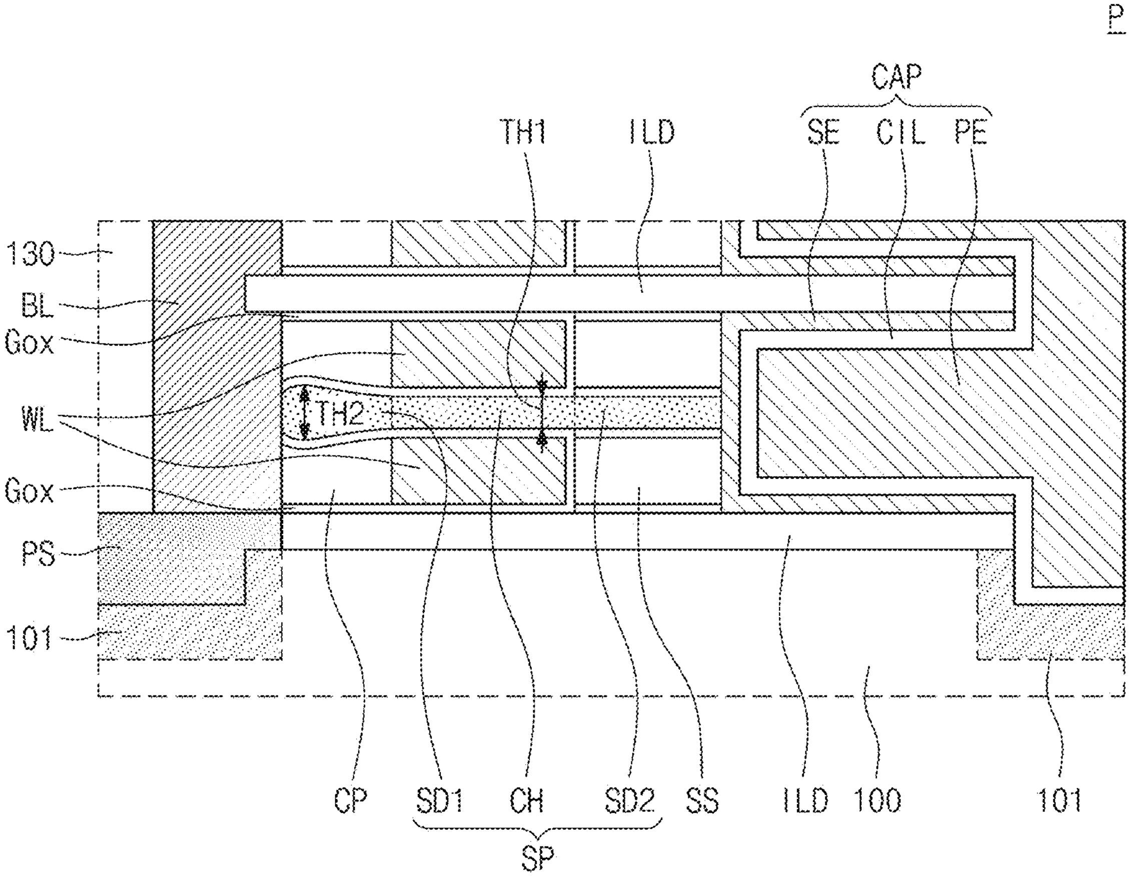
Figure 18C:
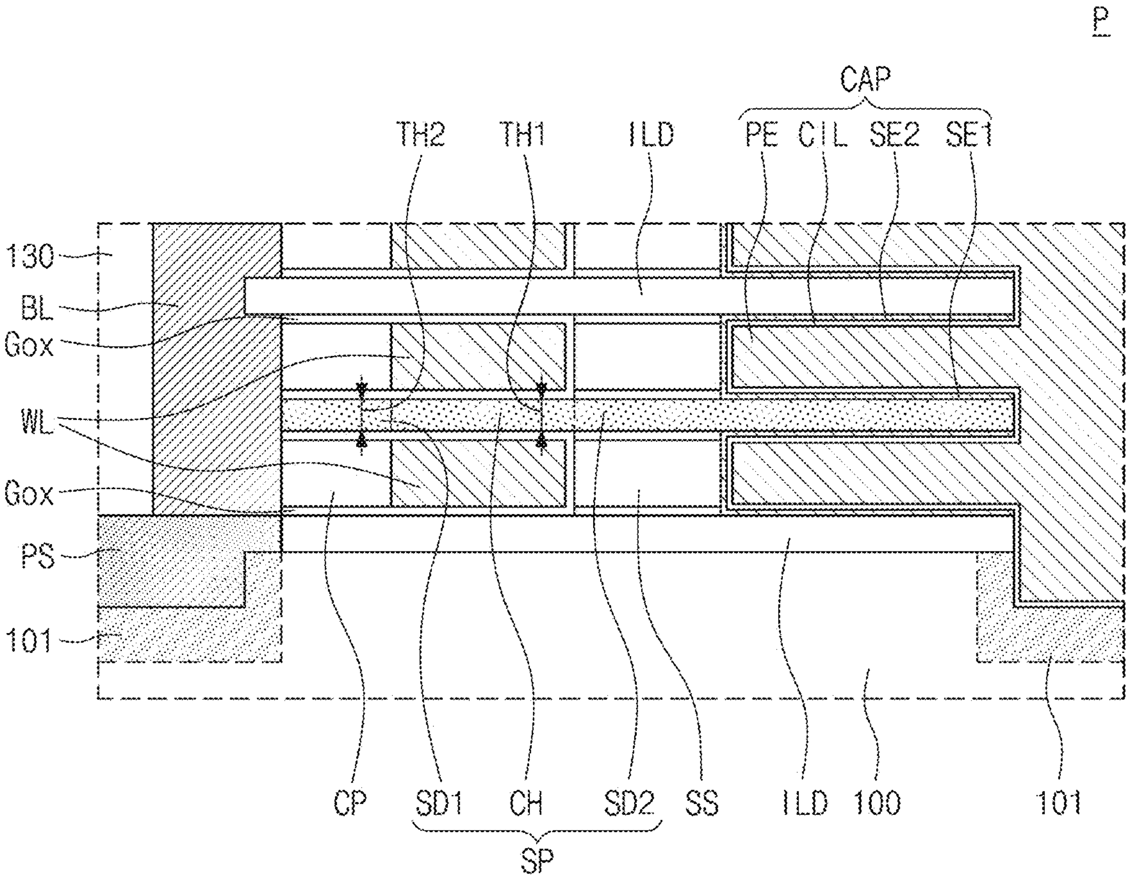

Referring to FIGS. 17A, 17B, and 17C, storage electrodes SE may be locally formed in the fifth horizontal regions HR5.

The formation of the storage electrodes SE may include depositing a conductive layer to conformally cover inner surfaces of the fifth horizontal regions HR5 and inner surfaces of the second trenches T2 and then removing portions of the conductive layer, which are deposited on the inner surfaces of the second trenches T2, to form conductive patterns, which are respectively localized in the fifth horizontal regions HR5.

The storage electrodes SE may be spaced apart from each other in the first direction D1, the second direction D2, and the third direction D3. The storage electrodes SE may be in contact (e.g., direct contact) with the semiconductor patterns SP, which are exposed through the fifth horizontal regions HR5. Each of the storage electrodes SE may define empty spaces in the fifth horizontal regions HR5. For example, each of the storage electrodes SE may have a cup shape which has a longitudinal axis substantially parallel to the second direction D2. Alternatively, the storage electrode SE may a pillar shape which has a longitudinal axis substantially parallel to the second direction D2. The storage electrode SE may be formed of or include at least one of, for example, metallic materials, metal nitrides, or metal silicides.

In an embodiment, before the formation of the storage electrodes SE, second source/drain regions may be formed by doping portions of the semiconductor patterns SP with impurities, and the storage electrodes SE may be in contact (e.g., direct contact) with the second source/drain regions.

Thereafter, a capacitor dielectric layer CIL may be formed to conformally cover the fifth horizontal regions HR5 provided with the storage electrodes SE, and then, a plate electrode PE may be formed to fill the fifth horizontal regions HR5, in which the storage electrodes SE and the capacitor dielectric layer CIL are formed, and the second trenches T2.

In a case in which a semiconductor memory device is fabricated by the above-described method, the semiconductor memory device may include first and second stacks ST1 and ST2 disposed on the semiconductor substrate 100, as shown in FIGS. 17A, 17B, and 17C. Each of the first and second stacks ST1 and ST2 may extend in the first direction D1 and may include the word lines WL and the interlayer insulating patterns ILD, which are alternatingly stacked on the semiconductor substrate 100. The alternatingly stacked word lines WL may extend in the first direction D1, which is substantially parallel to a top surface of the semiconductor substrate 100.

The word lines WL and the interlayer insulating patterns ILD may be alternately stacked in the third direction D3 (e.g., a vertical direction) that is substantially perpendicular to the first and second directions D1 and D2. Each of the word lines WL may include a line portion, which extends in the first direction D1 substantially parallel to the top surface of the semiconductor substrate 100, and gate electrode portions, which protrude from the line portion in the second direction D2. The line portion may be disposed between the first and second insulating separation patterns STI1 and STI2. In addition, a width of the gate electrode portion in the second direction D2 may be larger than that of the line portion. A pair of the word lines WL, which are opposite to each other with the plate electrode PE interposed therebetween, may have mirror symmetry, when viewed in a plan view.

The semiconductor patterns SP may be stacked in the third direction D3 and may be spaced apart from each other in the first and second directions D1 and D2. In other words, the semiconductor patterns SP may be three-dimensionally arranged on the semiconductor substrate 100. The semiconductor patterns SP may be formed of or include at least one of, for example, silicon or germanium. As an example, the semiconductor patterns SP may be formed of single-crystalline silicon.

Each of the semiconductor patterns SP may be a bar-shape pattern, which has a longitudinal axis substantially parallel to the second direction D2, as shown in FIGS. 18A, 18B, and 18C. For example, each of the semiconductor patterns SP may extend lengthwise in the second direction D2. Each of the semiconductor patterns SP may include first and second source/drain regions SD1 and SD2, which are spaced apart from each other, and a channel region CH, which is disposed between the first and second source/drain regions SD1 and SD2. In each semiconductor pattern SP, the first and second source/drain regions SD1 and SD2 may be doped with impurities.

The semiconductor patterns SP may penetrate the gate electrode portions of the word lines WL in the second direction D2. Each of the word lines WL may have a structure (e.g., a gate-all-around structure) completely surrounding the channel region CH of the semiconductor pattern SP. The gate insulating layer Gox may be interposed between channel portions of the semiconductor patterns SP and the word lines WL.

The semiconductor patterns SP may cross the word lines WL. The semiconductor patterns SP may be spaced apart from each other in the first direction D1 and the third direction D3, which is substantially perpendicular to the top surface of the semiconductor substrate 100.

The capping insulating pattern CP may be provided at a side of the word line WL to surround the first source/drain region SD1 of the semiconductor pattern SP, and the spacer insulating pattern SS may be provided at an opposite side of the word line WL to surround the second source/drain region SD2 of the semiconductor pattern SP.

The semiconductor pattern SP may have a first side surface, which is in contact (e.g., direct contact) with the bit line BL, and a second side surface, which is in contact (e.g., direct contact) with the storage electrode SE.

The bit lines BL may extend in the third direction D3, which is substantially perpendicular to the top surface of the semiconductor substrate 100, to cross the word lines WL. The bit lines BL may have substantially the same length in the third direction D3. The bit lines BL may be spaced apart from each other in the first and second directions D1 and D2. Each of the bit lines BL may be connected to first ends of the semiconductor patterns SP, which are stacked in the third direction D3.

A data storage element may be connected to the second source/drain region SD2 of each semiconductor pattern SP. In an embodiment, the data storage element may include a capacitor CAP, and in this case, the storage electrode SE may be used as an electrode of the capacitor CAP, which is connected to the second source/drain region SD2 of each semiconductor pattern SP. Each of the storage electrodes SE may be provided at substantially the same level as a corresponding pattern of the semiconductor patterns SP. In other words, the storage electrodes SE may be stacked in the third direction D3 and may have a longitudinal axis substantially parallel to the second direction D2. The storage electrodes SE may be respectively disposed between vertically adjacent patterns of the interlayer insulating patterns ILD.

In an embodiment, the semiconductor substrate 100 may have a first recess region, which is provided between the bit lines BL that are spaced apart from each other in the second direction D2. The semiconductor substrate 100 may also have a second recess region, which is provided between the storage electrodes SE that are spaced apart from each other in the second direction D2. The first and second recess regions may extend in the first direction D1 and may be substantially parallel to each other.

The substrate impurity layers 101 may be provided in portions of the semiconductor substrate 100, which are located between the bit lines BL that are adjacent to each other in the second direction D2, and may also be provided in portions of the semiconductor substrate 100, which are located below the plate electrodes PE. In other words, the substrate impurity layers 101 may be provided along the first and second recess regions of the semiconductor substrate 100 and may extend in the first direction D1. The substrate impurity layers 101 may be provided in portions of the semiconductor substrate 100 at both sides of a stack (e.g., ST1, ST2).

The substrate impurity layers 101 may contain at least one of boron (B), carbon (C), or fluorine (F). In an embodiment, an impurity concentration in the substrate impurity layer 101 may gradually decrease as a distance from the surface of the semiconductor substrate 100 increases.

In an embodiment, the lower protection pattern PS may be provided in the first recess region. For example, the lower protection pattern PS may be disposed between the bit line BL and the substrate impurity layer 101.

In an embodiment, as shown in FIG. 18A, a thickness TH1 of the channel region CH of the semiconductor pattern SP may be substantially equal to a thickness TH2 of the first source/drain region SD1 of the semiconductor pattern SP. In addition, the first side surface of the semiconductor pattern SP may have a substantially flat shape.

Referring to FIG. 18B, as another example, the thickness TH2 of the first source/drain region SD1 of the semiconductor pattern SP may be larger than the thickness TH1 of the channel region CH of the semiconductor pattern SP. In addition, the first source/drain region SD1 of the semiconductor pattern SP may have a rounded surface or a rounded corner portion.

According to an embodiment as shown in FIG. 18C, each of the capacitors CAP may include a first storage electrode SE1, which is in contact (e.g., direct contact) with a top surface of the second source/drain region SD2 of the semiconductor pattern SP, and a second storage electrode SE2, which is in contact (e.g., direct contact) with a bottom surface of the second source/drain region SD2. For example, when viewed in a cross-sectional view, the second source/drain region SD2 of the semiconductor pattern SP may be disposed between the first and second storage electrodes SE1 and SE2.

The capacitor dielectric layer CIL may conformally cover surfaces of the first and second storage electrodes SE1 and SE2. The plate electrode PE may fill inner spaces of the first and second storage electrodes SE1 and SE2, which are covered with the capacitor dielectric layer CIL. In an embodiment, the plate electrode PE may be formed to cover outer surfaces of the first and second storage electrodes SE1 and SE2.

In the above-described method, the operations of forming the sidewall impurity regions 21 in the semiconductor pattern SP and the substrate impurity layer in the semiconductor substrate 100 may be variously modified. Hereinafter, such modifications will be described with reference to FIGS. 19A, 19B, 20A, and 20B. For convenience of explanation, a further description of elements and features previously described will be omitted.

Figure 19:
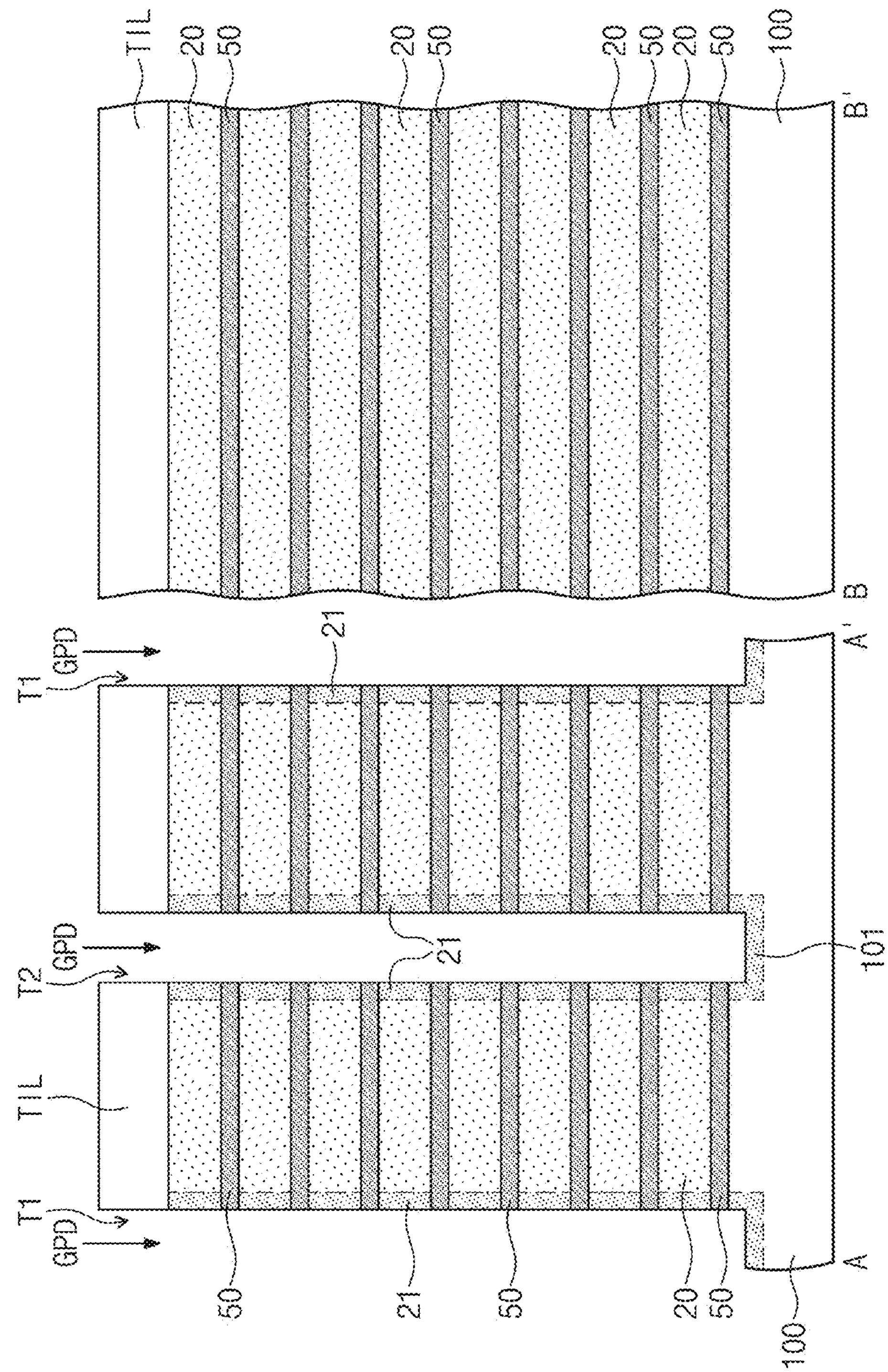
FIGS. 19 and 20 are cross-sectional views, which are taken along lines A-A' and B-B' of FIG. 3A and illustrate a method of fabricating a semiconductor memory device, according to an embodiment of the inventive concept.
Figure 20:
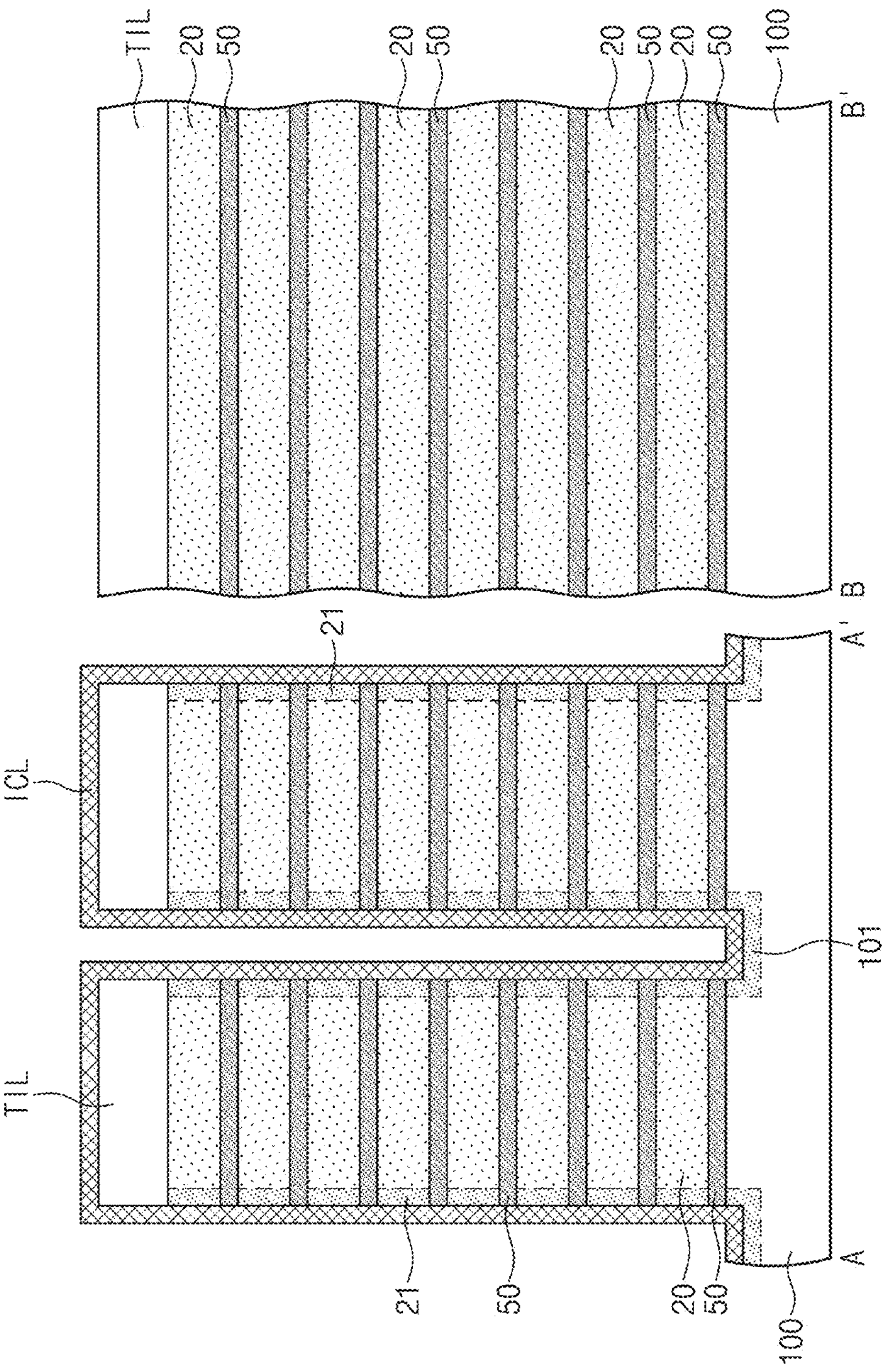

FIGS. 19 and 20 are cross-sectional views, which are taken along lines A-A' and B-B' of FIG. 3A and illustrate a method of fabricating a semiconductor memory device, according to an embodiment of the inventive concept.

Referring to FIG. 19, a replacement process may be performed to replace the first sacrificial layers 10 with third sacrificial layers 50, after forming the first and second trenches T1 and T2 in the first mold structure MS1, as described with reference to FIGS. 3A, 3B, and 3C.

The replacement process may include isotropically etching the first sacrificial layers 10 and depositing the third sacrificial layers 50 to fill the regions between the vertically adjacent layers of the semiconductor layers 20.

The third sacrificial layers 50 may be formed of or include at least one of materials having an etch selectivity with respect to the semiconductor layers 20 and the first and second insulating separation patterns STI1 and STI2. The third sacrificial layers 50 may be formed of a material having high etch selectivity with respect to the semiconductor layers 20, compared with the first sacrificial layers 10. For example, the third sacrificial layers 50 may be formed of or include at least one of silicon oxide, silicon nitride, or silicon oxynitride. In a case in which the third sacrificial layers 50 are formed of the insulating material, the impurity doping of the third sacrificial layers 50, which may occur when the sidewall impurity regions 21 are formed, may be suppressed.

After the formation of the third sacrificial layers 50, an impurity doping process through the first and second trenches T1 and T2 may be performed to form the sidewall impurity regions 21 in the side portions of the semiconductor layers 20. The sidewall impurity regions 21 may be formed by, for example, a gas phase doping (GPD) process, a beam line ion implantation process, or a plasma-assisted doping (PLAD) process, as previously described with reference to FIGS. 3A, 3B, and 3C.

In addition, during the formation of the sidewall impurity regions 21, the substrate impurity layers 101 may be formed in portions of the semiconductor substrate 100, which are exposed through the first and second trenches T1 and T2.

In an embodiment shown in FIG. 20, an impurity layer ICL may be deposited, after the formation of the third sacrificial layers 50. The impurities in the impurity layer ICL may include at least one of, for example, boron (B), carbon (C), or fluorine (F). As an example, the impurity layer ICL may be a poly-silicon layer, which is doped with the impurities.

The impurity layer ICL may be deposited on inner surfaces of the first and second trenches T1 and T2 by, for example, an atomic layer deposition process or a chemical vapor deposition process. The impurity layer ICL may be formed to cover side surfaces of the semiconductor layers 20 and the third sacrificial layers 50, which are exposed through the first and second trenches T1 and T2.

After the deposition of the impurity layer ICL, a thermal treatment process may be performed at a high temperature. Accordingly, the impurities in the impurity layer ICL may be diffused into the semiconductor layers 20 to form the sidewall impurity regions 21 in the semiconductor layer 20. During this process, the substrate impurity layers 101 may be formed in portions of the semiconductor substrate 100, which are exposed through the first and second trenches T1 and T2.

After the formation of the sidewall impurity regions 21 and the substrate impurity layer 101, the impurity layer ICL may be removed, and thus, the side surfaces of the semiconductor layers 20 and the side surfaces of the third sacrificial layers 50 may be exposed through the first and second trenches T1 and T2.

Next, the third sacrificial layers 50, which are exposed through the first and second trenches T1 and T2, may be removed, after the formation of the sidewall impurity regions 21 and the substrate impurity layers 101. Accordingly, the first horizontal regions HR1 may be formed between the semiconductor layers 20, as previously described with reference to FIGS. 4A, 4B, and 4C.

According to an embodiment of the inventive concept, sidewall impurity regions may be formed in sidewall portions of semiconductor layers. In this case, the semiconductor layers may be prevented from being etched in a horizontal direction, during performing an isotropic etching process on the semiconductor layers to adjust a thickness of semiconductor patterns to a specific value.

Furthermore, in a case in which the semiconductor layers are formed of single crystalline silicon, the sidewall impurity regions may prevent the sidewall portions of the semiconductor layers from being etched along its crystal facet during the isotropic etching of the semiconductor layers and thereby from having wedge-shaped side surfaces. In other words, due to the sidewall impurity regions, deformation of the sidewall profile of the semiconductor layers may be reduced, during the isotropic etching of the semiconductor layers.

In addition, substrate impurity layers may be formed in a semiconductor substrate, when the sidewall impurity regions are formed, and thus, a portion of a semiconductor substrate between mold structures may be prevented from being etched to form a sigma-shaped undercut region, during the isotropic etching of the semiconductor layers.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the inventive concept has been particularly shown and described with reference to the example embodiments thereof, it will be understood by those of ordinary skill in the art that various changes in form and detail may be made therein without departing from the spirit and scope of the inventive concept as defined by the following claims.

What is claimed is:

1. A method of fabricating a semiconductor memory device, comprising:

forming a mold structure by alternately stacking a plurality of sacrificial layers and a plurality of semiconductor layers on a substrate;

forming a plurality of openings that penetrate the mold structure;

forming a plurality of sidewall impurity regions by doping side portions of the semiconductor layers, which are exposed through the openings, with impurities;

forming a plurality of horizontal regions between the semiconductor layers by removing the sacrificial layers;

forming a plurality of preliminary semiconductor patterns by etching top and bottom surfaces of the semiconductor layers, which are exposed through the horizontal regions; and forming a plurality of conductive patterns locally in the horizontal regions, wherein forming the sidewall impurity regions comprises forming substrate impurity layers in portions of the substrate, which are exposed through the openings.

2. The method of claim 1, further comprising:

forming a plurality of sacrificial oxide layers along surfaces of the preliminary semiconductor patterns by performing an oxidation process on the preliminary semiconductor patterns, before forming the conductive patterns; and removing the sacrificial oxide layers to form a plurality of semiconductor patterns, wherein side surfaces of the preliminary semiconductor patterns have sharp corner portions which are removed when removing the sacrificial oxide layers.

3. The method of claim 1, wherein the preliminary semiconductor patterns have side surfaces that are exposed through the openings and are substantially flat.

4. The method of claim 1, wherein forming the sidewall impurity regions comprises performing a gas phase doping (GPD) process, a beam line ion implantation process, or a plasma-assisted doping (PLAD) process.

5. The method of claim 1, wherein the sidewall impurity regions and each of the substrate impurity layers includes at least one of boron (B), carbon (C), or fluorine (F).

* * * * *